United States Patent
Bratianu-Badea et al.

(10) Patent No.: US 12,024,299 B2
(45) Date of Patent: Jul. 2, 2024

(54) DE-ICING SYSTEMS

(71) Applicant: De-Ice Technologies, Inc., Somerville, MA (US)

(72) Inventors: Alexandru Bratianu-Badea, Boston, MA (US); Ruben Toubiana, Somerville, MA (US); Christopher Buenrostro, Lexington, MA (US); Sean David Kropp, Cambridge, MA (US)

(73) Assignee: De-Ice Technologies, Inc., Somerville, MA (US)

( * ) Notice: Subject to any disclaimer, the term of this patent is extended or adjusted under 35 U.S.C. 154(b) by 1147 days.

(21) Appl. No.: 16/552,045

(22) Filed: Aug. 27, 2019

(65) Prior Publication Data

US 2020/0062408 A1 Feb. 27, 2020

Related U.S. Application Data

(60) Provisional application No. 62/723,270, filed on Aug. 27, 2018.

(51) Int. Cl.
*B64D 15/12* (2006.01)
*B32B 7/12* (2006.01)
(Continued)

(52) U.S. Cl.
CPC ............... *B64D 15/12* (2013.01); *B32B 7/12* (2013.01); *H05B 1/0236* (2013.01); *H05B 3/34* (2013.01);
(Continued)

(58) Field of Classification Search
CPC ..... B64D 15/12; B32B 7/12; B32B 2307/202; B32B 2307/204; B32B 2605/18;
(Continued)

(56) References Cited

U.S. PATENT DOCUMENTS

| | | |
|---|---|---|
| 2,496,279 A | 2/1950 | Ely et al. |
| 2,791,668 A | 5/1957 | Cowdrey et al. |

(Continued)

FOREIGN PATENT DOCUMENTS

| | | | |
|---|---|---|---|
| CN | 103047010 | 4/2013 | ............. F02C 7/057 |
| CN | 103999545 | 8/2014 | |

(Continued)

OTHER PUBLICATIONS

International Search Report and Written Opinion of the International Searching Authority for International Application No. PCT/US2019/048253 dated Oct. 24, 2019.

(Continued)

*Primary Examiner* — Janie M Loeppke
*Assistant Examiner* — Theodore J Evangelista
(74) *Attorney, Agent, or Firm* — Fish & Richardson P.C.

(57) ABSTRACT

Aspects of the present disclosure can be embodied in a systems for heating an exterior surface of a bulk medium. In one example, the system includes two or more coupling strips spaced apart from one another and attached to the bulk medium. Each of the coupling strips has a multi-layer structure extending along a surface of the bulk medium that forms, in combination with the bulk medium, an electrical transmission line. The multi-layer structure includes a first dielectric layer over the bulk medium, a conductive layer over the first dielectric layer, a second dielectric layer over the conductive layer, and a conductive shielding layer over the second dielectric layer. A power control system is coupled to the conductive layer of each of the coupling strips and to the bulk medium. The power control system is configured to heat the bulk medium by providing current to the coupling strips.

40 Claims, 42 Drawing Sheets

(51) Int. Cl.
    *H03F 3/217*            (2006.01)
    *H03H 7/38*            (2006.01)
    *H05B 1/02*            (2006.01)
    *H05B 3/34*            (2006.01)

(52) U.S. Cl.
    CPC ... *B32B 2307/202* (2013.01); *B32B 2307/204* (2013.01); *B32B 2605/18* (2013.01); *H03F 3/217* (2013.01); *H03H 7/38* (2013.01); *H05B 2203/035* (2013.01)

(58) Field of Classification Search
    CPC .. H05B 1/0236; H05B 3/34; H05B 2203/035; H03F 3/217; H03H 7/38
    See application file for complete search history.

(56) References Cited

U.S. PATENT DOCUMENTS

| | | | |
|---|---|---|---|
| 3,013,752 A | | 12/1961 | Rush |
| 3,204,084 A | | 8/1965 | Spencer, Jr. et al. |
| 3,549,964 A | | 12/1970 | Levin et al. |
| 3,591,757 A | | 7/1971 | Rudd |
| 3,725,638 A | * | 4/1973 | Solin ............... H05B 3/00 |
| | | | 219/549 |
| 3,981,466 A | | 9/1976 | Shah |
| 4,036,457 A | | 7/1977 | Volkner et al. |
| 4,060,212 A | | 11/1977 | Magenheim |
| 4,091,813 A | | 5/1978 | Shaw et al. |
| 4,386,749 A | * | 6/1983 | Sweet ............. B64D 15/12 |
| | | | 244/134 D |
| 4,436,565 A | | 3/1984 | Weitzel et al. |
| 4,539,617 A | * | 9/1985 | Delaney ............ H02H 9/04 |
| | | | 361/111 |
| 4,732,351 A | | 3/1988 | Bird |
| 4,737,618 A | | 4/1988 | Barbier et al. |
| 4,741,499 A | | 5/1988 | Rudolph et al. |
| 4,752,673 A | | 6/1988 | Krumme |
| 4,794,226 A | | 12/1988 | Derbyshire |
| 4,814,587 A | | 3/1989 | Carter |
| 4,942,078 A | | 7/1990 | Newman et al. |
| 5,011,098 A | | 4/1991 | McLaren et al. |
| 5,129,598 A | | 7/1992 | Adams et al. |
| 5,361,183 A | * | 11/1994 | Wiese ............... B64D 15/12 |
| | | | 361/42 |
| 5,590,854 A | | 1/1997 | Shatz |
| 5,615,849 A | | 4/1997 | Salisbury |
| 5,636,317 A | | 6/1997 | Reznik |
| 5,657,951 A | | 8/1997 | Giamati |
| 5,657,952 A | | 8/1997 | Goldberg |
| 5,911,896 A | * | 6/1999 | Holden ........... H01L 21/67109 |
| | | | 219/390 |
| 5,934,617 A | | 8/1999 | Rutherford |
| 6,079,670 A | | 6/2000 | Porte |
| 6,097,009 A | * | 8/2000 | Cole ............... H02H 5/043 |
| | | | 219/528 |
| 6,102,333 A | | 8/2000 | Gerardi et al. |
| 6,193,192 B1 | | 2/2001 | Porte |
| 6,206,325 B1 | | 3/2001 | Nunnally |
| 6,207,940 B1 | | 3/2001 | Feher et al. |
| 6,283,411 B1 | | 9/2001 | Giamati et al. |
| 6,330,986 B1 | | 12/2001 | Rutherford et al. |
| 6,353,201 B1 | * | 3/2002 | Yamakoshi ........ H05H 1/46 |
| | | | 315/111.41 |
| 6,427,946 B1 | | 8/2002 | Petrenko |
| 6,443,395 B1 | | 9/2002 | Porte et al. |
| 6,653,598 B2 | | 11/2003 | Petrenko |
| 6,688,558 B2 | | 2/2004 | Breer et al. |
| 6,693,786 B2 | | 2/2004 | Petrenko |
| 6,698,691 B2 | | 3/2004 | Porte |
| 6,723,971 B1 | | 4/2004 | Petrenko |
| 6,870,139 B2 | | 3/2005 | Petrenko |
| 6,890,152 B1 | | 5/2005 | Thisted |
| 6,894,417 B2 | | 5/2005 | Cai et al. |
| 7,087,876 B2 | | 8/2006 | Petrenko |
| 7,157,663 B1 | | 1/2007 | Kismarton |
| 7,164,100 B2 | | 1/2007 | Petrenko |
| 7,227,110 B2 | | 6/2007 | Petrenko |
| 7,518,093 B2 | | 4/2009 | Veerasamy et al. |
| 7,546,980 B2 | | 6/2009 | Giamati |
| 7,556,221 B2 | | 7/2009 | Hindel et al. |
| 7,703,300 B2 | | 4/2010 | Petrenko |
| 7,837,150 B2 | | 11/2010 | Zecca et al. |
| 7,883,609 B2 | | 2/2011 | Petrenko |
| 7,913,952 B2 | | 3/2011 | Boschet et al. |
| 7,922,121 B2 | | 4/2011 | Gaertner, II et al. |
| 8,612,067 B2 | | 12/2013 | Leon et al. |
| 9,199,741 B2 | | 12/2015 | Sapper et al. |
| 9,469,408 B1 | | 10/2016 | Elangovan et al. |
| 9,555,894 B2 | | 1/2017 | Botura et al. |
| 9,656,761 B2 | | 5/2017 | Lumbab et al. |
| 9,742,136 B2 | | 8/2017 | Plickys |
| 9,839,073 B2 | | 12/2017 | Kessler et al. |
| 10,137,994 B2 | | 11/2018 | Hull et al. |
| 10,259,589 B2 | | 4/2019 | Botura et al. |
| 10,457,403 B2 | | 10/2019 | Houlihan et al. |
| 10,473,381 B2 | | 11/2019 | Petrenko |
| 2002/0092849 A1 | * | 7/2002 | Petrenko ............ H05B 3/00 |
| | | | 219/772 |
| 2002/0096515 A1 | | 7/2002 | Petrenko |
| 2004/0149734 A1 | | 8/2004 | Petrenko et al. |
| 2005/0184193 A1 | | 8/2005 | Bourjac et al. |
| 2006/0196994 A1 | | 9/2006 | Chow et al. |
| 2007/0210073 A1 | * | 9/2007 | Hubert ............. H05B 3/262 |
| | | | 219/535 |
| 2007/0230085 A1 | | 10/2007 | Le |
| 2008/0251642 A1 | | 10/2008 | Boschet et al. |
| 2010/0096507 A1 | | 4/2010 | Villinger |
| 2010/0199629 A1 | | 8/2010 | Chene et al. |
| 2010/0243811 A1 | | 9/2010 | Stothers |
| 2011/0026194 A1 | * | 2/2011 | Riggsby ........... H05K 5/066 |
| | | | 361/679.01 |
| 2013/0092678 A1 | | 4/2013 | Petrenko et al. |
| 2013/0199218 A1 | | 8/2013 | Scheibert |
| 2013/0249321 A1 | | 9/2013 | Gao et al. |
| 2014/0070054 A1 | | 3/2014 | Burton et al. |
| 2014/0319278 A1 | | 10/2014 | Ribarov et al. |
| 2014/0367522 A1 | | 12/2014 | Stonestreet, II et al. |
| 2015/0129720 A1 | | 5/2015 | Strobl et al. |
| 2015/0246730 A1 | | 9/2015 | Khozikov et al. |
| 2015/0344138 A1 | * | 12/2015 | Wen .............. B64C 1/12 |
| | | | 219/544 |
| 2016/0236787 A1 | | 2/2016 | Bourne et al. |
| 2016/0122025 A1 | | 5/2016 | Hull et al. |
| 2016/0221680 A1 | | 8/2016 | Burton et al. |
| 2016/0329619 A1 | * | 11/2016 | Günther ............ H01P 5/08 |
| 2017/0057618 A1 | * | 3/2017 | Khozikov ........... B64D 29/00 |
| 2017/0057644 A1 | | 3/2017 | Khozikov et al. |
| 2017/0058772 A1 | | 3/2017 | Frank et al. |
| 2017/0081032 A1 | | 3/2017 | Botura et al. |
| 2017/0081033 A1 | | 3/2017 | Steinwandel et al. |
| 2017/0158336 A1 | | 6/2017 | Meis et al. |
| 2017/0167496 A1 | | 6/2017 | Klosinski et al. |
| 2017/0361935 A1 | | 12/2017 | Hull et al. |
| 2018/0105276 A1 | | 4/2018 | Wilkins |
| 2018/0172333 A1 | | 6/2018 | Petrenko et al. |
| 2018/0213606 A1 | | 7/2018 | Hu et al. |
| 2018/0215476 A1 | | 8/2018 | Chee et al. |
| 2018/0346133 A1 | | 12/2018 | Paulson et al. |
| 2019/0039746 A1 | | 2/2019 | Brooks et al. |
| 2019/0112055 A1 | | 4/2019 | Burton et al. |
| 2019/0176994 A1 | | 6/2019 | Burton et al. |
| 2019/0193862 A1 | | 6/2019 | Kinlen et al. |
| 2019/0233127 A1 | | 8/2019 | Carcone et al. |
| 2019/0308737 A1 | | 10/2019 | Porte et al. |
| 2019/0373681 A1 | | 12/2019 | Saad et al. |
| 2020/0022222 A1 | | 1/2020 | Bratianu-Badea et al. |
| 2020/0383175 A1 | | 12/2020 | Bratianu-Badea et al. |

FOREIGN PATENT DOCUMENTS

| | | | |
|---|---|---|---|
| CN | 105059553 | 11/2015 | ............ B64D 15/04 |
| CN | 108482683 | 9/2018 | ............ B64D 15/00 |

(56) References Cited

FOREIGN PATENT DOCUMENTS

| | | | | |
|---|---|---|---|---|
| CN | 109050938 | 12/2018 | ............ | B64D 15/00 |
| CN | 109072816 | 12/2018 | ............ | F02K 1/82 |
| CN | 109334998 | 2/2019 | | |
| CN | 109436338 | 3/2019 | | |
| CN | 109573055 | 4/2019 | | |
| CN | 109625289 | 4/2019 | | |
| CN | 110316385 | 10/2019 | | |
| DE | 202012007091 * | 4/2013 | | |
| DE | 202012007091 U1 * | 4/2013 | ............ | B64D 15/12 |
| DE | 102012002132 | 8/2013 | | |
| DE | 102018102506 | 3/2019 | | |
| EP | 1 826 119 | 8/2007 | | |
| EP | 3 020 638 | 5/2016 | | |
| EP | 3 115 298 | 1/2017 | | |
| EP | 3 153 409 | 4/2017 | | |
| EP | 3 297 395 | 3/2018 | | |
| EP | 3 342 711 | 7/2018 | | |
| EP | 3 456 635 | 3/2019 | | |
| EP | 3 546 364 | 10/2019 | | |
| EP | 3 552 969 | 10/2019 | | |
| FR | 2 719 182 | 10/1995 | | |
| FR | 2719182 A1 * | 10/1995 | ............ | B64D 15/12 |
| GB | 885 131 | 12/1961 | | |
| GB | 885131 A * | 12/1961 | | |
| GB | 885131 A * | 12/1961 | | |
| GB | 1001168 | 8/1965 | | |
| GB | 2 438 389 | 11/2007 | | |
| GB | 2438389 A * | 11/2007 | ............ | B64D 15/12 |
| GB | 2 550 947 | 12/2017 | | |
| JP | 1-220384 | 9/1989 | ............ | H05B 3/00 |
| JP | H 04-208694 | 7/1992 | ............ | B64D 15/16 |
| JP | 2019-112051 | 7/2019 | | |
| RU | 2411161 | 2/2011 | | |
| WO | WO 98/01340 | 1/1998 | ............ | B64D 15/12 |
| WO | WO 01/49564 | 7/2001 | ............ | B64D 15/00 |
| WO | WO 2006/136748 | 12/2006 | ............ | B64D 15/12 |
| WO | WO 2011/087412 | 7/2011 | ............ | B64D 15/12 |
| WO | WO 2013/180313 | 12/2013 | | |
| WO | WO-2014184146 A1 * | 11/2014 | ............ | B64D 15/12 |
| WO | WO 2016/091882 | 6/2016 | ............ | H05B 6/64 |
| WO | WO 2016/176350 | 11/2016 | ............ | C09K 3/18 |

OTHER PUBLICATIONS

International Preliminary Report on Patentability for International Application No. PCT/US2019/048253 dated Mar. 11, 2021.
Extended European Search Report in European Appln No. 23172303.2, dated Jul. 11, 2023, 7 pages.

* cited by examiner

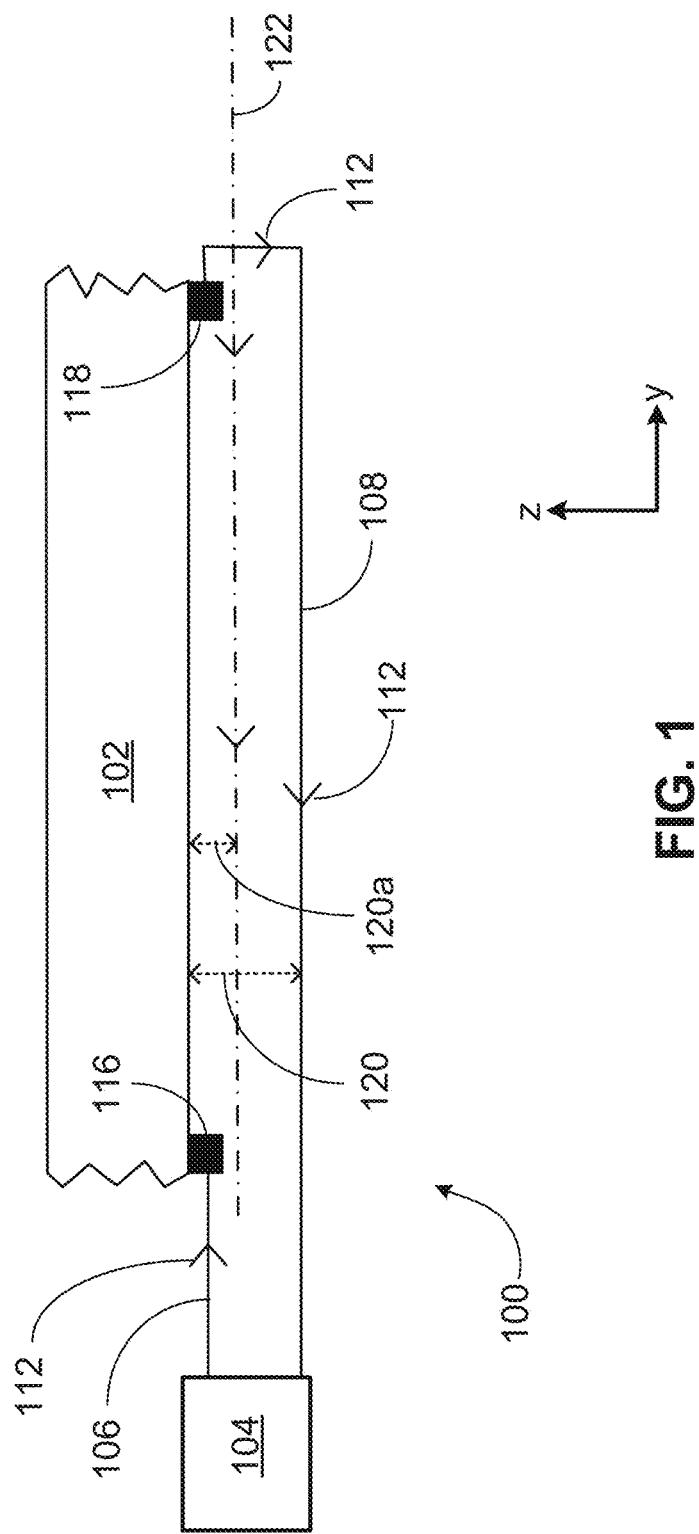

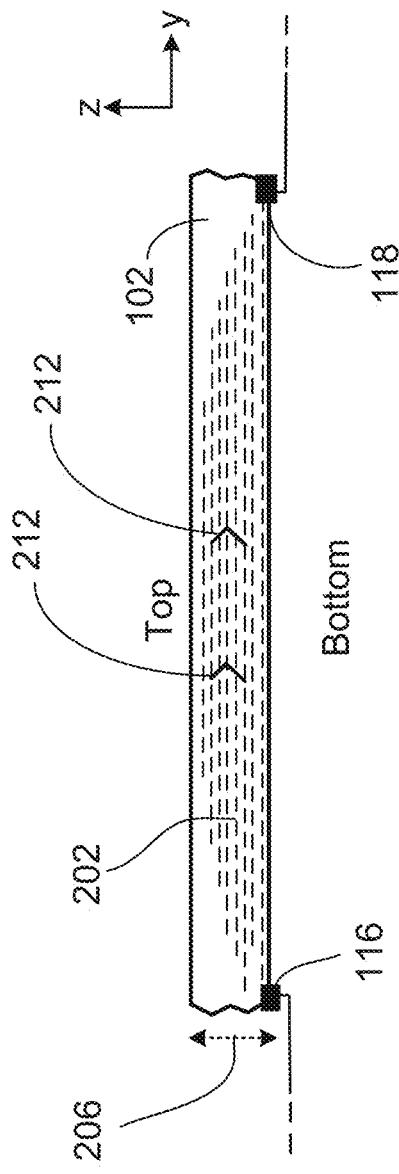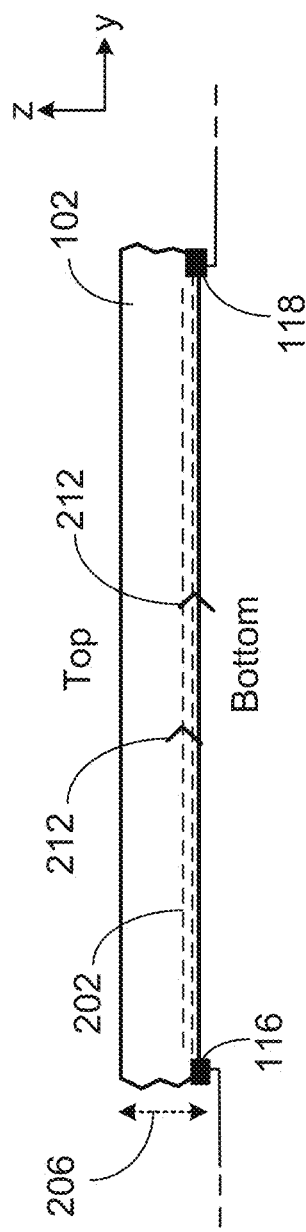
FIG. 2A
FIG. 2B

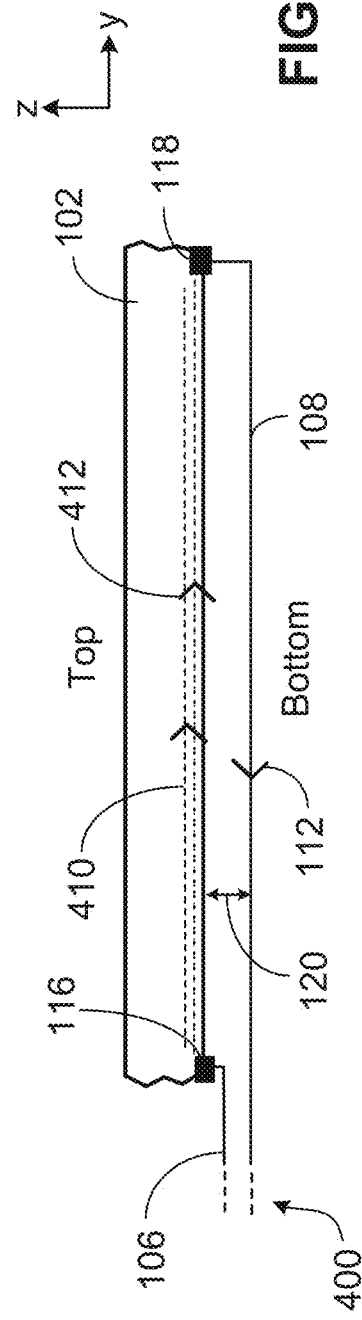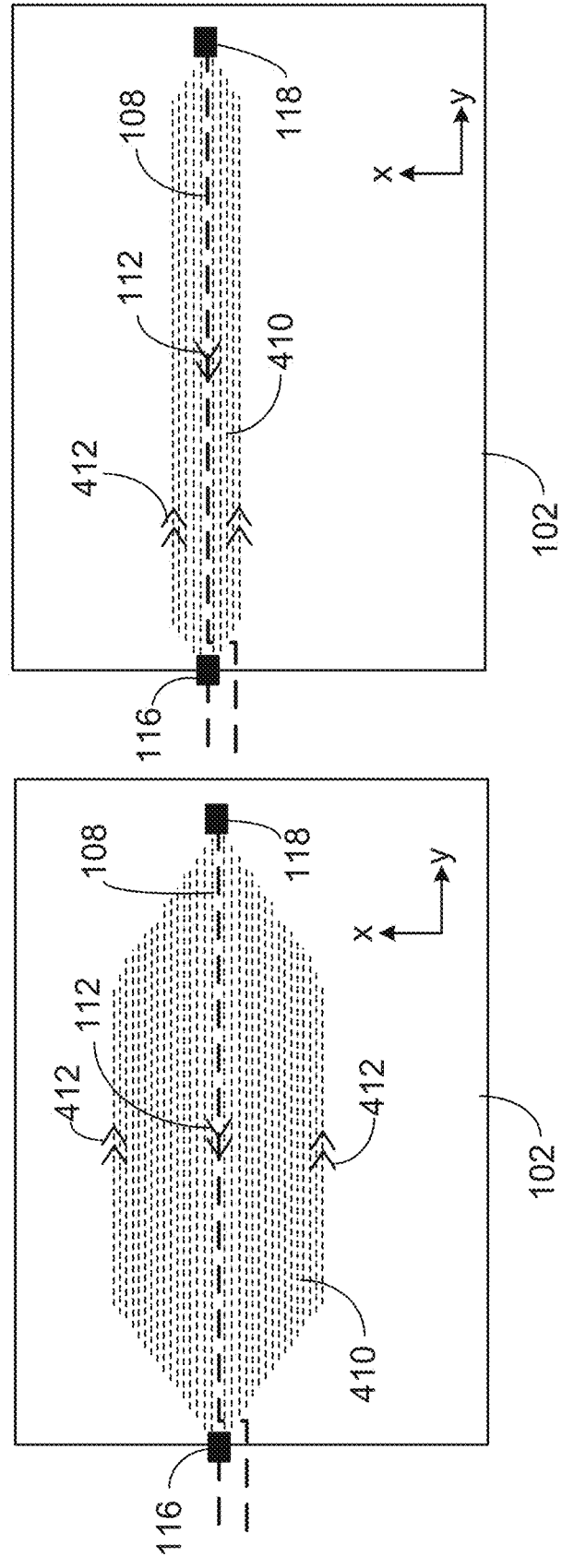

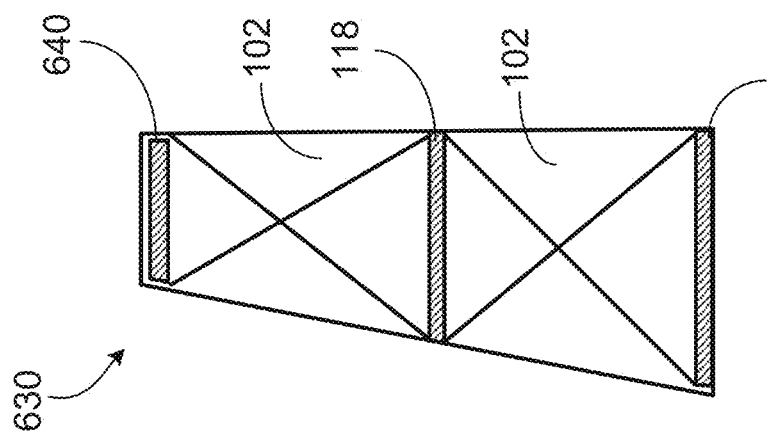
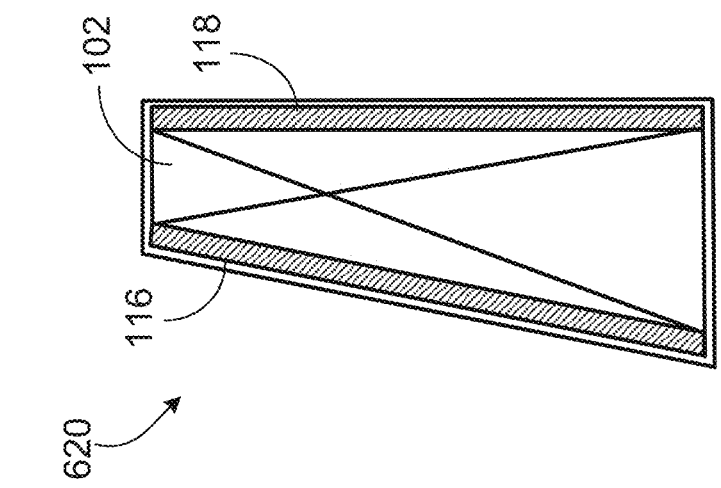
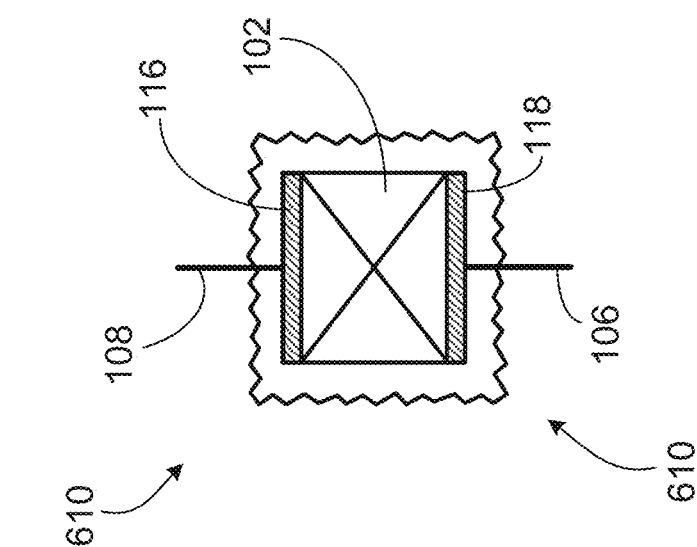
FIG. 6D
FIG. 6C
FIG. 6B

DE-ICING SYSTEMS

CROSS-REFERENCE TO RELATED APPLICATIONS

This application claims priority to U.S. Patent Application No. 62/723,270, filed on Aug. 27, 2018, the contents of which is hereby incorporated by reference in its entirety.

TECHNICAL FIELD

This specification relates to heating systems for conductive materials.

BACKGROUND

Many conductive surfaces, such as those on cars, aircraft, and satellites encounter cold and icy conditions during every day use. Ice or water accumulation on the conductive surfaces of these structures may result in inefficient or unsafe operating conditions. For example, ice accumulation on aircraft wings may result in lift degradation and increased drag.

Many of these structures do not have heating systems, or have heating systems that require using bulky electronics or other equipment. The use of such bulky devices poses a challenge for the industry.

SUMMARY

This specification describes technologies for heating a conductive surface. These technologies generally involve using higher frequency alternating electric current ("AC") signals (e.g., above 1 kHz) to shape current density in a target area of a conductive bulk medium (e.g., conductive material), resulting in Joule heating of the medium.

Joule heating, also known as ohmic heating or resistive heating, is the process by which the passage of an electric current through a conductor produces heat. The amount of heat generated by a conducting medium is based on the amount of current passed through the medium and the electrical resistance of the medium. Consequently, the heating can be controlled (e.g. increased or decreased) by adjusting the current, voltage, resistance, or a combination thereof.

The resistance of a given conductor may be increased by constraining the volume within the conductor in which current can flow and by increasing the length along which the current flows. Implementations of the present disclosure can be configured to produce heating in a bulk medium by manipulating mechanisms for shaping (e.g., constricting, lengthening, etc.) current within a conductive medium (e.g., bulk medium, conductor): for example, by using the skin effect and the proximity effect. Both effects rely on running a high frequency AC current through the conductive medium that is to be heated. The skin effect constrains current flow by taking advantage of the tendency of an alternating electric current to become distributed within a conductor such that the current density increases near the surface of the conductor, and decreases with greater depths in the conductor. The proximity effect can be used to further constrain current flow in the conductor by placing another AC current path near the existing current flowing in the conductor. The proximity effect can also act to lengthen the current path.

For example, implementations of the present disclosure are configured to increase the resistance of a bulk medium along a current path through the medium by constricting the current flow along the path. Consequently, implementations may provide increased heating performance in conductive mediums while at the same time permitting a reduction in the current required to produce the heat. That is, by increasing the effective resistance of a conductive medium along a particular current path, less current may be required to produce Joule heating in the medium than would be required otherwise.

In general, in a first aspect, a system for heating a bulk medium includes two or more electrodes spaced apart from one another and coupled to the bulk medium; and a power control system coupled to the electrodes, the power control system configured to produce an effective resistance of the bulk medium along a current path between the electrodes by shaping a density of the current in the bulk medium, in which the power control system shapes the density of the current within a depth of the bulk medium by tuning a skin-depth of the current along the current path, and in which the power control system shapes the density of the current in a direction across the current path by the power control system by tuning a proximity effect of the current.

A second general aspect can be embodied in a system for heating a bulk medium includes two or more electrodes spaced apart from one another and coupled to the bulk medium; and a power control system coupled to the electrodes, the power control system configured to heat the bulk medium by shaping a density of the current along a current path between the electrodes, thereby, producing an effective resistance along the current path in the bulk medium that is greater than the resistance of the bulk medium to a direct current (DC), in which the power control system shapes the density of the current within a depth of the bulk medium by tuning a skin-depth of the current, and in which the power control system shapes the density of the current in a direction across the current path by the power control system by tuning a proximity effect of the current.

A third general aspect can be embodied in a system includes two or more electrodes configured to be coupled to a bulk medium; and a power control system configured to couple to the electrodes and to heat the bulk medium by shaping a density of current along a current path through the bulk medium between the electrodes, thereby, producing an effective resistance along the current path that is greater than the resistance of the bulk medium to a DC current, in which the power control system shapes the density of the current within a depth of the bulk medium by tuning a skin-depth of the current, and in which the power control system shapes the density of the current in a direction across a portion of the current path by the power control system by tuning a proximity effect of the current.

A fourth general aspect can be embodied in a system includes two or more electrodes spaced apart from one another and coupled to a bulk medium; a power control system coupled to the electrodes and configured to generate an AC current signal along a current path through the bulk medium between the electrodes at a frequency greater than 1 kHz and less than 300 GHz; and a second current path positioned proximate to a surface of the bulk medium and along the current path through the bulk medium.

A fifth general aspect can be embodied in a heating system includes two or more electrodes spaced apart from one another and coupled to a bulk medium; a power control system coupled to the electrodes and configured to generate an AC current signal along a current path through the bulk medium to heat the bulk medium; and an impedance adjusting network (IAN) coupled between the heating control system and the electrodes and configured to adjust an impedance of the heating control system to correspond with an impedance of the bulk medium.

A sixth general aspect can be embodied in a heating system includes two or more electrodes spaced apart from one another and coupled to a bulk medium, each of the two or more electrodes including a material that is at least as electrically conductive as the bulk medium, and being coupled to the bulk medium in a manner that reduces a contact resistance between the electrode and the bulk medium; and a power control system configured to couple to the electrodes, the power control system configured to heat the bulk medium by shaping a density of current along a current path through the bulk medium between the electrodes, thereby, producing an effective resistance along the current path that is greater than the resistance of the bulk medium to a DC current, in which the heating system shapes the density of the current by tuning a skin-depth of the current along the current path.

A seventh general aspect can be embodied in an aircraft de-icing system that includes two or more electrodes spaced apart from one another and coupled to a portion of an aircraft; a power control system coupled to the electrodes and configured to heat the bulk medium by shaping a density of current along a current path through the bulk medium between the electrodes by: generating an AC current signal along a current path through the portion of the aircraft between the electrodes and at a frequency between 1 MHz and 50 MHz, in which the frequency causes the density of the current to be shaped in a first direction by tuning a skin-depth of the current along the current path; and providing a second current path positioned along at least a portion of the current path through the portion of the aircraft and within a proximity of 10 cm of a surface of the portion of the aircraft, in which the proximity of the second current path to the surface of the portion of the aircraft causes the density of the current to be shaped in a second, different, direction by tuning a proximity effect of the current along the portion of the current path.

An eighth general aspect can be embodied in a system for heating an exterior surface of a bulk medium. The system includes two or more coupling strips spaced apart from one another and attached to the bulk medium. Each of the coupling strips has a multi-layer structure extending along a surface of the bulk medium that forms, in combination with the bulk medium, an electrical transmission line. The multi-layer structure includes a first dielectric layer over the bulk medium, a conductive layer over the first dielectric layer, a second dielectric layer over the conductive layer, and a conductive shielding layer over the second dielectric layer. A power control system is coupled to the conductive layer of each of the coupling strips and to the bulk medium. The power control system is configured to heat the surface of the bulk medium by providing electrical current to the coupling strips. In various implementations, the bulk medium can be an aircraft skin, a wind turbine blade, a roof of a building, or railroad tracks.

A ninth general aspect can be embodied in a system for heating an exterior of a structure, where the structure is made from a non-conductive material. The structure includes a bulk conductive material embedded therein. The system includes two or more coupling strips spaced apart from one another and attached to the structure. Each of the coupling strips has a multi-layer structure extending along the structure that forms, in combination with the bulk conductive material embedded within the structure, an electrical transmission line. The multi-layer structure includes a conductive layer overlapping the bulk conductive material, and a first dielectric layer between the bulk conductive material and the first conductive layer. The power control system is coupled to the conductive layer of each of the coupling strips and to the structure The power control system is configured to heat the surface of the structure by providing electrical current to the coupling strips. In various implementations, the structure can be an aircraft skin, a wind turbine blade, a roof of a building, or railroad tracks.

A tenth general aspect can be embodied in a method of installing a bulk medium heating system. The method includes obtaining coupling strips, where each coupling strip comprises a multi-layer structure that includes a first dielectric layer, a conductive layer overlapping the first dielectric layer, a conducive shielding layer overlapping the conductive layer, and a second dielectric layer between the conductive layer and the conducive shielding layer. The method includes attaching each of the coupling strips to a surface of an bulk medium and spaced apart from one another with the first dielectric layer of each coupling strip positioned between the bulk medium and the conductive layer. The method includes coupling the conductive layer of each of the coupling strips to a power control system that is configured to provide electrical current to the coupling strips. In various implementations, the bulk medium comprises an aircraft skin, a wind turbine blade, a roof of a building, or railroad tracks.

The subject matter described in this specification may be implemented so as to realize one or more of the following advantages. A lighter, less bulky electrical system may be used to heat a conductor. In addition, heating may be localized to the target area, and not overheat the heating system circuity. The heating system may be more efficient, for example, by generating heat directly in a bulk medium (e.g., aircraft wing) itself rather than generating heat in a heating element or heating layer attached to the bulk medium. The system may also use less current and voltage for heating, potentially improving safety and reliability. In some implementations, component stress may also be reduced. The system may be easier, faster, or cheaper to install or retrofit. The system may be cheaper or easier to maintain. The system may be non-invasive when retrofitted into existing systems. The system may be faster at de-icing.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 1 is a schematic diagram of an exemplary setup for heating a bulk medium.

FIGS. 2A-2B are schematic diagrams illustrating an exemplary setup for heating a bulk medium that utilizes the skin effect to concentrate current density in a first direction in a bulk conductor.

FIGS. 4A-D are schematic diagrams illustrating exemplary setups for heating a bulk medium that utilize the proximity effect to concentrate current density in a second direction in a bulk conductor.

FIGS. 6B-D are schematic diagrams of exemplary setups for heating a bulk medium using various electrode arrangements.

Like reference numbers and designations in the various drawings indicate like elements.

DETAILED DESCRIPTION

Figure 3:
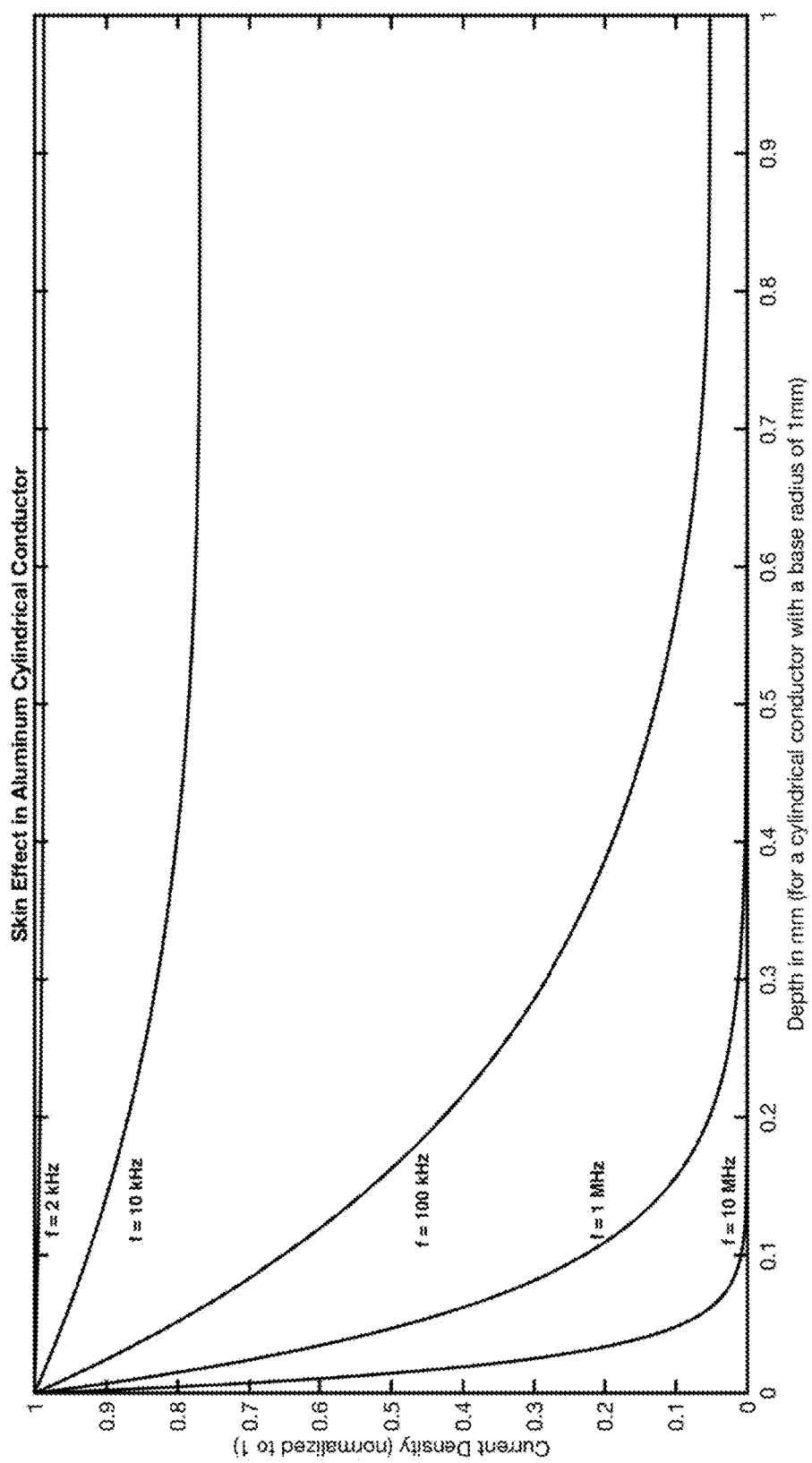
FIG. 3 is a plot showing the increased concentration of current density as a function of applied AC current due to the skin effect.

The heating system of the present specification uses AC currents in order to increase the effective electrical resistance of conductive materials (e.g., aluminum, carbon fiber composites) in order to more easily heat them. In general, the heat generated in the conductive material can be used to melt ice that has formed on the surface of the conductive material. The heat can also be used to keep conductive materials at an elevated temperature in order to prevent vapor deposition on the surface, or to keep water from freezing on the surface, as well as to prevent freezing precipitation (e.g., snow, ice pellets, fog, freezing rain) from accumulating on the surface. For example, the heat generated in the conductive material may conduct (e.g., spread out) throughout the conductive material. In addition, the heat generated may cause convection across the interface between the conductive material and the any liquid on the surface in order to, for example, heat the liquid and prevent it from freezing.

Alternating currents can be utilized to induce a number of electromagnetic effects that increase the effective resistance of a conductive material, thereby facilitating heat generation using Joule heating in the conductive material. Such effects include the skin effect, the proximity effect, induction, eddy currents, hysteresis losses, and dielectric losses. With the skin effect, if the frequency of the current in a conductor is set to a sufficiently high value, the majority of the current will pass through a skin depth of the conductive material that is significantly less than the conductive material's geometric thickness. In addition, specific device geometries can be used to generate the proximity effect within the conductive material, which will further constrain the width of the current density, thereby, further increasing the effective resistance along a current path within the conductive material. Taken together, these two effects can be used to increase the electrical resistance of the conductive material and result in Joule heating.

For example, Joule heating generally refers to heat produced by passing an electric current through a conductor. The heat generated in a given current carrying conductor is proportional to the resistance of the material times the root mean square of the amplitude of the current squared:

$$P \propto I^2 R$$

Heat output from a heating element is generally increased by increasing the current passed through a conductor and by having relatively higher resistance heating elements. However, implementations of the present disclosure generate Joule heating by leveraging particular electromagnetic phenomena (e.g., skin effect and proximity effect) to constrict the current density of a localized current within a bulk medium. This constriction in current density produces an increased effective resistance along the current's path within the bulk medium. While specific effects may vary in different materials and with different geometries, the effective resistance for a given length along the current path through a bulk medium can generally be represented as:

$$R_{eff} \propto \rho \frac{l}{A_{eff}},$$

where $\rho$ represents the resistivity of the material through which the current flows, l represents the length of the current path, and $A_{eff}$ represents the constricted cross-sectional area of the current density. Implementations of the present disclosure use the electromagnetic phenomena to reduce $A_{eff}$ to an area less than the cross-section of the bulk medium along the current's path, thereby, increasing the effective resistance of the bulk medium above that of the bulk medium to a DC current.

Some implementations of the present disclosure can use these electromagnetic phenomena to increase the length of a current path through the bulk medium. For example, as described in reference to FIG. 4D below, techniques described herein can be used to "steer" the current path along a non-direct route (e.g., a serpentine path) between two electrodes attached to the bulk medium. The non-direct route may create a current path that has an effective length ($l_{eff}$) that is longer than a substantially straight path that would generally be produced by passing a current between the two electrodes in the absence of electromagnetic effects such as the proximity effect, for example. Thus, systems described herein may increase the current path length l to an effective length ($l_{eff}$) that is longer than a direct path that the current would take in the absence of the various systems and conductor arrangements described herein. Accordingly, such implementations may increase the effective resistance (Reff) by both constricting the effective cross-sectional area ($A_{eff}$) of a current flowing through a bulk medium and also increasing the effective length ($l_{eff}$) that the current traverses through the bulk medium, thereby, further increasing the effective resistance of the bulk medium above that of the bulk medium to a DC current. In such implementations, the effective resistance can be generally represented as:

$$R_{eff} \propto \rho \frac{l_{eff}}{A_{eff}}.$$

Through the use of such techniques, implementations of the present disclosure can produce high localized resistances in conductive bulk materials (e.g., aluminum, copper, steel, and alloys thereof).

Skin effect, as used herein, generally refers to the tendency of an alternating electric current to be unevenly distributed in a conductor, such that the current density is larger near the surface of the conductor and decreases as distance to the conductor's surface increases. The intensity of the skin effect increases with the frequency of the current and with the conductivity of the material that carries the current. Some implementations of the present disclosure may tune the skin effect to cause the electric current to flow more at the outer surface of the conductor (e.g., "skin depth") at higher AC frequencies.

In general, the skin effect in a conductor can be represented by the following formula:

$$J = J_S e^{-(1+j)d/\delta} \text{ with } \delta = \sqrt{\frac{2\rho}{\omega\mu}} \sqrt{\sqrt{1+(\rho\omega\varepsilon)^2} + \rho\omega\varepsilon}$$

where J is the current density, $J_s$ is the surface current density, d is the depth of the point where the current density is calculated, $\delta$ is the skin depth, $\rho$ is the resistivity of the conductor, $\omega$ is the angular frequency of the current, $\mu$ is the magnetic permeability of the conductor, $\varepsilon$ is the permittivity of the conductor. In the case of a cylindrical conductor with a base radius R, the current density can be further derived as:

$$J = J_S \frac{J_0\left(\sqrt{\frac{-j\omega\mu}{\rho}}(R-d)\right)}{J_0\left(\sqrt{\frac{-j\omega\mu}{\rho}}R\right)}$$

where $J_0$ is the Bessel function of the first kind and of order 0.

In the case of a rectangular, infinitely long and wide plate on which a surface current flows, the skin effect can be represented by the following formula:

$$J = J_S \frac{sh(\sqrt{j\omega\sigma\mu}\, d)}{sh(\sqrt{j\omega\sigma\mu}\, e)}$$

where $J_s$ is the forced surface current, $\sigma$ is the plate conductivity, e is the plate thickness, and sh is the hyperbolic sine function. For example, the chart shown in FIG. 3, and discussed in more detail below, illustrates an example of current density constriction within the depth of the material (e.g., skin depth) in a cylindrical conductor that is caused by the skin effect. As detailed above, such constriction of the effective cross-section increases the effective resistance of the conductor.

For example, the chart shown in FIG. 3, and discussed in more detail below, illustrates an example of current density constriction within the depth of the material (e.g., skin depth) that is caused by the skin effect.

Figure 5A:
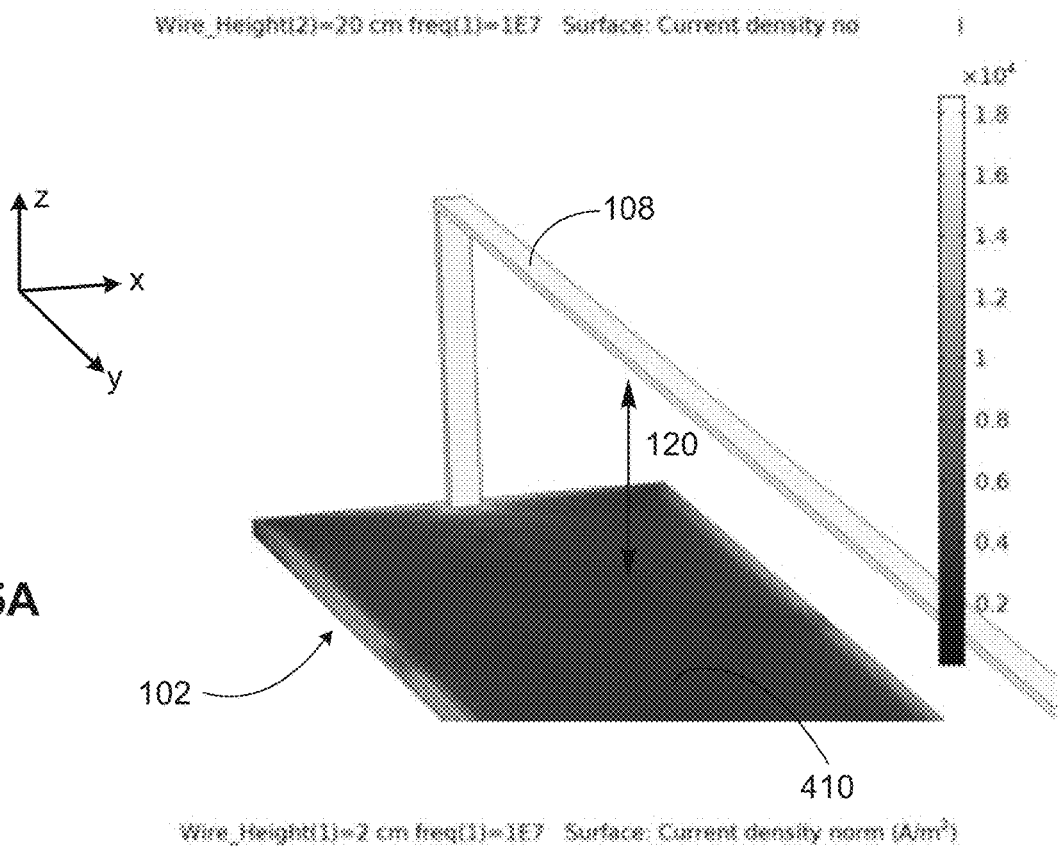
FIGS. 5A-B are simulation graphics showing the increased concentration of current density in a bulk conductor near a second conductor as a function of distance between the conductors due to the proximity effect.
Figure 5B:
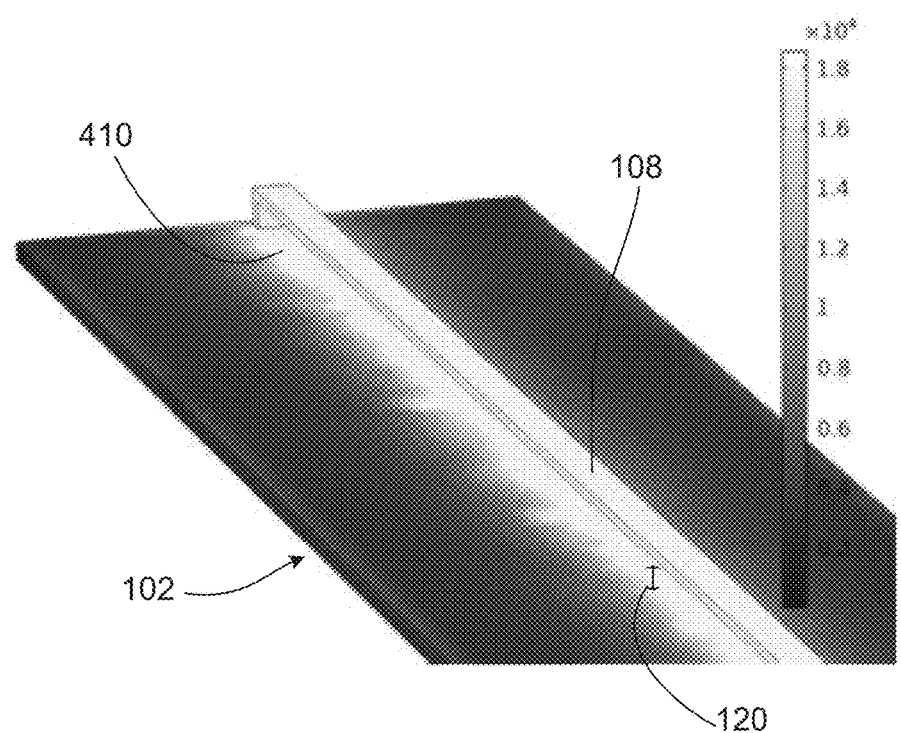

Proximity effect, as used herein, generally refers to the effect of AC current flowing in a first current path (e.g., conductor) on the current density of an AC current flowing in a second, nearby, current path. For example, as shown in FIGS. 5A-5B and described in more detail below, the AC current in the first current path causes the density of the AC current in the second current path to "crowd" or constrict around the first current path. In implementations of the present disclosure, for example, the density of a current passing through a bulk medium is "pulled" towards another conductor carrying an AC current when the conductor is placed proximate to current passing through the bulk medium. The degree and direction of current density constriction (e.g., crowding) caused by the proximity effect is dependent on several variables including, for example, the distance between two or more AC current paths, the direction of current travel in the individual current paths relative to each other, the frequencies of the AC currents in the current paths, and the magnitude of the individual currents in the current paths.

For clarity, the heating system of the present disclosure will be described in reference to the example context of a de-icing and anti-icing system for an external surface of an airplane. However, the heating system of the present disclosure can be used in other contexts including, but not limited to, heating the surfaces of other aircraft, drones, wind turbines, units in cryogenic operations, heat pumps, cars, radio towers, railroad tracks, manned or unmanned military vehicles, roofs, or heating other conductive surfaces that may benefit from control of ice or water formation. The heating system can be used for de-icing or anti-icing. In some implementations, the heating system can be used to heat less conductive materials by, for example, applying a conductive layer over or inside a non-conductive material. Such implementations can be used to heat surfaces of roadways (e.g., driveways), building materials, roofs, floors or other low- or non-conductive materials.

De-icing, as used herein, generally refers to removal of snow, ice or frost (collectively referred to as "ice") from a surface. In some implementations, the heating system can melt only a portion of existing ice on a conductive surface. The ice would then be removed from the surface (e.g., by slipping off the surface once the melting process has started and the ice-surface bond has been broken).

Anti-icing, as used herein, generally refers to the prevention of the formation of or the adherence of snow, ice or frost (collectively referred to as "ice") to a surface. In some implementations, the heating system maintains the surface temperature high enough to prevent ice from forming on the surface and prevent ice accumulation or formation (e.g., from freezing precipitations such as snow, frost, ice pellets, freezing rain, etc.).

FIG. 1 shows a block diagram of an example heating system 100 for heating a bulk medium. Heating system 100 includes power control system 104 coupled to electrodes 116 and 118. Electrodes 116 and 118 are coupled to a target area of the bulk medium 102 (e.g., part of an aircraft wing). The power control system 104 generates alternating current (AC current) (e.g., of frequencies 1 kHz or higher) across a closed circuit through wire (or path or cable) 106, bulk medium 102, and finally wire (or return path) 108. The direction of current 112 through the wires is indicated by a dashed arrow.

In some implementations, the heating system 100 can include, but is not limited to, power control system 104, electrodes 116 and 118, and specialized cables (e.g., wires 108 and 106). In some implementations, the heating system is configured to be coupled to electrodes 116 and 118. In some implementations, the heating system is configured to be coupled to specialized cables (e.g., 108 or 116). In some implementations, power control system 104 can include, but is not limited to, a signal generating unit, power source, a signal transforming unit, an impedance adjusting network, a control unit, and sensors, with specific configurations described in more detail below. As detailed below, in some implementations, the impedance adjusting network is an impedance matching network.

In some implementations, electrodes 116 and 118 are contact electrodes. For example, electrodes 116 and 118 are physically connected to the bulk medium 102 to conduct electrical current from the power control system 104 to the bulk medium. In some implementations, electrodes 116 and 118 can be coupled to the bulk medium 102 but electrically insulated from the bulk medium 102. For example, in such implementations, electrodes 116 and 118 can be the input and output of an induction coil that is positioned proximate to the bulk medium 102 to magnetically induce a current in the bulk medium 102.

Power control system 104 can supply current at a sufficiently high frequency (e.g., above 1 kHz) to constrict current flow in the z-direction between electrodes 116 and 118 by tuning the skin effect, resulting in higher resistance of bulk medium 102. For example, the power control system 104 can provide AC current at a frequency between 1 kHz and 300 GHz. In some implementations, the current frequency is between 10 kHz and 30 GHz. In some implementations, the current frequency is between 100 kHz and 450 MHz. In some implementations, the current frequency is in a range of 1 MHz-50 MHz, 100 MHz-150 MHz, 200 MHz-300 MHz, 400 MHz-500 MHz, or 800 MHz-1 GHz.

In some implementations, the return path 108 is arranged in close proximity to the surface of the bulk medium 102. The proximity of the return path 108 to the surface of the bulk medium can be used to tune the proximity effect of the current flowing between electrodes 116 and 118 and, thereby, further constrict the current and increase the heating within the bulk medium. In order to harness the proximity effect to shape the current flowing between electrodes 116 and 118 it is not necessary to use the return current path 108 from the heating system circuit itself. In some implementations, another current path 122 (e.g., from different circuit) can be placed in close proximity (e.g., distance 120a) to the bulk medium 102. For example, when the distance 120 or 120a of current path 108 or 122 from bulk medium 102 is sufficiently small, the proximity effect can be used to further constrain current through the bulk medium.

For example, the distance 120 (or 120a) between the bulk medium and path 108 (or 122) can be less than 1 m, or less than 50 cm, or less than 10 cm to produce a proximity effect. If closer distances are possible, with due consideration for design constraints (e.g., with an airplane wing as bulk medium, where the rib or spar of airplane is not in the way of the return path 108/122), distance 120 (or 120a) can be less than 25 cm or less than 10 cm.

The bulk medium 102 can include materials such as, but not limited to, aluminum, metal alloys, carbon fiber composites, copper, silver, titanium, or steel. For example, the bulk medium can be any part of an aircraft airframe (e.g., outer-most shell or surface of airplane, also known as airplane's "skin") such as fuselage, wings, undercarriage, empennage, etc.

The electrodes (116 and 118) can include materials such as, but not limited to, aluminum, silver, copper, alloys thereof, or other conductive materials. In some implementations, the electrode material is at least as electrically conductive as bulk medium 102. In some implementations, electrodes 116 and 118 can be arranged in arrays of electrodes. The electrodes may be coupled to the bulk medium in a variety of ways, e.g., to the top or bottom surface of the medium, or embedded inside the medium.

Figure 4D:
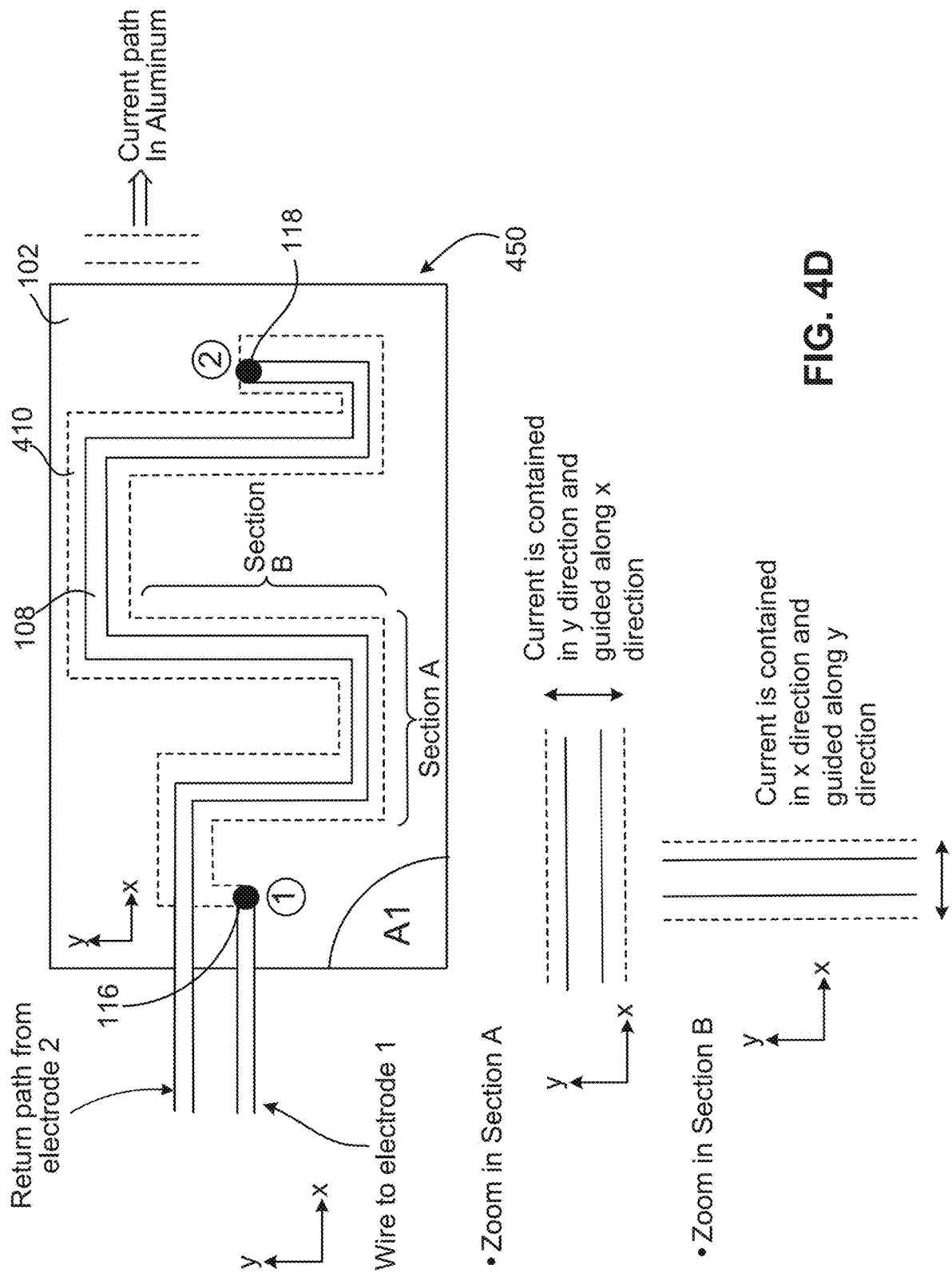

Heating system 100 is configured to produce an effective resistance through bulk medium 102 by shaping the density of the current through the medium. In other words, for airplane applications, the existing airframe of the airplane will be used as part of the electrical circuit of the heating system. Heating system 100 shapes the density of the current by tuning the skin effect, the proximity effect, or a combination thereof to increase the effective resistance of the bulk medium 102 along a current path between the electrodes 116 and 118. In some cases, the proximity effect is also leveraged to direct the current path, for example as seen in FIG. 4D in order to heat desired sections of the bulk medium. A desired heat section of the bulk medium may be referred to as a "target heating location" or "target location."

In some implementations, an alternating current of frequency 1 kHz or higher can be passed directly through an airframe of the plane. As a result, Joule heating will occur in the portion of the airframe near the surface that has current passing through it. Additionally, heat produced from the current will be spread by conduction throughout the bulk medium 102.

Referring to FIGS. 2A-2B, heating system 100 shapes the current density through medium target area 102 by utilizing the skin effect. As in FIG. 1, an AC current (in direction 212) is applied across electrodes 116 and 118 through a target area of bulk medium 102. FIG. 2A is a schematic diagram illustrating the profile (e.g., side view) of current density 202 through bulk medium 102 target area without the skin effect (e.g., with current frequencies below 1 kHz). The current is running in the y-direction (212), with the majority of the current flowing within the volume of medium 102 indicated by the arrows. For example, the current has a depth 206 of about 2 mm, for example, nearly the entire thickness of the bulk medium. As such, FIG. 2A illustrates an operation of system 100 with little or no shaping of the current density by the skin effect.

FIG. 2B is a schematic of a profile of current density 202 resulting from the application of a higher frequency AC current (e.g., over 1 kHz) across the electrodes. FIG. 2B illustrates an operation of system 100 with shaping of the current density by the skin effect. For example, due to the skin effect produced by operating heating system 100 at high frequencies, the depth of current density 202 flowing through bulk medium 102 is constricted in the z-direction to a narrow region near the surface of the bulk medium 102. Furthermore, the effective resistance of the bulk medium 102 in the region of current flow is sufficiently increased such that Joule heating can be realized in this area without overheating the remainder of the circuit (e.g., wires, power source, inverter, adjusting network, electrodes). The effective resistance of the bulk medium to the AC current in the target area can be greater than the resistance of the bulk medium to a DC current. For example, the effective resistance can be increased by two or more orders of magnitude above the resistance of the bulk medium to a DC current.

FIG. 3 is a plot showing the concentration of current density (y-axis, normalized to 1) into the depth of the material (x-axis, normalized to 1) as a function of applied AC current due to the skin effect. The current density decays exponentially along the thickness (z-direction) of the medium. As frequency increases from 1 kHz to 10 MHz, current density becomes more concentrated near the surface of the bulk medium. Thus, the higher the frequency, the more pronounced the decay. In other words, the skin effect constricts the current density causing the current to pass through a thin layer near the surface of the bulk medium. Consequently, Joule heating will occur in this layer as well.

FIG. 4A is a side-view schematic of system 400 for utilizing the proximity effect to further constrain the current density. As in FIG. 1, electrodes 116 and 118 are attached to the bulk medium 102 (e.g., target area on airframe) and pass an AC signal (e.g., over 1 k Hz) to create current density (or path) 410 with direction 412 through the medium. Return path 108 positioned within a distance 120 from current path (or density) 410 in the medium and has a direction 112 different from the direction 412. In some implementations, return path 108 is electrically insulated from the bulk medium 102. For example, return path 108 can be a wire or cable positioned within distance 120 of the bulk medium 102. Return path 108 can be a wire or cable that completes a circuit of system 400.

If the return path 108 is sufficiently close to current path 410 (e.g., less than 50 cm), the AC current in return path 108 constrains the current in current path 410 in directions across the path of the current flow in current path 410. In other words, positioning return path 108 sufficiently close to current path 410 causes the cross-sectional area of the current flow in current path 410 to be constricted. For instance, in reference to FIGS. 4A-4C, current is constricted in two directions (e.g., the x-direction and z-directions as shown) between the electrodes 116 and 118. For example, as shown in FIG. 4D, the proximity effect constricts the current density 410 in either the x- or y-direction depending on the direction of the current flow. For example, where the current flows in the x-direction the proximity effect constricts the current in the y-direction. For example, the proximity effect predominantly constricts the current across the direction of the current flow, whereas the skin effect predominantly constricts the current density within the depth of the bulk medium (e.g., in the z-direction as shown in FIGS. 2A and 2B). In some cases, the proximity effect can also add to the constriction of the current density in the depth (e.g., z-direction) of the bulk medium 102, e.g., enhancing the skin effect in implementations that make use of both the skin effect and proximity effect. In some implementations, the proximity effect can also be used to define the direction of the current flow through the bulk medium (e.g., the route that the current follows through the bulk medium 102).

FIGS. 4B-C are exemplary schematic diagrams of system 400 as seen from the top. Electrodes 116 and 118 are attached to bulk medium target area 102 and pass AC signal (e.g., over 1 kHz) to create current density (or current path) 410 with direction 412 through the medium. Return path 108 is positioned in a different x-y plane (dotted line) from current path (or density) 410 in the bulk medium 102. In some implementations, the current flow in the return path 108 is in a different direction 112 from the direction 412 of the current flow in current path 410 through the bulk medium 102. For example, in some implementations, the direction 112 of current flow in return path 108 is opposite to the direction 412 of current flow in current path 410. When the distance 120 of return path 108 to current path 412 is sufficiently small (e.g., under 50 cm), the current flowing between electrodes 116 and 118 within the bulk medium 102 will crowd close to the return path wire (e.g., constrict in the y- and z-direction) due to the proximity effect, as shown in FIG. 4C. The greater the distance of return path 108 away from the bulk medium 102, the less current path 412 in the bulk medium 102 will be constrained, as shown in FIG. 4B.

FIG. 4D is an exemplary schematic diagram of another implementation of system 450 as seen from the top. As in the previous system 100, electrodes 116 and 118 are attached to a target area of bulk medium 102. Return path 108 is positioned proximate to bulk medium 102 and in a different x-y plane from current path 410 within the bulk medium 102. The implementation shown demonstrates how the return path 108 (or another separate current path) can be used to shape the path that the current 410 follows through the bulk medium 102. For example, by placing a second current path (e.g., a current carrying wire or cable such as return path 108) proximate to the bulk medium 102 the proximity effect can be harnessed to both constrain the width of the current density across the direction of current flow and also to shape current path 410 within the bulk medium 102. FIG. 4D also demonstrates that the proximity effect constrains the current density along current path 410 across the direction of current flow. For example, in FIG. 4D, the current density along current path 410 is constrained in a direction that is substantially perpendicular to the direction of the current flow in each segment of the path 410 and the current path 410 within the bulk medium 102 conforms to follow the shape of the return path 108. More specifically, in section A of current path 410, the current is guided to flow along the x-direction and the current density is constricted in the y- and z-direction. In section B of the current path 410, the current is guided to flow along the y-direction and the current density is constricted in the x- and z-direction.

The ability to shape the current path into more complex geometries with the proximity effect, as shown in FIG. 4D, may offer a number of advantages. First, such path geometries may be used to increase the effective current path length l. As described above, increased path length leads to increased resistance, and thus increased Joule heating. Second, current path geometries may be configured to direct current flow to strategic locations for heating. Third, the current path geometries may be used to create areas of increased heating (e.g., hot spots) at sharp corners of the current path.

The effective resistance of the bulk medium to the AC current in the target area due to the combination of the proximity and skin effects can be greater than the resistance of the bulk medium to a DC current. For example, the effective resistance can be increased by two or more orders of magnitude above the resistance of the bulk medium to a DC current.

FIGS. 5A-B are simulation graphics showing the increased concentration of current density in a bulk conductor target area 102 near a second conductor/path 108 as a function of distance 120 between the conductors due to the proximity effect. The current in the bulk conductor and the second path are sufficient to cause a proximity effect (e.g., over 1 kHz, or 10 MHz) when distance 120 is reduced. For example, when distance 120 is 20 cm, the current density 410 remains roughly uniform in the x-y-plane, as shown in FIG. 5A. When distance 120 is reduced to 2 cm, as in in FIG. 5B, the proximity effect causes "crowding" or "constriction" of the current 410 around the return path 108 in the x-z-plane. This is realized by the majority of the current 410 crowding on a narrow strip along the bulk conductor and following the path of the second conductor (108) (e.g., return path, or other current carrying wires). In other words, current 410 follows the path of least inductance, rather than spreading out evenly throughout the bulk medium.

In some implementations, a wire other than the return path 108 is used to cause the proximity effect, shown as path 122 in FIG. 1. In that case, the current oscillations in that wire may or may not be driven by the same system (e.g., power control system 104) as paths 106 and 108. In that case, the proximity effect of wire 122 will depend on the distance of the wire 112 from current path 412 in the bulk conductor. Just as with return path 108, wire 122 may need to be sufficiently close (e.g., under 50 cm) to path 412.

In general, power control system 104 delivers current to the bulk medium 102 through electrodes (e.g., 116 and 118) and customized electric conductors (e.g., specialized wires or specialized cables) to form a closed circuit (see FIG. 1). These three components will be explained in further detail below.

Figure 6A:
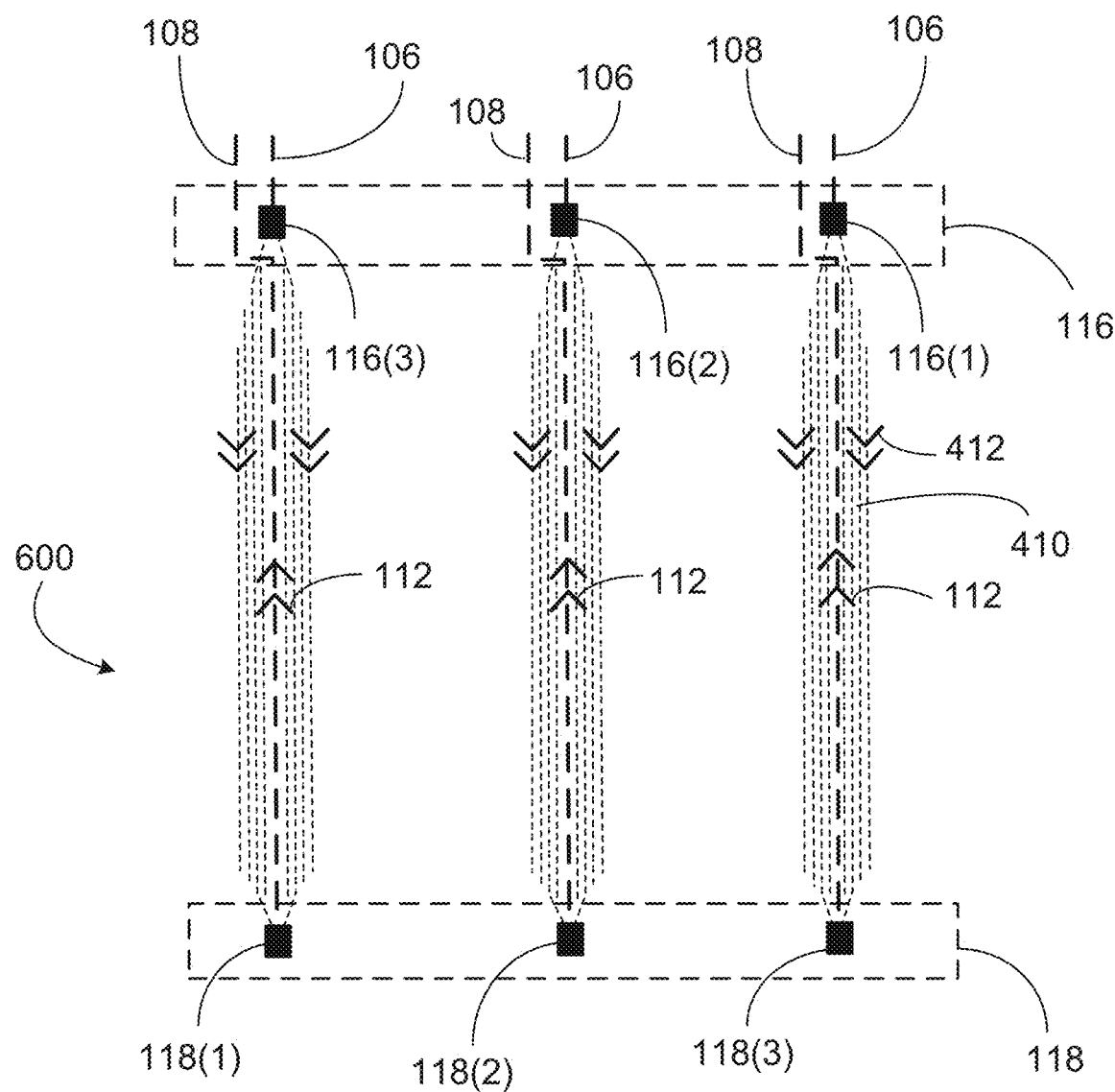
FIG. 6A is a schematic diagram of an exemplary setup for heating a bulk medium using an array of electrodes.

In some implementations, the electrodes 116 and 118 include an array of input and output electrodes, as shown in FIG. 6A. Electrode system 600 includes three input electrodes 116(1)-(3), forming electrode array 116, and three output electrodes 118(1)-(3), forming electrode array 118 and resulting in adjacent current paths 410 in the bulk medium. The proximity effect due to current 112 in return wires 108 constrains current density 410 in the bulk medium, as detailed above.

In general, various electrode geometries can be used in order to achieve desired heating in target areas of bulk medium 102. For example, referring to FIG. 6B, system 610 shows two electrode arrangements 116 and 118 used to apply a current through target area 102 of the bulk medium (with input/output wires 106 and 108). Electrode arrangement 116 and 118 can be arrays of one or more electrodes as shown in FIG. 6A. FIG. 6C-D are schematic diagrams of other electrode configurations, 620 and 630 respectively, to heat target area(s) 120, for example on an aircraft wing. Electrode arrangements indicated by 116, 118, and 640 can be single electrodes, or an array of one or more electrodes, as shown in FIG. 6A. Further details about the electrode shape and design is below.

In some implementations, the bulk medium is the skin of an airplane and target areas for heating include, but are not limited to, the following: wings, fuselage, vertical stabilizers, horizontal stabilizers, windows, winglets, windshield, control surfaces (flaps, ailerons, rudder, elevator, air brakes, etc.), nose/nose cone, landing gears, landing gear brakes, landing gear doors, engines and engine nacelles, AC inlets and outlets, fuel tank vents, pitot heads, static ports, and other antennae, sensors, and external lights, fuel tank vents, service panels. In other words, the proposed technology may involve placing electrodes on the inside of the airframe, in some cases, in one or more of the configurations shown in FIG. 6A-D. In some implementations, heating system 100 will produce Joule heating in portions of the target area, and subsequently conduction within the material may result in more "spread out" heating.

In general, power control system 104 includes a signal generating system that is designed to generate a high frequency (e.g., above 1 kHz) alternating electric signal (AC) and send it through the aforementioned target area 102 of the bulk medium. In some implementations, where the impedance of the target area is low (in some cases well below 1Ω), the signal generating system is configured to generate and sustain a desired current level, in order to generate Joule heating at the target area. In some cases, because the impedances of other parts of the system (e.g., the electric conductors or wires transmitting the signal) are above zero, a high current going through those parts would generate undesired Joule heating outside of the target area. For that reason, in some implementations, the signal generating system is designed such as a high current is only delivered close to the target area.

In some implementations, some or all of the signal generating system's elements/units, as well as the conducting units/cables connecting them, are designed such as to reduce as much as possible the undesired power losses typically occurring when transmitting high current and high frequency electromagnetic signals.

In some implementations, the signal generating system can receive power from existing power sources (e.g., existing electrical buses on an aircraft). In some implementations, the system uses a customized battery or a customized power source that is part of the system. For example, such customized power sources can include, but are not limited to: fuel-based electric generators, solar power-based electric generators, wind power-based electric generators, gas power based electric generators, etc. In some implementations, the signal generating system may be placed in a circuit between a power source (e.g., existing electrical bus, customized battery, customized power source) and the target area.

Additionally, in some implementations, the signal generating system can include control circuits and devices that exist as independent units and/or are embedded within a combination of other units that are part of the signal generating system.

In some implementations, heating system 100 is used to heat a number of distinct target areas. In such a case, each element or unit of the heating system (e.g., the signal transforming unit, the impedance adjusting network, etc.) can be either centralized for the entire system, or distributed as a distinct unit or more per target area or group of target areas. Centralization or distribution configurations can be used in order to improve system functionality, energy efficiency, cost, regulatory compliance, weight, size, and complexity, among other criteria. For example, in some implementations, the signal transforming unit is centralized, while the impedance adjusting network is distributed into one unit or more per target area. In some implementations, the signal transforming unit is only partially centralized with a centralized TSP ("Transformation to Standardized Power") sub-unit but with an ACG ("AC Generation") sub-unit distributed into one sub-unit or more per target area or group of target areas. In some implementations, the signal transforming unit is entirely distributed with each of its sub-units distributed into one sub-unit or more per target area, or group of target areas.

In some implementations, power control system 104 sends power to target area 102 in a continuous fashion until the heating/de-icing/anti-icing operation is complete. In some implementations, the system can turn the power on and off (e.g., using a control unit) in an improved/efficient manner, in order to achieve a desired heat generation and heat distribution in the conductive material 102. For example, while the system is on, heat is generated at specific locations of the target area, and is conducted across the target area, "spreading" to the rest of the target area. While the system is off, the generated heat continues to conduct within the target area.

In some implementations, the system could include different power levels for the on state, and cycle through the off state and different power levels in an improved fashion. In some implementations, specific power levels could be reached through a smoothed increase/decrease of power as opposed to a one-step power increments or decrements. Such pulsed power system patterns could either be entirely pre-scripted when the system is built, or could be varying and dynamically improved based on feedback loops forming part of the system's control unit, as detailed further below.

In some implementations, where the heating system includes several target areas, the pulsed power pattern described above can be used asynchronously across all target areas, such that all target areas will heat up in the desired amount of time, while maintaining both total average and total instantaneous power levels below a set threshold value. For example, for an aircraft de-icing system where both wings, the fuselage, and the horizontal and vertical stabilizers would be heated up, such a phased power pattern could be designed such that the system is turned on for only one target area at a time. In some implementations, a phased power pattern can be: powering on the system for the left wing, then the fuselage, then the right wing, then the vertical stabilizer, and then the horizontal stabilizer.

In some implementations, improved timing can be used at each stage in order to achieve the desired heat, average power, instantaneous power level, as well as an acceptable heat distribution. In some implementations, similar to the above pattern, any subset of the target areas can be heated at a given time.

In some implementations, one or more of the units or elements mentioned as part of the heating system design will have an enclosure. Such enclosure might be designed for a single unit or for any combination of units. In some implementations, the enclosures are designed in compliance with environmental qualification standards. For example, the enclosures can be designed in compliance criteria such as non-flammability, protection from precipitations, attachment and build providing protection from external shocks and vibrations, electrical insulation, protection from external electromagnetic interferences ("EMI") and shielding of the enclosed circuits' EMI emissions, and thermal relief.

In some implementations, some of the enclosures can be designed such as to use the structure of the heated object (e.g., bulk conductive material) as a heatsink. For example, one or more of the heating system's units can be housed in metallic or conductive structures that are mounted to have high thermal conductivity to the bulk medium on which it is located. One possible benefit of this mounting is both in heating the bulk medium while also providing necessary cooling for the electronics. Another possible advantage of this design is reducing the weight of the heating system (or device) by obviating the need to provide a separate heatsink to dissipate losses. In some implementations, the target areas can be used as a part of the heat system units' heatsinks. This use may increase efficiency of the heating system because the heating system's circuits inevitably generate heat losses that may be conducted to the target areas to heat them.

In some implementations, multiple adhesives or mounting types can be employed to mount an enclosure onto the bulk medium. For example, an adhesive primarily used for retaining mechanical rigidity can be used to hold the casing in place while a different adhesive (or interface) can be used to provide a lower thermal impedance path for the heatsinking function of the enclosure.

In some implementations, one or more of the heating system's units can be configured to detect one or more measurements including, but not limited to, voltage, current, temperature, power forward, and reflected power, measured on the unit's circuits, surrounding cables, other units, or the target areas. In some implementations, such measurements can then be used to monitor operational status of the unit(s) and control their operations (using a feedback mechanism), including on/off switching, output levels and in-circuit control of switching and tunable parts for improvement (more details on the control of switching and tunable parts within a dynamic adjusting network are found below). Controlled parameters can include power to load and/or current to load, voltage control in the adjusting network, and other relevant signals.

In some implementations, the measurements used as part of feedback loops described above can also include specific ice sensors that can be installed on or close to the target areas. Such sensors could be used, for example, to inform the heating system and/or the user on de-icing completion status, and used as an input to adjust power levels at the de-icing and anti-icing operation stages. In some implementations, ice sensors can also be used to determine failures within the system and/or servicing requirements.

In some implementations, the heating system can include a protocol converter control unit (or "control unit" or "control subunit"), taking input from the user (which may be the pilot or co-pilot in the case of an aircraft de-icing system) and/or the system's sensors, and outputting control signals to all other units. In some implementations, inputs from the user can include, but are not limited to, on/off state, de-icing/anti-icing/off state, target temperatures for target areas, and target power output for target areas. In some implementations, inputs from sensors can include, but are not limited to, voltage, current, temperature, power forward and reflected power, impedance, and data from ice sensors, the squat switch, various aircraft logics units, information from avionics, as well as other data. In some implementations, the protocol converter unit is centralized for the entire system. In some implementations, it is distributed with one protocol converter control unit per target area or group of target areas.

In some implementations, user input could be transmitted to the control unit either using wires (e.g., using data transfer standards such as ARINC 429) or wirelessly (for example using low-energy Bluetooth or Wi-Fi connections). In some implementations, the user's input device could either be integrated to the system being heated (for example integrated into the cockpit's on-screen controls for an aircraft de-icing system), or could be a separate device, such as a touchscreen tablet (for example a separate tablet installed in the cockpit, or a special application installed on the pilot's touchscreen tablet in the case of an aircraft de-icing system).

In some implementations, power control system 104 includes a signal transforming unit ("STU") or circuitry that alters the signal from the existing electrical buses or the customized battery or any other power source of the heating system into the desired high frequency AC waveform for generating current in the bulk medium. For example, in aircraft applications, the signal transforming unit can take DC power available from the airplane's electrical bus and convert into the desired high frequency AC signal. In another aircraft example, the signal transforming unit can take power available from the airplane's electrical bus in the form of an AC signal and convert into the desired high frequency AC signal. In some implementations, the signal transforming unit can take DC power available from a customized battery or from any customized power source (e.g., forming part of the heating system) and convert into the desired high frequency AC signal. In some implementations, customized batteries or power sources can be embedded within the same enclosure and/or circuit board as the signal transforming unit.

Figure 7:
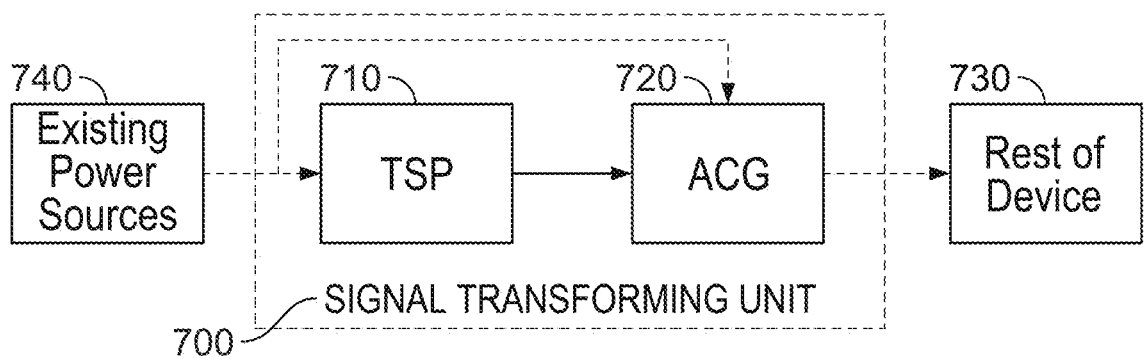
FIG. 7 is a schematic diagram of an exemplary signal transforming unit ("STU"), including Transformation to Standardized Power ("TSP") and AC Generation ("ACG") main sub-units.

FIG. 7 is a schematic diagram of an exemplary signal transforming unit ("STU") 700 for power control system 104, including transformation to standardized power ("TSP") 710 and AC generation ("ACG") 720 main sub-units, which precede other circuity 730 in the rest of device 100. Power control system 104 can draw power from existing power sources, as shown in FIG. 7.

Figure 8:
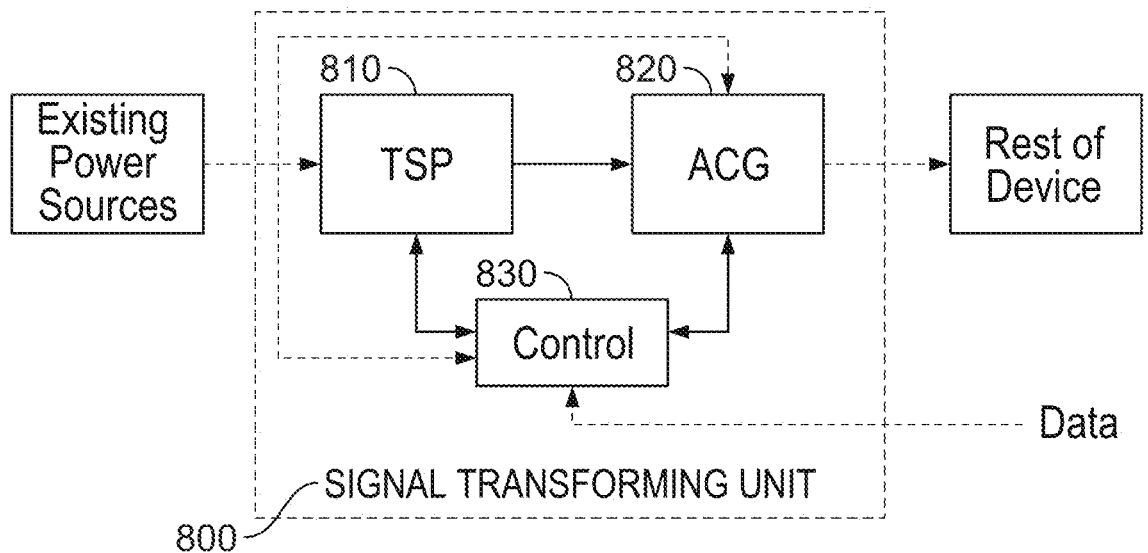
FIG. 8 is a schematic diagram of an exemplary a STU, including TSP, ACG, and control main sub-units.

FIG. 8 is a schematic diagram of an exemplary signal transforming unit ("STU") 800 for power control system 104, including a TSP 810, an ACG 820, and a control sub-unit 830.

In some implementations, the TSP draws power from existing power sources or the heating system's battery, and transforms it into a standardized input, such as a 250 VDC for improved operation of the ACG, as well as for improved power transfer efficiency of the signal transforming unit.

Figure 9A:
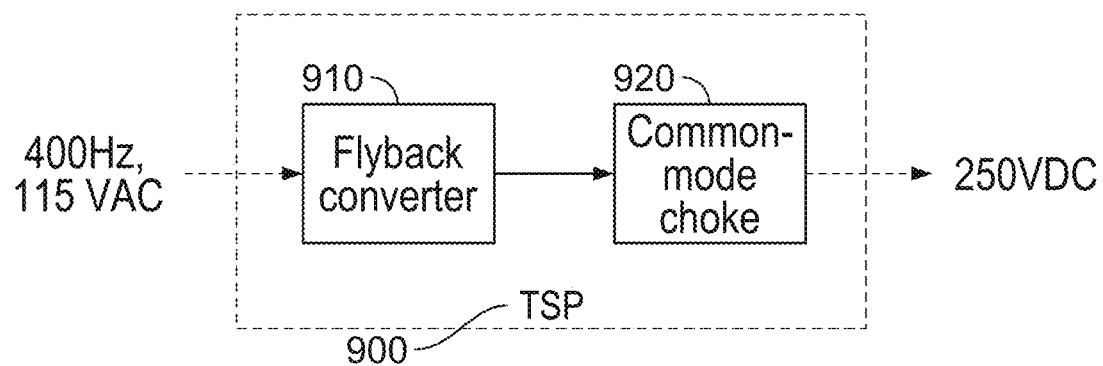
FIG. 9A is a schematic diagram of an exemplary TSP sub-unit, including a flyback converter and a common-mode choke.
Figure 9B:
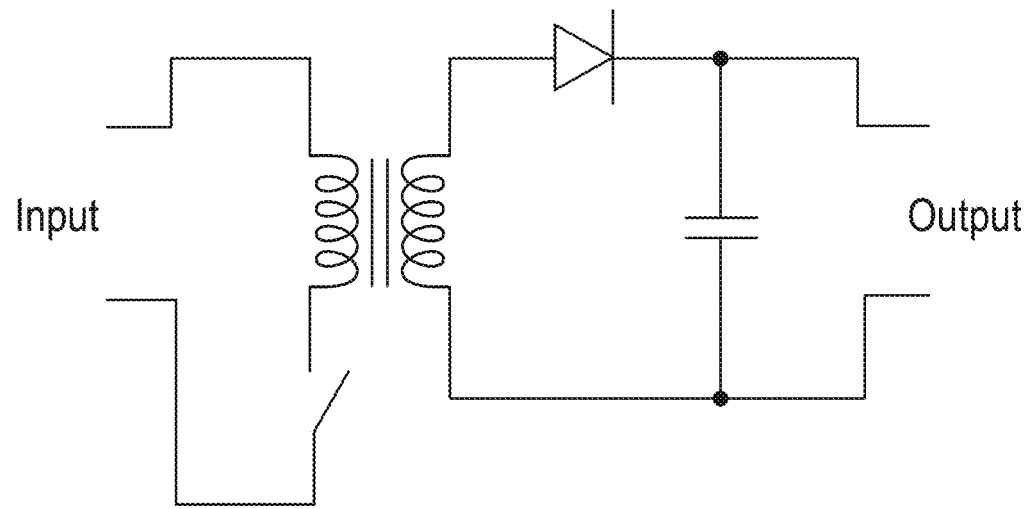
FIG. 9B is schematic diagram of an exemplary flyback converter.

In some implementations, where existing electrical buses provide power in the form of a 400 Hz, 115 VAC signal to the TSP, the TSP can include a flyback converter with a filter at its output, such as a common-mode choke, preventing electromagnetic interferences from reaching or damaging the ACG. FIG. 9A is a schematic diagram of an exemplary TSP sub-unit 900, including a flyback converter 910 and a common-mode choke 920. FIG. 9B is schematic diagram of an exemplary flyback converter 910.

In some implementations, the TSP is a bridge rectifier converting the AC power coming from existing power sources into any desired DC voltage. In some implementations, the TSP draws DC power from the battery or existing power sources (for example the typical 28 VDC in an aircraft) and transforms it into a different DC voltage or an AC voltage. For example, the DC-DC conversion may be useful to power control units and elements of the heating system, in which case possible voltage levels can include ±3.3 V, ±5 V and/or ±12 V. Finally, in some implementations, a power-factor correction ("PFC") stage can be included in the design of the TSP depending on the power supply source. In some implementations, the PFC may serve to correct for non-linear loading of the power supply which may be needed. Both active and passive PFC stages are possible.

In some implementations, the ACG uses input power from the TSP and transforms it into the desired high frequency AC signal. In some implementations, the ACG is designed for improved power transfer efficiency of the signal transforming unit. In some implementations, the ACG includes a power amplifier or an AC or RF generator or oscillator.

In some implementations, the primary power amplification stage of a power amplifier is either "linear" or "switching." Relevant trade-offs between these two architectures can include efficiency, power-handling, and linearity. Example linear amplifiers can include Class-A, Class-B, and Class-C. Example switching amplifiers can include Class-D, Class-E, and Class-F. In some implementations, linear amplifiers have high linearity and low efficiency as compared to switching amplifiers. Low efficiency may mean more difficult thermal management, higher-rated component requirements, etc. Low linearity may mean increased harmonic content potentially causing regulatory compliance issues, lower efficiency, more difficult physical and electrical layout design, etc.

Figure 10A:
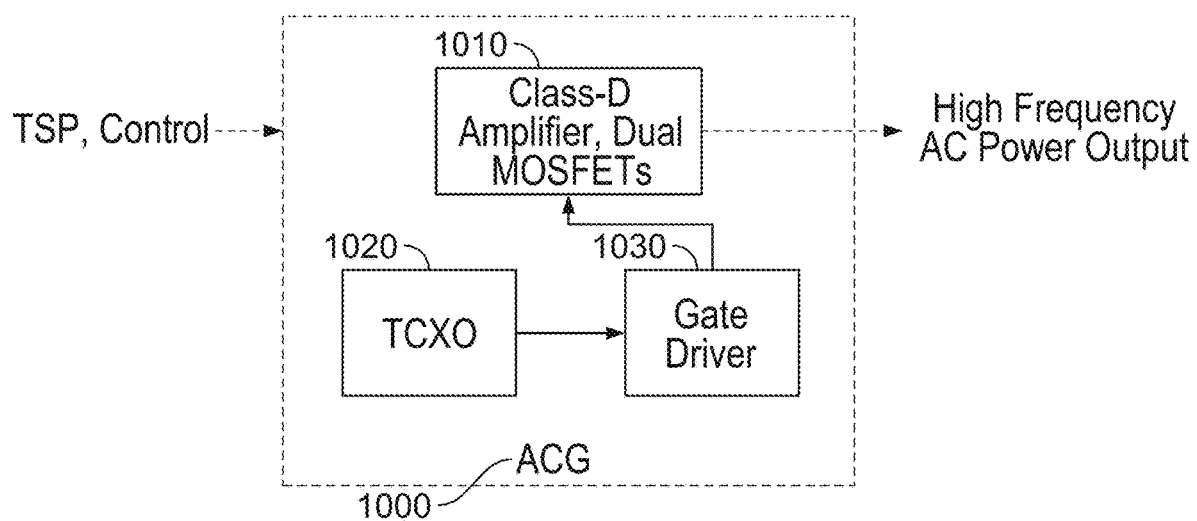
FIG. 10A is a schematic diagram of an exemplary ACG sub-unit, including a class-D amplifier with dual MOSFETs transistors, a temperature controlled quartz oscillator ("TCXO"), and a gate driver.
Figure 10B:
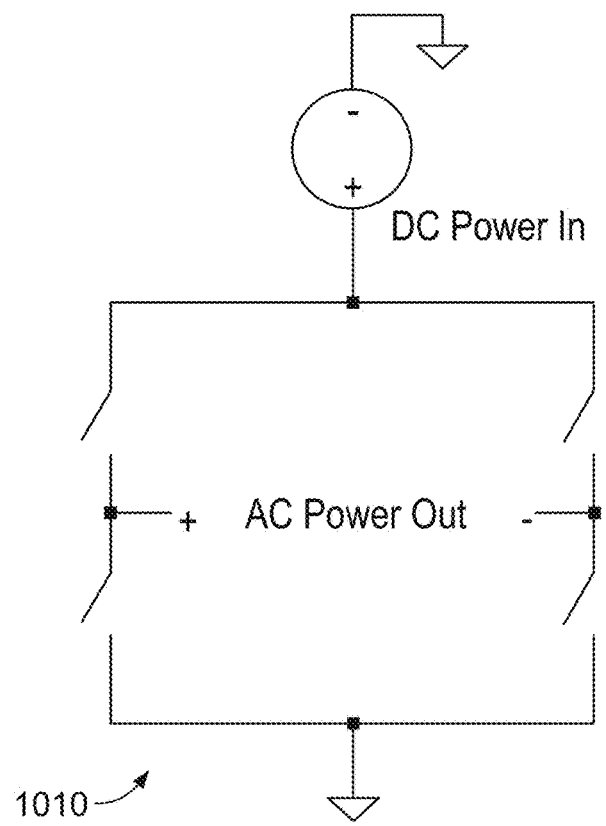
FIG. 10B is a schematic diagram of an exemplary Class-D switch-mode Amplifier.

In some implementations, the ACG includes a full-bridge class-D amplifier. For example, the amplifier design utilizes dual MOSFET transistors fed with a gate driver and a temperature compensated crystal oscillator ("TCXO") generating a desired frequency. FIG. 10A is a schematic diagram of an exemplary ACG sub-unit 1000, including a class-D amplifier 1010 with dual MOSFETs transistors, a temperature controlled quartz oscillator ("TCXO") 1020, and a Gate driver 1030. FIG. 10B is a theoretical schematic diagram of an exemplary Class-D Amplifier using dual MOSFETs. In some implementations, the full-bridge architecture can provide differential (balanced) drive capability as well as four-times the power output for a given bus voltage level under a given load compared to a half-bridge architecture. Differential drive may also be relevant for emissions compliance under balanced loading conditions presented by the expected wing structure. Additionally, in some implementations, Class-D architectures can have a higher switch utilization factor than other switching architectures.

In some implementations, within the Class-D architecture under single-frequency drive, many input parameters can be varied to achieve improved output parameters. An example input parameter includes dead-time. Example output parameters include efficiency, peak component stresses, etc.

In some implementations, class-D architectures can have a high switch utilization factor and complete silicon-based component implementations, making them suitable for potential ASIC development. In such developments, a SoC (system-on-a-chip) implementation is possible where all control components and power electronics reside on either the same die or a MCP (multi-chip package). In some implementations, a class-D architecture has distributed modules housing SoCs and supporting circuitry attached to various, distributed locations on a given feature of an aircraft.

In other implementations, other switch-mode designs are utilized, such as single-switch architectures, e.g. Class-E or Class-F. In some implementations, such architectures may have higher switching frequency implementations where a high-side gate driver may be either difficult or impractical. In some implementations, single-switch architectures can be used instead of Class-D implementations as frequency increases due to potential limitations of Class-D implementations at those frequencies.

In some implementations, harmonic reduction and harmonic elimination techniques can be employed with switch-mode amplifiers to mitigate any negative effects from non-linear distortion inherent in some switching architectures. For example, changing the base waveform duty-cycle, blanking pulses, and other techniques can be used to remove harmonics during signal generation.

In some implementations, the ACG includes transistors including Silicon MOSFETs. In some implementations, the transistors are Gallium Nitride (GaN) MOSFETs. In certain implementations, GaN transistors have advantageous properties such as: on-resistance, turn-on gate charge, and reverse-recovery charge. In some implementations, GaN is suitable for higher frequencies.

Figure 10C:
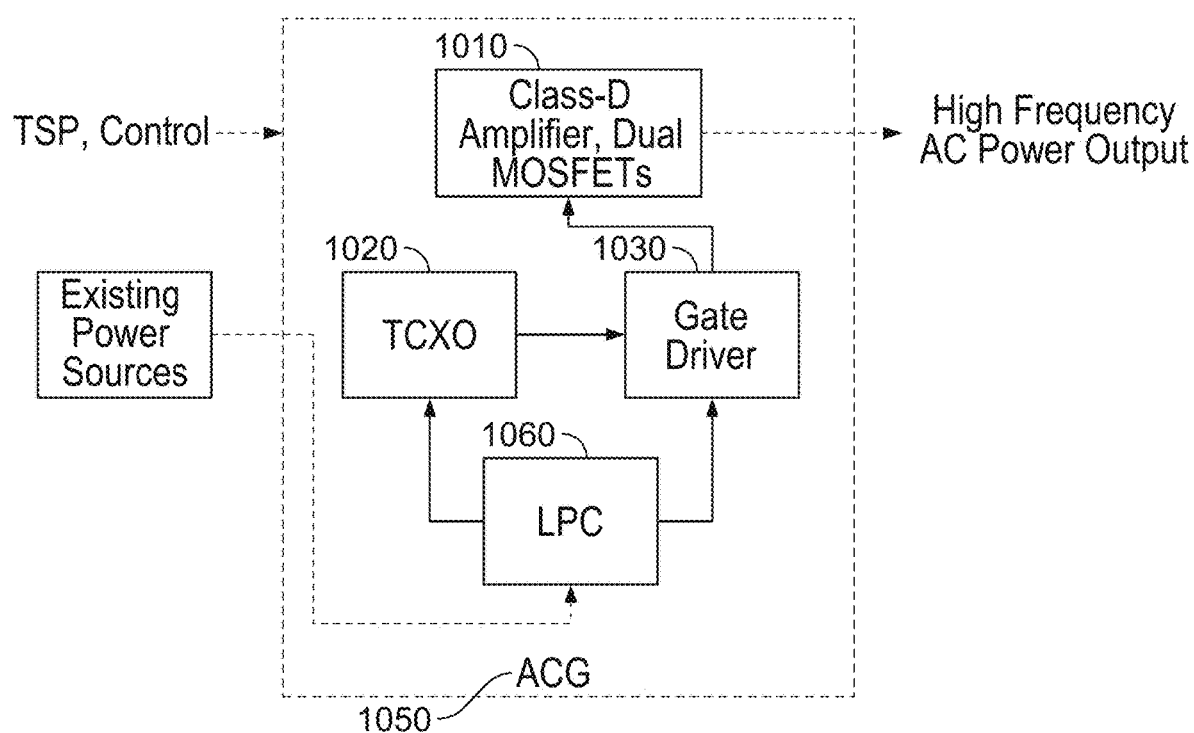
FIG. 10C is a schematic diagram of an exemplary ACG sub-unit, including a class-D amplifier with dual MOSFETs transistors, a TCXO, a Gate driver, and a Low Power Conversion stage ("LPC").

In some implementations, the TSP additionally includes a low power conversion ("LPC") stage, such as a linear regulator, to draw power from the existing power sources and convert it into a suitable power input signal for the elements driving the ACG, such as gate drivers or crystal oscillators. FIG. 10C is a schematic diagram of an exemplary ACG sub-unit 1050, including a class-D amplifier 1010 with dual MOSFETs transistors, a temperature controlled quartz oscillator ("TCXO") 1020, a Gate driver 1030, and an LPC 1050.

In some implementations, the AC Generation Sub-unit is located close to the target area. A possible advantage of this design is in limiting the losses and emissions that happen when carrying alternating currents from the AC Generation sub-unit through the adjusting network to the target area. In some implementations, the TSP sub-unit can be located close to the AC Generation unit or close to the existing power source or customized battery. When the TSP is closer to the ACG, it can be integrated with the ACG, potentially reducing the number of modules in the system and its complexity. When the TSP is closer to the existing power source or customized battery, it may be designed for improved power transfer (including for increased efficiency and reduced EMI) from the power source or battery to the ACG. For example, when the existing power source provides power in the form of a 400 Hz, 115 VAC voltage, the TSP can include an AC-DC converter, converting the power source voltage into 250 VDC, thus reducing EMI that would be caused by the AC current, and increasing efficiency by increasing the voltage and reducing the current carried from the TSP to the ACG.

Figure 11:
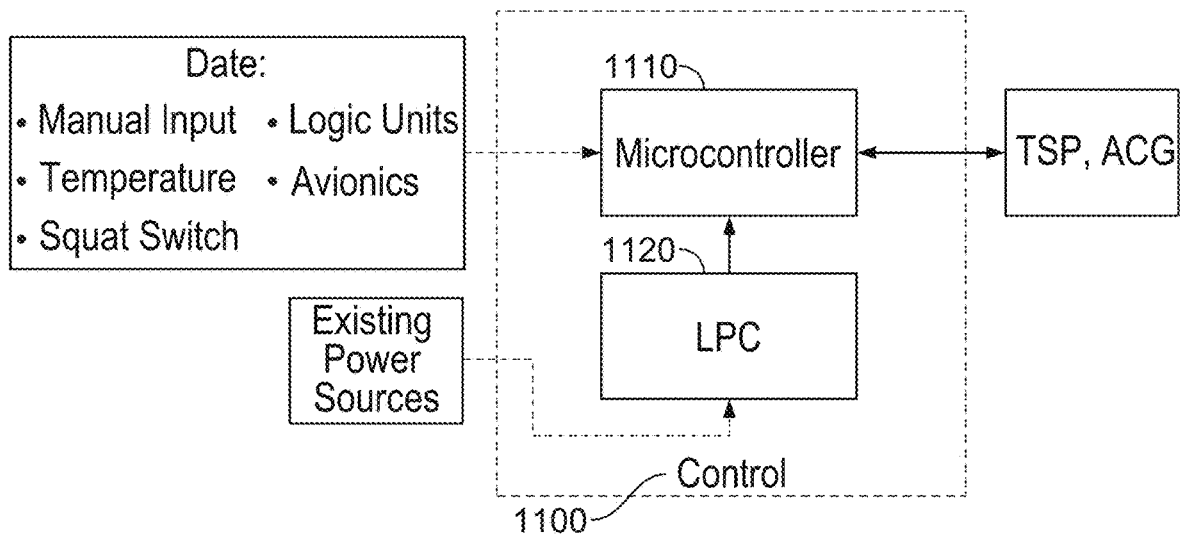
FIG. 11 is a schematic diagram of an exemplary control sub-unit, including a microcontroller and a LPC.

In some implementations, the control sub-unit controls the signal transforming unit's status, including on/off mode, power output, frequency, and other parameters, based on relevant data inputs available in the application for which the device (heating system) is developed, and by outputting control signals to other signal transforming sub-units, including the TSP as well as the ACG's drivers. In the example of a de-icing and anti-icing heating system for aircraft, in some implementations, data inputs can include manual pilot input from a cockpit switch, temperature from temperature sensors inside and outside of the airframe, weight-on-wheels status from a squat switch, various aircraft logics units, information from avionics, feedback information from the device (heating system) itself, as well as other data. In some implementations, a control sub-unit includes a microcontroller supervisor fed with low power conversion (LPC) stage, such as a linear regulator, drawing power from the existing power sources and converting it into a suitable power input signal, and outputting control signals to the TSP and the ACG. FIG. 11 is a schematic diagram of an exemplary control sub-unit 1100, including a microcontroller 1110 and a Low Power Conversion stage (LPC) 1120.

In some implementations, for example, in the case of a de-icing heating system retrofitted to an aircraft, the signal transforming unit can be installed close to the available electrical buses, in a centralized location. This may reduce installation complexity, labor time, and costs for the unit. In some implementations, the signal transforming unit is decentralized and installed closer to the target areas. This may reduce the length over which the AC signal has to travel between a signal transforming unit and the target areas, potentially decreasing costs associated with electromagnetic interferences ("EMI") shielding of the signal and with the cable requirements to carry such AC signal.

In some implementations, the heating system has an impedance adjusting network ("IAN") configured to adjust the output impedance of the heating system to desired levels. For example, an IAN can be configured to adjust the output impedance of the heating system to correspond to the input impedance of the bulk medium to be heated. For example, an IAN can be configured to adjust the impedances between the output of the heating system and the input of the bulk medium to be within a desired range of one another. In some implementations, the impedance adjusting network is configured to adjust the output impedance of the heating system to sufficiently match the impedance of the bulk medium. In other words, the matching network is configured to match the output impedance of the STU ("source") to the impedance of the target areas ("load") within reasonable engineering tolerances. In some implementations, matching the source and load impedances includes adjusting the source impedance of the heating system to be a complex conjugate of the impedance of the bulk medium. In some implementations, the impedance adjusting network is adjusted such that an output impedance of the heating system is within 10 to 30% of the impedance of the bulk medium to be heated.

Figure 12:
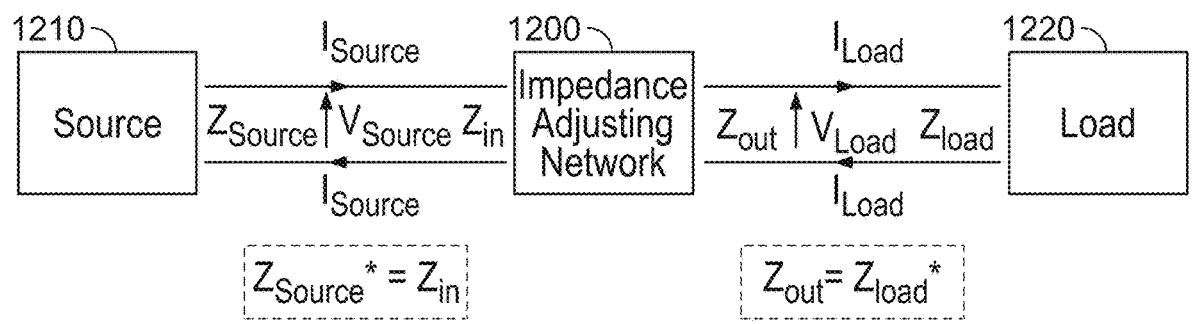
FIG. 12 is a diagram of an impedance adjusting network between a source and a load.
Figure 13A:
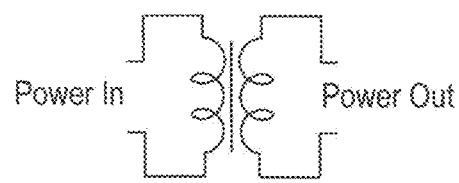
FIGS. 13A-D are schematic diagrams of exemplary impedance adjusting network building blocks.
Figure 13B:
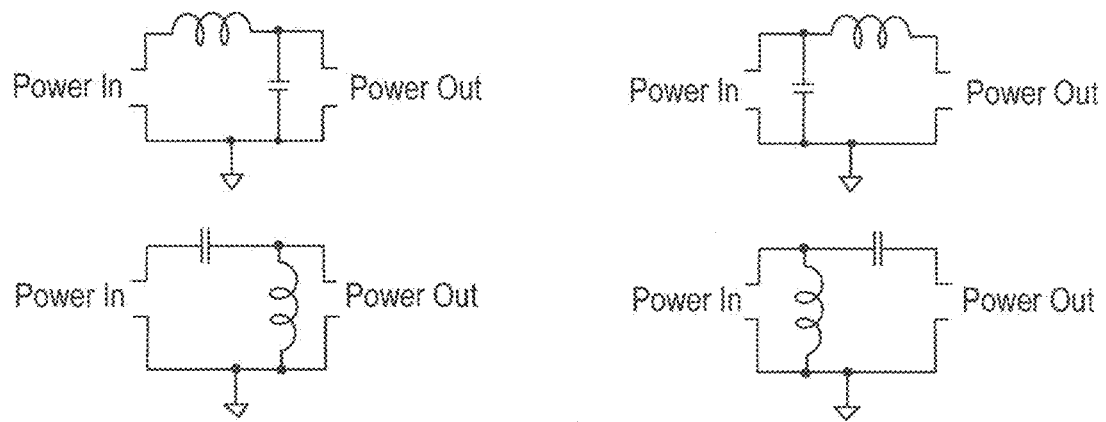
Figure 13C:
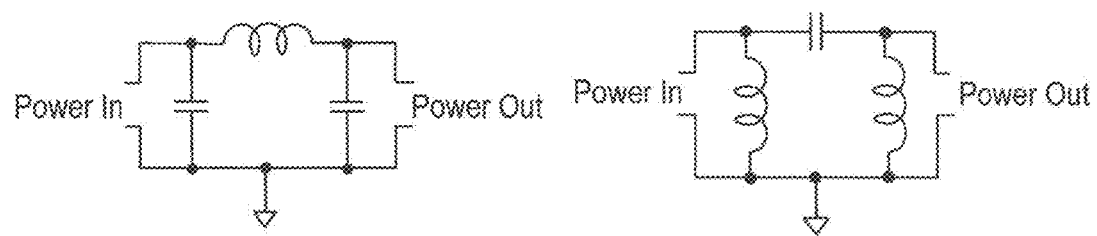
Figure 13D:
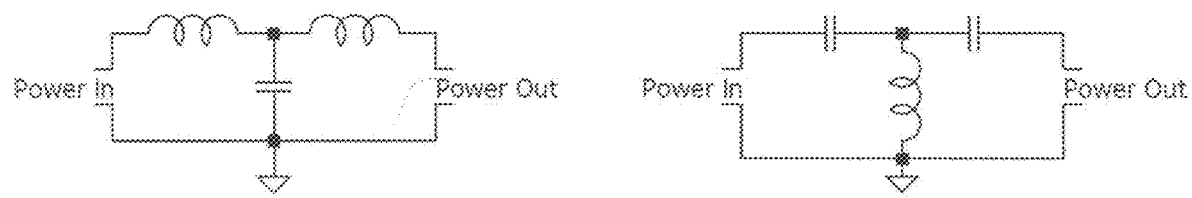

FIG. 12 is a conceptual diagram of an adjusting network 1200 between a source 1210 and a load 1220. FIG. 12 shows the adjusting network taking input power from the STU ("source") through an input port impedance-adjusted to the STU's output, and outputs power to target areas ("load") through an output port that is impedance-adjusted to correspond to the target areas.

In general, with an AC signal, when the output impedance of a source does not correspond to the impedance of load, part of the signal sent from the source to the load reflects back to the source instead of travelling through the load. In some implementations, an impedance adjusting network may achieve several benefits by inhibiting signal reflection and voltage standing wave build-up, including:

Reducing voltage across the heating and arcing risks
Improving efficiency of the heating system
Reducing the total output power required from the STU, hence reducing the STU's size, weight and cost
Reducing stress on system components
Improving reliability
Reducing temperature gradients in cabling and bulk medium In some implementations, the output impedance of the STU is higher than the impedance of the target areas. In that case, the adjusting network converts relatively high voltage and low current power from the STU into relatively low voltage and high current power delivered to target areas. In implementations, this means high current is only delivered after the adjusting network and thus closer to the target, reducing Joule losses in the rest of the SGU and improving the heating system's overall efficiency.

In various implementations, the adjusting network can either be centralized or distributed throughout the target areas. Distributing the adjusting network may allow cabling to serve as a filter while potentially lowering peak voltage, peak current, and/or temperature effects on any given component. Distribution may also add modularity to the system design, which may improve part serviceability/replacement. In addition, distribution potentially allows the system to avoid sensitive equipment and/or hazardous areas, e.g. fuel tanks.

Additionally, in some implementations, the adjusting network can be balanced by including additional capacitive components and grounding middle points of symmetry in the network. When driven by a fully differential source, balancing the network may allow for high common-mode rejection and greater noise immunity. In some implementations, no such balance is achieved and the adjusting network's return path end at the circuit's ground.

Generally, in some implementations, adjusting networks can include passive electronic components arranged in specific building block configurations. For example, those building block configurations can include transformers, L-networks, it-networks, T-networks, and other configurations. FIGS. 13A-D are schematic diagrams of exemplary impedance adjusting network building blocks.

Figure 14:
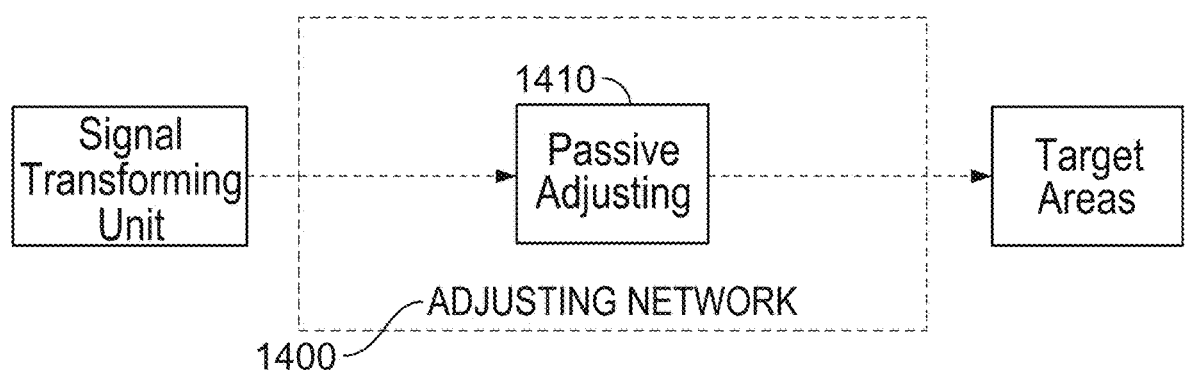
FIG. 14 is a schematic diagram of an exemplary adjusting network unit, including a passive adjusting sub-unit.

In some implementations, the heating system's adjusting network includes a passive adjusting sub-unit. FIG. 14 is a schematic diagram of an exemplary adjusting network unit 1400, including a passive adjusting sub-unit 1410. In some implementations, the passive adjusting sub-unit can include one or more of the building block configurations mentioned above, as well as other configurations, assembled together. In some implementations, the passive adjusting sub-unit's passive electronic components are chosen with high quality factors, such as to improve the network's efficiency.

In some implementations, the heating system's adjusting network can be designed to have a high-quality factor (high-Q) or low-quality factor (low-Q). High-Q adjusting networks can be used to filter out harmonic signal content. Filtering may be advantageous in a switching amplifier design as harmonic content may be higher than for a linear amplifier. High-Q networks, however, may be more sensitive to part tolerances, operational variations in external conditions, assembly variations, and any other variation in the system. Thus, high-Q systems may present practical problems while implementing systems. For example, in the case of an aircraft wing de-icing system, if the system is High-Q, the impedance adjusting network could become very out of tune due to small preturbations (e.g. a flap movement) causing failure risk. Lowering harmonic content outside the fundamental drive frequency may be advantageous for regulatory certification as well as practical design concerns, including containing stray signals within a design, over-stressing components (either in peak or time-average ratings), control algorithm instabilities, etc. In some cases, it is possible to ease or even eliminate these sensitivity concerns through the use of dynamic tuning elements.

In some implementations, the heating system's adjusting network design can be based on transmission line adjusting concepts. For example, the cabling at the input and/or output of the adjusting network can be viewed as part of the adjusting network. In some implementations, by choosing the right cable materials, form factor, dimensions and length, an appropriate impedance adjustment can be achieved.

Figure 15A:
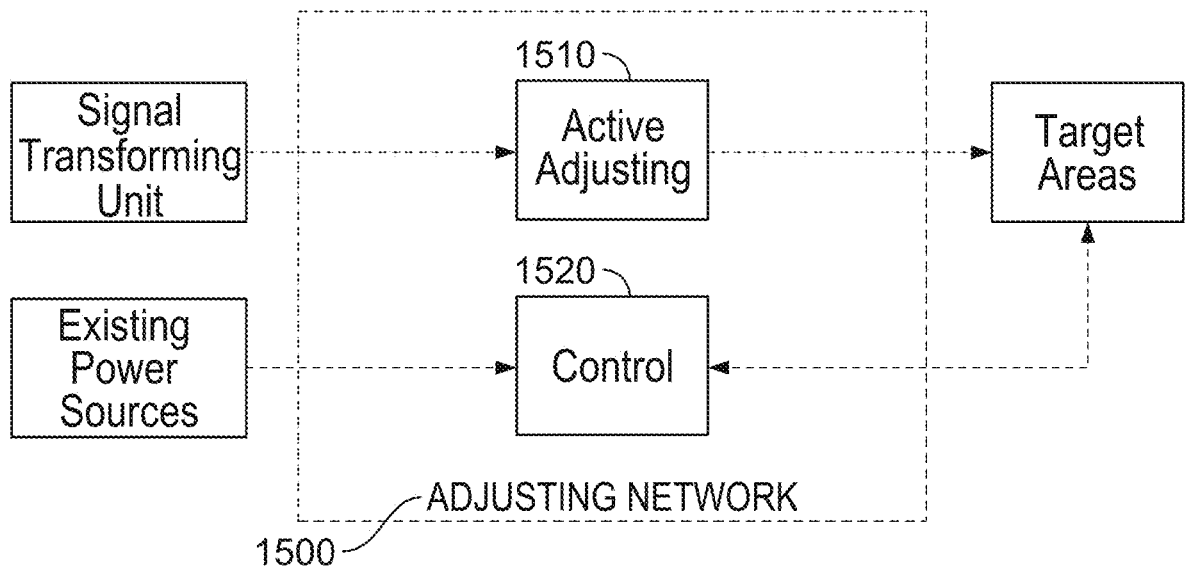
FIG. 15A is a schematic diagram of an exemplary adjusting network unit, including an active adjusting sub-unit and a control sub-unit.

In some implementations, the heating system's adjusting network is a dynamic adjusting network including an active adjusting sub-unit and a control sub-unit. FIG. 15A is a schematic diagram of an exemplary adjusting network unit 1500, including an active adjusting sub-unit 1510 and a control sub-unit 1520. In some implementations, the active adjusting sub-unit includes one or more adjusting network configurations controlled by the control sub-unit. In some implementations, the active adjusting network sub-unit's passive electronic components are chosen with high quality factors, such as to improve the network's efficiency. In some implementations, the control sub-unit, receives input data from the signal sent to and coming from the target areas (such as forward power, reflected power or voltage standing wave ratio), and dynamically controls the active adjusting network sub-unit to adjust the impedance tuning in real time. For example, such control can be achieved through tuning elements included in the design of the active adjusting network sub-unit. For instance, dynamic tuning elements can include tunable capacitors and/or tunable inductors. In addition, tunable element examples include: PIN Diodes, BST capacitors, DTC (discrete tuning capacitors), varactor diodes, MEMS, Ferroelectric varactors, Ferromagnetic components, YIG-tuned filters, etc. Exemplary metrics that can be considered while evaluating such devices include: operating frequency range, tuning DC voltage, tuning control signal linearity, control complexity, capacitance/inductance tuning ratio, tuning speed, quality factor (Q), switching lifetime, packaging cost, power handling, power consumption, breakdown voltage, linearity, third order intercept (IP3), integration capability, etc.

Figure 15B:
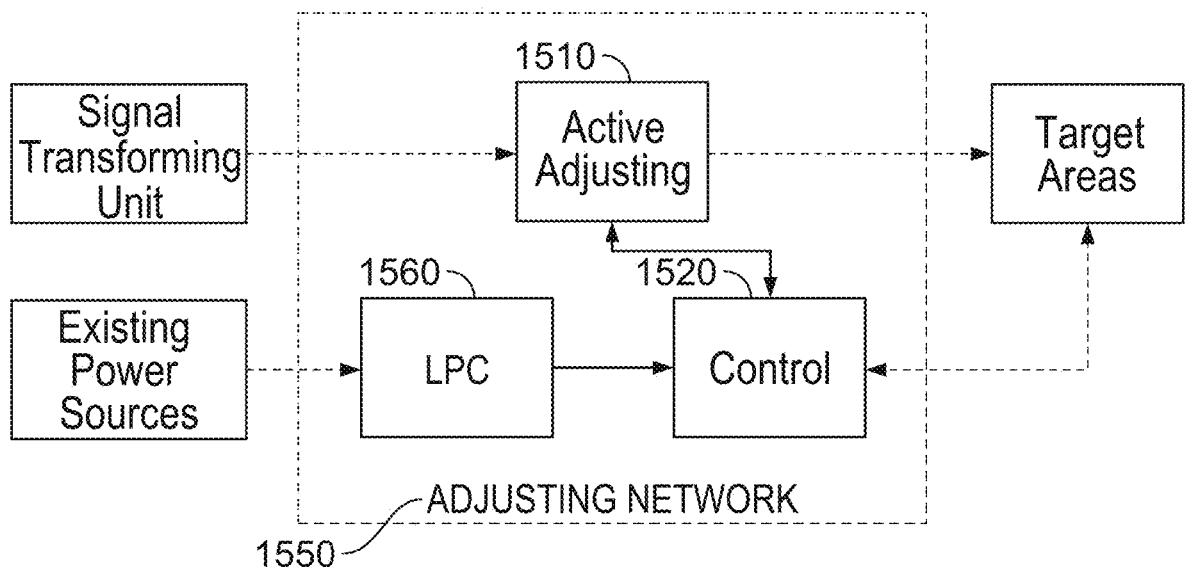
FIG. 15B is a schematic diagram of an exemplary adjusting network unit, including an active adjusting sub-unit, a LPC, and a control sub-unit.

In some implementations, the use of a control unit with feedback between the target areas and the adjusting network can allow the network to adapt to any external changes that might impact the target area impedance or the STU output impedance, including changes in temperature, geometric configuration of the target areas, location of the heating system, the environment surrounding the system and target areas, and other parameters. In some implementations, the adjusting network additionally includes a Low Power Conversion ("LPC") stage, such as a linear regulator, drawing power from the existing power sources and converting it into a suitable power input signal for the control sub-unit. FIG. 15B is a schematic diagram of an exemplary adjusting network unit 1550, including an active adjusting sub-unit 1510, a low power conversion stage ("LPC") 1560, and a control sub-unit 1520.

In some implementations, specialized impedance measurements can be performed on the target areas for all configurations and environmental conditions covering the spectrum of possible situations during use of the heating system. Those measurements may allow for the design of a dynamic adjusting network unit adapted to the narrowest impedance range that allows for an adequate impedance adjustment in the entire spectrum of situations mentioned above. In some implementations, such design is accomplished by use of algorithmic optimizations or computer simulations to increase the system's efficiency while decreasing the adjusting network's weight, complexity and cost.

Figure 16:
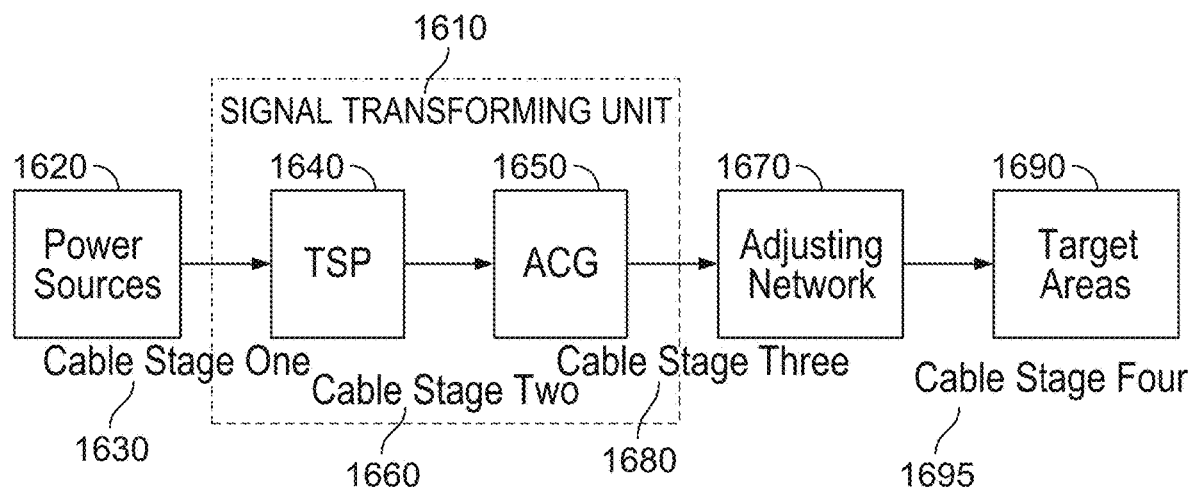
FIG. 16 is a schematic diagram of cable stages in an exemplary heating system.

In some implementations, specialized cables can be used in the heating system, specifically designed or chosen at each stage for improving efficiency and shielding the power signal being carried to the target areas. FIG. 16 is a schematic diagram of cable stages in an exemplary heating system. In various implementations, stages of cables in the heating system can be customized, including cables between the power sources 1620 and the STU 1610 (Cable Stage One 1630), cables in the STU between the TSP 1640 and the ACG 1650 sub-units (Cable Stage Two 1660), cables between the STU 1610 and the adjusting network 1670 (Cable Stage Three 1680), as well as cables between the adjusting network 1670 and the target areas 1690 (Cable Stage Four 1695).

In general, various design considerations may be relevant in designing specialized cables throughout the heating system. In some implementations, thermal considerations may be relevant. For example, in some implementations, the cable connecting the adjusting network to the target area (or running near the target area and returning to the adjusting network in some cases) is fastened to allow for increased thermal flow from the cable to the target area. This is advantageous if some of the heat generated as current runs through the cables (which would otherwise be lost) is recovered and transferring to the target area, where the intent is to generate heat, improving the efficiency of the system.

In some implementations, the cables can be routed near the target area by using fasteners. To improve thermal contact in such cases, thermal interface materials with improved thermal conductivity can be used to fill air gaps in between the cable-fastener-target area interface.

In some implementations, cables are directly attached to the target area. To improve thermal contact in such cases, an adhesive with higher thermal conductivity can be used to attach the cable to the contact area. Additionally, thermal interface materials with higher thermal conductivity can be used to fill some or all of the remaining air gaps existing between the cable and the target area.

In some implementations, cross-sections of different geometries as well as different cable form factors can be used, depending on the units, target areas or power sources that the cables connect. In some implementations, the cable only includes a main conductor, with or without a protective jacket (including for electrical insulation and/or environmental protection, e.g. corrosion, humidity, extreme temperatures, frictions). This configuration may be advantageous for parts of the system that would carry a DC signal, or that would deliver a signal to the target area.

In some implementations, the cable is a coaxial cable. The coaxial cable can include a shield which may reduce EMI emissions when carrying an AC signal, and may protect against EMI surrounding the system when carrying any signal.

In some implementations, the cable is a triaxial cable. This design may be beneficial for EMI protection and insulation when carrying any signal, and more particularly when carrying balanced signal, for example at the output of a balanced embodiment of an adjusting network unit.

In some implementations, the cable is a twinaxial cable. This design may have benefits that are similar to the ones provided by a triaxial cable.

In some implementations, different cable cross-section geometries can be used, depending on the units, target areas or power sources that the cables connect.

In some implementations, the cross section of the cable's conductor(s) has a circular geometry. This design has the benefit of being relatively low-cost to manufacture (low non-recurring engineering costs) in the case of a coaxial/triaxial/twinaxial form factor.

In some implementations, the cross section of the cable is flat and/or rectangular. For example, this cross-section may be an advantageous cable geometry for the last stage of the system where the cable delivers current to the target area. At that stage, a rectangular shape may allow for lower impact of the proximity and skin effects on currents circulating within the cable, hence reducing losses and increasing the system's efficiency. Additionally, that geometry may reduce the total amount of conductive material needed in the cable, hence reducing the weight of the system, which is an important consideration in the case of an aircraft deicing system.

In some implementations, depending on the specific input and output currents and signals carried by the cable, as well as depending on its cross-section geometry and other factors, the size of the cross-section can be selected to limit operating temperatures to a specified range (e.g., for compliance and depending on the materials used to manufacture the cable), as well as to reduce its weight and size.

In some implementations, different cable shielding types (and cross-section geometries) will be used depending on the units, target areas or power sources that the cables connect.

In some implementations, the cable won't include any shielding. This is more likely to be the advantageous at stages where DC current is carried (hence with lower EMI suppression requirements), and where a return path doesn't need to be carried (for example at the later stage of the system in an embodiment where the target area carries the return current, and a nearby cable feeds the target area with that current).

In some implementations, single shielding will be used. This is advantageous, for example, where one layer of shielding is sufficient in getting the cable to comply with EMI/EMC requirements as well as other environmental requirements.

In some implementations, double shielding will be used. This adds another layer of shielding which, for example, may reduce EMI emissions further, and reduce the cable's EMI susceptibility.

In some implementations, triple or more shielding will be used. This adds additional layers of shielding for reasons similar to the ones above.

In some implementations, for a given target area, cables delivering current to this area might follow different possible paths.

In some implementations, the cables simply follow roughly straight paths from one side of the target area to another. In some cases, these paths could be parallel. In some implementations, cables might run through the target area diagonally, crossing each other at various locations over the target area. This could for example help generate more uniform heat across the surface of the target area and generate relatively hotter spots at desired locations where the cables cross.

In some implementations, cables run a zigzag-type path, a serpentine path, or a path than can be modelled by 2D spline curves. This design may increase the system's effectivity by lengthening the path followed by currents running through the target area, hence increasing its effective resistance further. This, for example, may help achieve higher efficiency, lower current, and more stable impedance adjusting with the system.

In some implementations, cable path designs are based on a combination of the options listed above, as well as others.

In some implementations, depending on the cable's design, stage and purpose, different materials might be used in its making.

Depending on local voltage, current, temperature, power, bend radius and durability requirements, as well as other criteria, the cables' conductor materials may be chosen to improve efficiency, electrical conductivity, weight, cost, size, and thermal aspects.

In some implementations, the conductor material is made of copper, silver, aluminum, carbon fiber composite, titanium, or an alloy thereof. In some implementations, the conductor is made of any of the materials mentioned previously, and coated with other materials, for example a silver coating to improve the conductivity of the conductor's skin.

In some implementations, conductors might be made of solid materials, or stranded. For example, in some implementations, strands could each be insulated from each other by using an insulating coating such as enamel. For example, a Litz wire could be used to reduce the impact of skin and proximity effects within the cable.

In some implementations (e.g., for coaxial/triaxial/twinaxial cables), depending on local voltage, current, temperature, power, bend radius and durability requirements, as well as other criteria, the cables' dielectric materials may be chosen to increase efficiency (for example by reducing dielectric losses), weight, cost, flexibility, maximum voltage tolerance, maximum power tolerance, temperature rating (by tolerating higher temperatures and/or having a higher heat capacity and/or lower dielectric losses and/or better heat conduction out of the cable).

In some implementations, where transmission line adjusting is used in the adjusting network unit, relevant cables can use dielectric materials also chosen to reach desired impedance levels. Exemplary materials include polyethylene and teflon-based materials, as well as other materials.

In some implementations, depending on local voltage, current, temperature, power, bend radius and durability requirements, as well as other criteria, the cables' jacket materials will be chosen to improve parameters such as weight, cost, flexibility, maximum voltage tolerance, temperature rating, and heat conduction to nearby heatsinks (for example to the target area when it is used as a heatsink).

In some implementations, in the case where transmission line adjusting is used as part of the adjusting network, the length of the cable used for impedance adjusting can be controlled, in addition to its dielectric, in order to reach a targeted impedance level. For example, the cable delivering current to the target area is used as part of a transmission line adjusting system, and extra length is added for impedance adjusting and locally coiled to occupy a smaller amount of space.

In some implementations, specific fastening techniques can be used to route the cables through the system's structure. Such techniques may be chosen to improve installation cost and time, system weight (by reducing length of wire needed and weight of fastening technique), as well as for improved desired electromagnetic effects and heat transfer for cables close to the target area.

In some implementations, the fastener is chosen to reduce the distance between the cable delivering power to the target area and the target area. This design may generate the proximity effect in a more intense manner. In some implementations, conventional cable fastener designs can be chosen for a low cable-target area distance.

In some implementations, the fasteners will also be used to increase heat conduction from the cables to the target area.

In some implementations, fastener materials are chosen for lower weight and cost of the system. This can be achieved by using composite materials, for example. In some implementations, where fasteners are also used to conduct heat to the target area, materials will also be chosen for increased thermal conductivity (metallic materials, for example, typically have a relatively high thermal conductivity).

In some implementations, adhesives used to attach fasteners to their bonding areas are chosen for increasing strength and ensuring long-term bonding to the target area. The strength of the adhesive is advantageous in the case where the bonding area is relatively small and where mechanical constraints created on the bonding area are relatively strong. Additionally, in some implementations where the fasteners are used to conduct heat from the cable to a target area, the adhesive is also chosen for increased thermal conductivity.

Finally, in some implementations where the fasteners are used to conduct heat from the cable to a target area, air gaps in area between the cable, the fasteners, and the target area are filled using a thermal interface material that is sufficiently thermally conductive to ensure improved flow of heat from the cable to the target area.

In some implementations, cables are directly attached to surrounding structures such as the bulk medium using an adhesive, allowing for better heat transfer from the cable to the structure to which it is attached. Adhesives are selected based on criteria similar to the criteria used for fasteners.

In some implementations, cable assembly designs include splitting of a given cable path into a set of two or more separate branches. This is for example useful in implementations where one adjusting network sends current to a set of several target areas. In such implementations, one cable could be the sole output of the adjusting network, and as it routes to the target areas, the cable can split into separate branches that each deliver currents to the target areas. In some implementations, such splitting can be achieved by splitting a given conductor strand into several smaller ones, by sending a subset of strands to each of the separate branches when the split cable has a stranded conductor, or by the use of a power divider. The power divider can useful for controlling the amount of current, voltage and power going to each of the branches that the cable is split into.

Similarly, in some implementations, two or more cables can merge into a fewer number of cables that accumulate the signals coming from all the merged cables. Such merging can be achieved by merging given conductor strands into other ones, by re-grouping different subsets of strands into new stranded cables, or by the use of a power combiner (e.g., same device as a power divider, but used backwards). The power combiner can be useful for controlling the amount of current, voltage and power going to each of the branches that the cables are merged into.

In some implementations, each cable stage in the heating system has unique cable design considerations.

In some implementations, Cable Stage One is chosen to allow for the efficient power transfer from the power sources to the TSP sub-unit. In some implementations, where the power sources output DC electrical current, Cable Stage One includes stranded copper insulated with an adapted material, and of a total equivalent gauge suited for the power, voltage and current carried to the TSP sub-unit. In some implementations, where the power sources output a 400 Hz, 115 VAC signal, Cable Stage One includes stranded and twisted copper, insulated with an adapted material, and of a total equivalent gauge suited for the power, voltage and current carried to the TSP sub-unit.

In some implementations, Cable Stage Two is chosen to allow for the efficient power transfer from the TSP to the ACG sub-units. In some implementations, where the TSP outputs power in the form of a 250 VDC signal, Cable Stage Two includes stranded copper insulated with an adapted material, and of a total equivalent gauge suited for the power, voltage and current carried to the TSP sub-unit.

In some implementations, Cable Stage Three is chosen and customized to allow for the efficient transfer of the high frequency AC power signal from the STU's output to the adjusting network. For example, this cable may be designed to reduce resistive and electromagnetic losses caused by the signal's high frequency, as well as to be shielded from external interferences that could alter the signal's integrity and to prevent signal leakage from the cable that could impact surrounding equipment and materials. In some implementations, Cable Stage Three is a high power, high frequency transmission line in the form of a customized coaxial cable. In some implementations, the coaxial cable includes a core conductor carrying the adjusting network's input signal and is made of stranded copper with an outside diameter large enough to carry the power with reduced resistive losses, a dielectric material surrounding the core chosen to increase electrical insulation and to sustain high voltage and temperature ranges, a shield conductor providing the signal's return path to the ACG made of stranded and braided copper with an equivalent gauge large enough to carry the power with reduced resistive losses, a first casing insulating the conducting shield chosen to sustain high voltage and temperature ranges, an outer shield similar to the conducting shield but not directly carrying currents and used to shield the cable from external interferences and to prevent leakage, and finally a second casing similar to the first casing and insulating the outer shield.

In some implementations, Cable Stage Four is chosen and customized to allow for the efficient transfer of the high frequency and high current AC power signal from the adjusting network to the target areas. In some implementations, this cable is designed to adjust impedance between the adjusting network and the target areas, to reduce resistive and electromagnetic losses caused by the signal's high frequency, as well as to be shielded from external interferences that could alter the signal's integrity and to prevent signal leakage from the cable that could impact surrounding equipment and materials. In some implementations, Cable Stage Four is a high power, high frequency and high current transmission line in the form of a customized coaxial cable, similar the embodiment described above for Cable Stage Three, except with larger conductor gauges and diameters and with additional silver coatings of same conductors in order to improve high current performance and further reduce resistive losses. In some implementations, Cable Stage Four is additionally customized based on Litz wire design. Such a design's purpose is to reduce the losses due to the proximity and skin effects in the cables, by manufacturing the conductors out of thinner-than-skin-depth, individually insulated (for example using an enamel coating), and perfectly symmetrically twisted or woven brands.

In general, electrodes include the material through which the current will enter and leave the bulk medium target area. In some implementations, a connector will be used to connect the electrodes to the bulk medium. Connector refers to an attachment fixture that connects the electrodes to the bulk medium. In some implementations, the electrodes and connectors are designed to reduce the contact resistance between the electrodes and the bulk medium. Put another way, the electrodes are designed to smoothen the potential difference that occurs across the target area, for a given return path. If this contact resistance is higher than the resistance of the target area in between the two electrodes, more heating will occur at the contact points than along the target area, all else equal, reducing the heating efficiency of the heating system. In some implementations, for similar reasons, the electrodes and connectors are designed to reduce the contact resistance between the electrodes and the wires (or cables) of the heating system. In some implementations, the electrodes and connectors will also be designed to reduce electromagnetic losses (e.g., electromagnetic radiation).

In some implementations, electrode design considerations to achieve one or more of the above goals include (1) selecting an electrode material that has high conductivity, and (2) increasing the "real" contact area between the electrodes and the bulk medium, and between the electrodes and the wires. "Real" contact area refers to the minute inter-metallic, or inter-material, contacts through which the current flows from one material to the other, often referred to as "a-spots". In some implementations, the connectors will also be designed to achieve these goals.

In some implementations, the material of the electrodes can include silver, copper, aluminum, carbon fiber composite, titanium, or an alloy thereof.

In some implementations, the electrodes are a part of the cables used to convey current to the bulk medium.

In some implementations, the geometry of the electrodes is designed to be suitable to a specific target area, and/or to reduce the contact resistance between the electrodes and the bulk medium and/or to reduce electromagnetic losses.

In some implementations, the electrodes are circular.

In some implementations, the electrodes are the shape of the end of the cables used to convey current to the bulk medium.

In some implementations, line electrodes (e.g., rectangular electrodes in which the length is larger than the width) are used.

In some implementations, electrodes in the shape of 2D spline curves with a small thickness (in the third spatial dimension) are used.

In some implementations, the cable conductor can be connected to the target area by being sandwiched between a connector plate and the target area. For example, a portion of the side of the connector plate in contact with the target area can be milled out. The conductor of the cable that this connection bonds to the target area can be placed in this milled portion. This configuration can allow for the clamping or adhering of the electrode connector plate with the cable conductor underneath and without having to bend the connection to ensure proper bonding with the target area.

In general, various implementations and design considerations for electrodes and connectors are contemplated.

Figure 17:
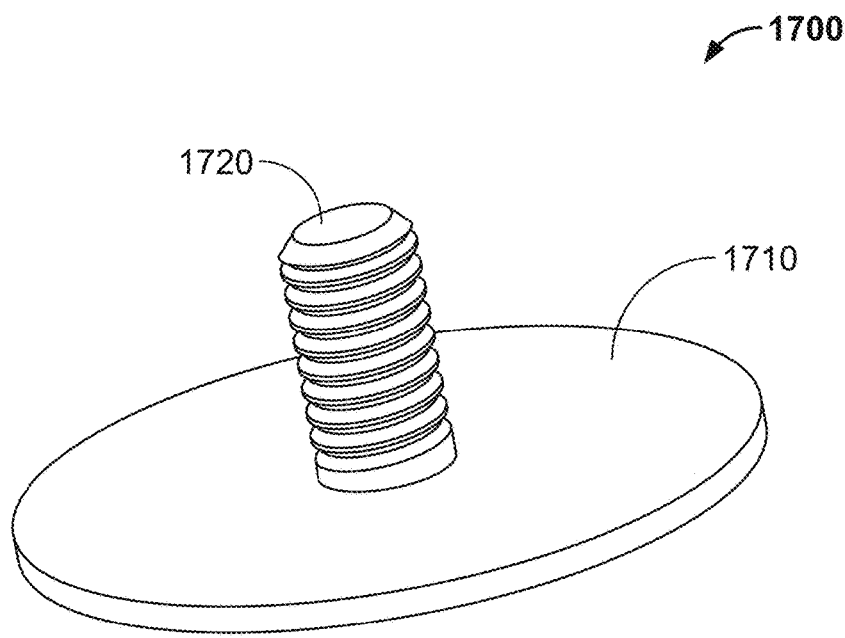
FIG. 17 is a schematic of an exemplary electrode for a heating system.

FIG. 17 is a photograph of an exemplary circular stud electrode 1700 for a heating system 100. The electrode includes a circular ground stud coupled to a disk 1710 made of a conductive material (e.g., aluminum), on which a threaded conductive material 1720 (e.g., aluminum) is mounted.

In some implementations, the conductor of the cable which is connected to the target area though electrode 1700 is wrapped around threaded conductive material 1720, laying flat and covering a significant portion of the surface area of both the threaded conductive material and the disk. In some implementations, a nut and washer can be used on threaded material 1720 to press the conductor against the disk 1710, ensuring higher contact area and lower contact resistance.

In some implementations, the air gaps between the washer, cable, and disk 1710 are filled with an electrically and/or thermally conductive thermal interface material, ensuring improved heat and/or current conductivity from the cable to the stud 1700.

In some implementations, circular stud electrode 1700 is attached to the target area using a specifically chosen adhesive which is both sufficiently electrically and thermally conductive to conduct the heat and electric signal from the cable to the target area. In some implementations, the adhesive is also sufficiently strong to withstand the torque created by the nut and washer.

In some implementations, the connector is a U-shaped fixture attached to the bulk medium and electrodes in such a manner that significant compressive strength is applied between the electrode and bulk medium.

In some implementations, the materials of the electrode and connector can be chosen to reduce their weight. In some implementations, the material of the electrode is chosen to improve electrical and/or thermal conduction through the material, in addition to reducing its weight. Improved conduction may be advantageous for electrode designs where the current flowing from the cable to the target area goes through the electrode (e.g., circular stud, one plate design).

In some implementations, specific enclosures are included as part of the connector and electrode design. For example, such enclosures can be chosen for environmental qualification, including criteria such as thermal relief and/or insulation, electrical insulation, EMI shielding, corrosion protection, resistance to vibration and shock, durability, protection from external contamination and precipitations.

In general, various adhesion configurations (and combinations thereof) between the electrodes and/or connectors and the bulk medium are contemplated. In some implementations, the configurations reduce the contact resistance between the electrodes and the bulk medium and/or reduce electromagnetic losses.

Figure 18A:
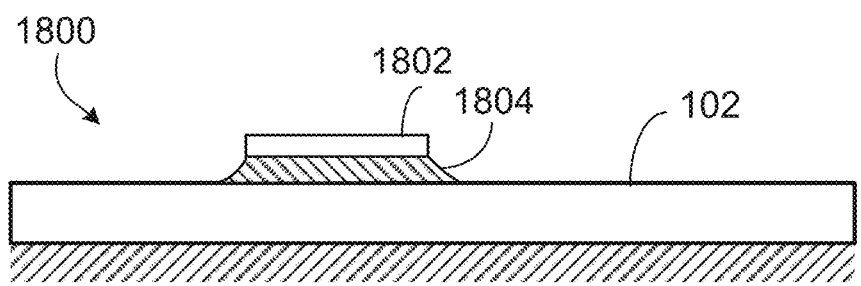
FIG. 18A is a schematic of an exemplary brazed joint attachment between the electrode and the bulk medium.

In some implementations, the electrodes are connected to the bulk medium using a brazed joint. FIG. 18A is a schematic of an exemplary brazed joint attachment 1800 between an electrode 1802 and the bulk medium target area 102, which is part of the larger bulk medium 1806. A brazing material is used to create braze joint 1804. For example, a low temperature brazing filler metal (e.g., AL 802) could be used to braze the electrodes to the target area to create a low resistance contact. In some implementations, in order to mitigate oxidation (the formation of an aluminum oxide layer at the brazing site), the filler metals will be coated with flux. Flux is a material that at high temperatures dissolves oxides and prevents the surface from re-oxidizing until the filler metal wets the surface.

In some implementations, the electrodes and the target area are clad together under pressure and temperature. For example, in some implementations, a compressive force between the electrodes and the target area is applied. Without wishing to be bound by theory, the compressive force may reduce the contact resistance in between the electrodes and the bulk medium as per the equation below:

$$R = \rho \sqrt{\frac{\pi H}{4F}}$$

where $\rho$ is the electrical resistivity of the contact materials, H is the Vickers' Hardness of the softer of the contact surfaces, and F is the compressive, or contact, force.

Figure 18B:
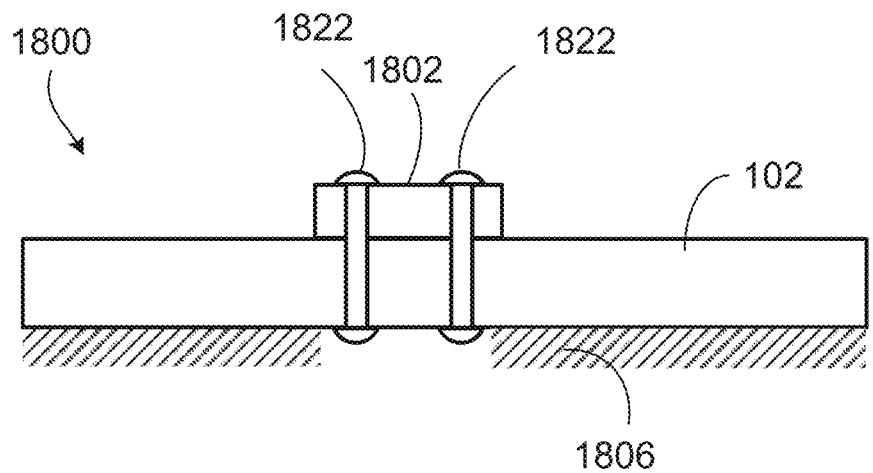
FIG. 18B is a schematic of an exemplary rivet fastener attachment between the electrode and the bulk medium.

In some implementations, compressive force can be applied to connect the electrodes and the bulk medium using a mechanical fastener connector. FIG. 18B is a schematic of an exemplary attachment configuration 1820 between electrode 1802 and the target area 102, which is part of the larger bulk medium 1806. Solid rivets 1822 are used to apply compressive force to connect the electrode to the target area.

Figure 18C:
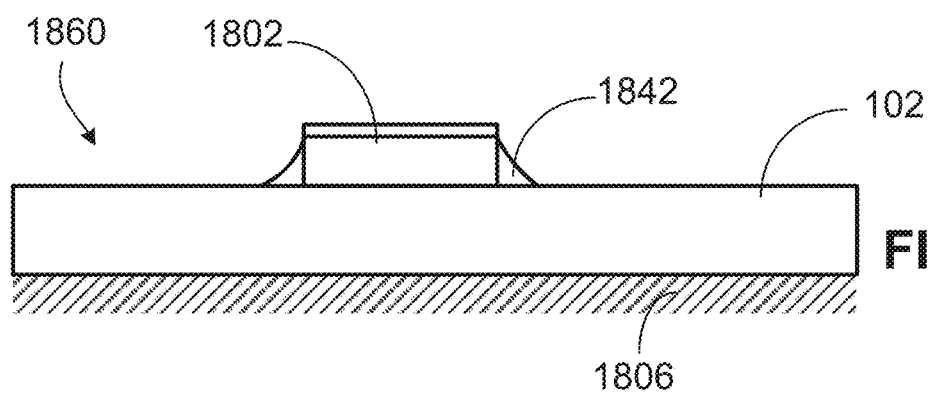
FIG. 18C is a schematic of an exemplary air sealing tape attachment between the electrode and the bulk medium.

In some implementations, compressive force can be applied using vacuum tape, or a similar object which can air seal the connection in between the electrodes and the target area. FIG. 18C is a schematic of an exemplary attachment configuration 1840, between electrode 1802 and the target area 102, which is part of the larger bulk medium 1806. Air sealing tape 1842 us used to connect the electrode and the target area. After the air seal is completed, a suction device can be used to create a vacuum between the electrodes and the target area, thereby bringing the two together and generating a compressive force.

In some implementations, compressive force can be applied using clamps sandwiching the electrode and target area and increasing pressure at their interface, for example with C-clamps.

In some implementations, the compressive force can be applied using magnets or magnetized surfaces. In some implementations, either a face of the electrode or a face of the target area is magnetized, allowing for an attractive force between the magnets and electrode and/or contact area, which results in the desired compressive force. In some implementations, two or more magnets are used, and the electrode and target area are sandwiched between them, allowing for an attractive force between the magnets, which results in the desired compressive force. In some implementations, both a face of the electrode and a face of the target area are magnetized, allowing for an attractive force between the electrode and the target area, which results in the desired compressive force.

In some implementations, the compressive force is applied by an external or internal compression fixture connector that adheres to a surface on or near the target area, and converts the adhesive strength into a desired compression force. In some implementations, adhesives (e.g., curing adhesives) can be used in conjunction with the fixture connectors.

In some implementations, the electrodes could be embedded, partially or wholly, into the bulk medium, using one of the aforementioned methods or an alternative technique.

In some implementations, a conductive material (e.g., graphene) is placed in between the electrodes and the target area.

In some implementations, the connector material used to connect the electrode to the target area is an adhesive chosen for increased strength, ensuring long-term bonding to the target area. The strength of the adhesive may be advantageous in the case where the bonding area is relatively small and where mechanical constraints created on the bonding area are relatively strong (e.g., in the case of the U-shape stud electrode). In one embodiment, when the electrode needs to remain in a fixed position to cure the adhesive after being applied, internal or external/disposable fixtures using adhesives and mechanical force can be used to keep the electrode in place.

In some implementations, the connector material used to connect the electrode to the target area is also chosen for higher thermal and/or electrical conductivity to ensure improved flow of current and heat from the cable to the target area. For example, higher conductivity may be a consideration where the electrode used is attached such that the adhesive is on the path of the electrical current running from the cable/electrode to the target area (e.g., with circular stud electrode and the single plate design electrode). To that end, in some implementations, nanomaterials (e.g., CNT) are placed between the electrodes and the bulk medium. In some implementations, the surface of the electrodes and the portion of the surface of the bulk medium which will be brought into contact with the electrodes (e.g., target area) can be manipulated in order to increase the "real" contact area between them.

In some implementations, and in combination with the aforementioned implementations as well as other implementations, the connector, the electrodes and part of the target area are encased with a material that reduces or eliminates electromagnetic losses.

Figure 18D:
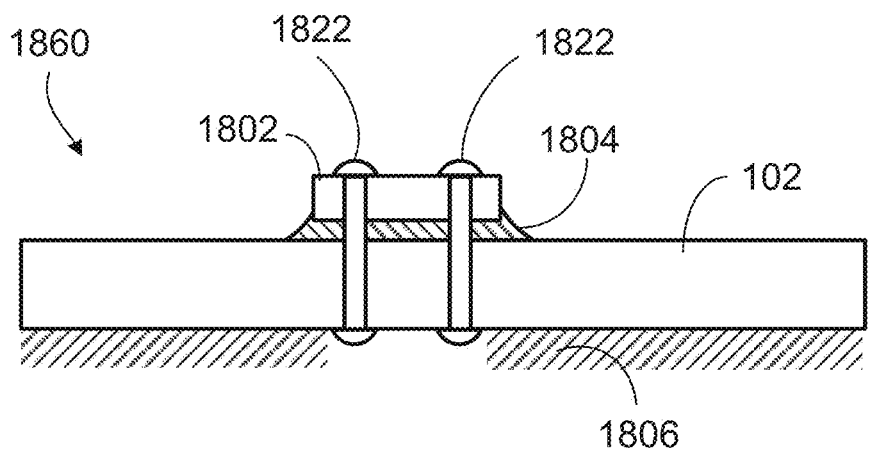
FIG. 18D is a schematic of an exemplary combinatorial attachment between the electrode and the bulk medium.

In some implementations, any combination of the methods mentioned above is used with any electrode and connector embodiment. For example, FIG. 18D is a schematic of an exemplary combinatorial attachment 1860 between the electrode 1802 and the bulk medium 1806 target area 102. The attachment includes a brazed joint 1804 and solid rivets 1822.

In some implementations, no connectors/cables may be needed for the system, since no physical contact is required for the desired current to be generated. In that case, in some implementations, the return path of the signal may be an additional portion of wire running back to the adjusting network.

Implementations of the heating system described herein can be used as a de-icing/anti-icing device for melting ice from the surface of an airplane by applying high frequency AC current to a target area of the airplane's skin/airframe (e.g., to produce Joule heating). Heat generated in the airframe target area is conducted to the surface of the airframe and convects across the airframe-ice interface into the ice. In some implementations, the ice completely melts. In some implementations, a portion of the ice (a layer directly in contact with the airframe) melts, creating a layer of water between the ice and the airframe, allowing the ice to slip off or to be mechanically removed from the airframe. In some implementations, heating occurs prior to ice being present, preventing its formation.

In some implementations, upon melting of the ice, the high frequency AC current continues to be applied to maintain the generation of Joule heating within the airframe, which transfers to any water formed/remaining on the surface using conduction and convection.

FIGS. 19-32 provide examples of assemblies for carrying and delivering electromagnetic energy for bulk medium heating systems. The assemblies (referred to herein as "coupling strips") are configured to function similarly to transmission lines in combination with a bulk conductive medium to which they are attached. For example, in some implementations, the design of the coupling strips causes the bulk medium itself to conduct current in a manner similar to current traveling through a transmission line. The coupling strips can electromagnetically couple AC signals from the lines to the bulk media, thereby, generating corresponding current signals within the bulk medium. Thus, in effect, it can be said that the design of the coupling strip causes the bulk medium (in combination with the coupling strip) to operate as a transmission line as well, or alternatively causes the bulk medium and the coupling strips to together form a system that behaves like a transmission line and can be analyzed and designed as such.

For example, as discussed above, implementations of the present disclosure can be configured to produce heating in a bulk medium by manipulating mechanisms for shaping (e.g., constricting, lengthening, etc.) current within a conductive medium (e.g., bulk medium, conductor): for example, by using the skin effect and the proximity effect. Both effects rely on running a high frequency AC current through the conductive medium that is to be heated. The skin effect constrains current flow by taking advantage of the tendency of an alternating electric current ("AC") to become distributed within a conductor such that the current density is largest near the surface of the conductor, and decreases with greater depths in the conductor. The proximity effect can be used to further constrain current flow in the conductor by placing another AC current path near the existing current flowing in the conductor. The proximity effect can also act to lengthen the current path. The coupling strips can be used to produce and control such effects in addition to the systems and processes discussed above. For example, the coupling strips can be used with the various power control systems described above.

Figure 19:
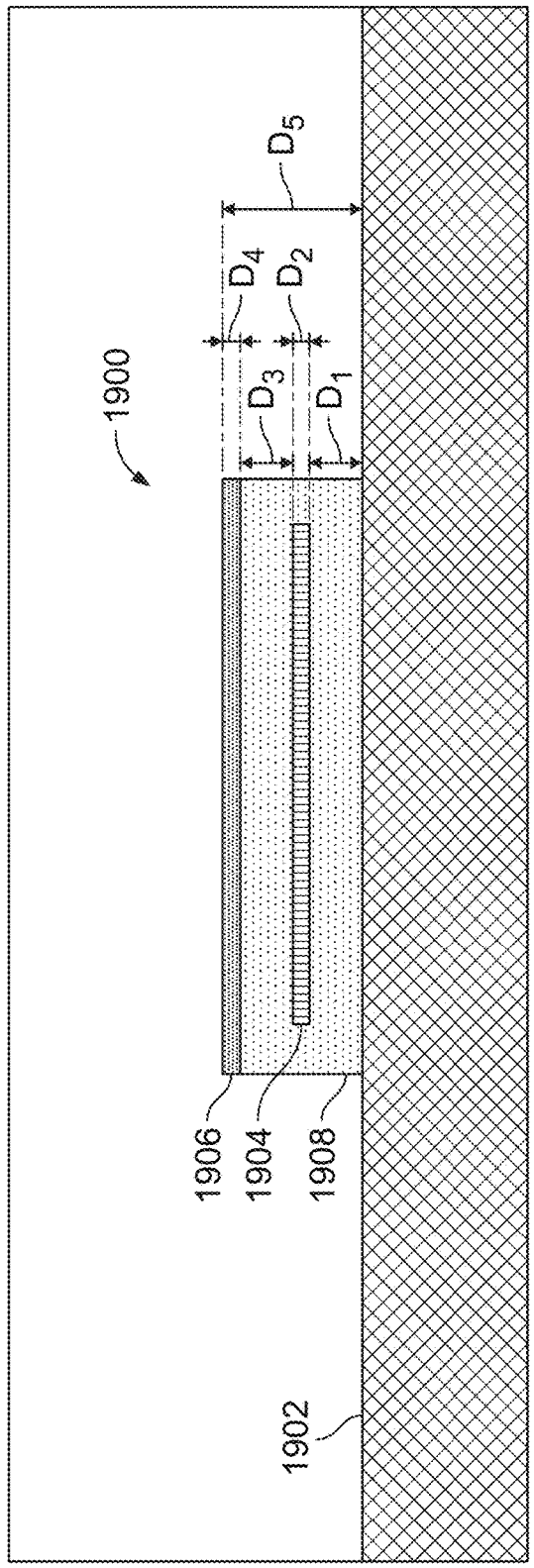
FIG. 19 is a cross-sectional view of an exemplary coupling strip for providing high frequency heating signals to a bulk medium according to implementations of the present disclosure.

FIG. 19 is a cross-sectional view of an exemplary coupling strip 1900. Coupling strip 1900 can be used to provide high frequency current signals to a bulk medium such as an aircraft skin 1902 to heat the bulk medium. The coupling strip 1900 has a multi-layer structure that includes a first dielectric layer 1908 over the bulk medium 1902, a conductive layer 1904 over the first dielectric layer 1908, a second dielectric layer 1908 over the conductive layer 1904, and a conductive shielding layer 1906 over the second dielectric layer 1908.

The first dielectric layer 1908 has a thickness D1. The conductive layer 1904 has a thickness D2. The second dielectric layer 1908 has a thickness D3. The conductive shielding layer 1906 has a thickness D4. The overall thickness of the coupling strip 1900 is D5. The conductive layer 1904 can be made from conductive materials including, but not limited to, copper, copper alloys (e.g., brass or bronze), silver, silver alloys, aluminum, aluminum alloys, titanium, titanium alloys, chromium, nickel, nickel alloys, cobalt-base alloys, corrosion-resistant steel, graphite, or a combination thereof. The conductive shielding layer 1906 can be made from conductive materials including, but not limited to, copper, copper alloys (e.g., brass or bronze), silver, silver alloys, aluminum, aluminum alloys, titanium, titanium alloys, chromium, nickel, nickel alloys, cobalt-base alloys, corrosion-resistant steel, graphite, or a combination thereof. In some implementations, the conductive shielding layer 1906 can be formed as a metal foil (e.g., copper foil or aluminum foil) or as a woven metal layer. The dielectric layers 1908 can be made from dielectric materials including, but not limited to, Kapton, mylar, Polyethylene Terephthalate (PET), Polytetrafluoroethylene (PTFE), rubber, or a combination thereof.

In some implementations, the coupling strip 1900 includes a protective layer over the conductive shielding layer. For example, the protective layer can include, but is not limited to one or more layer of polyurethane, polyflouride, paint, paint replacement film, sealant, or a combination thereof.

Figure 20:
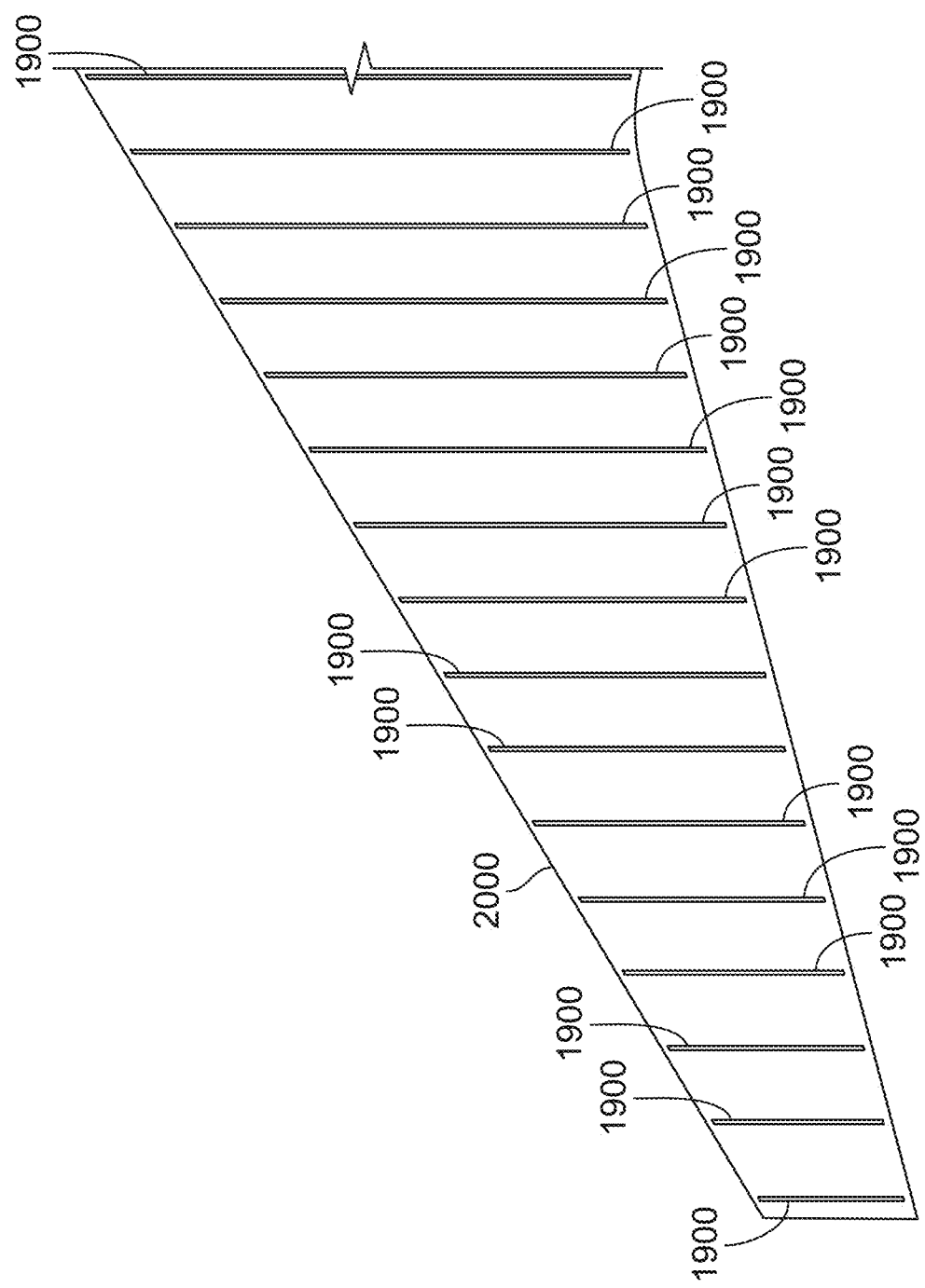
FIG. 20 depicts an exemplary layout of coupling strips of FIG. 19 on an aircraft wing.

As illustrated in FIG. 20, coupling strips 1900 can arranged on the surface of a bulk medium, such as an aircraft skin 2000 (e.g., a wing), to supply electrical current to the bulk medium and heat the bulk medium generating and shaping a current flow within the bulk medium. The coupling strips 1900 extend along the surface of the aircraft skin 2000 and are spaced apart from one another. In some implementations, one or more coupling strips 1900 include a short circuit termination that conductively couple at least a portion of a coupling strip (e.g., the conductive layer 1904) to the bulk medium 1902. For example, a coupling strip 1900 can terminate with an electrode, such as those discussed above, to form closed circuit (e.g., a short circuit) between the conductive layer 1904 contained therein and the bulk medium 1902. The termination of the coupling strip 1900 is the far end of the strip opposite the end to which current is supplied (e.g. opposite the power input end). In some implementations, one or more coupling strips 1900 terminate in an open circuit. An open circuit termination means that the termination end of the coupling strip 1900 is left as an open circuit; not being connected to an electrical ground through either the bulk medium 1902 or a conductive shielding layer of the coupling strip 1900. In some implementations, one or more coupling strips 1900 terminate with an impedance adjusting component (e.g., a circuit element) connected between the coupling strip 1900 and the bulk medium 1902. For example, a coupling strip 1900 can terminate with a capacitive, resistive, or inductive termination. For example, circuit element such as a capacitor, an inductor, or a resistor can be connected between the conductive layer 1904 of a coupling strip 1900 and the bulk medium 1902.

Referring to FIGS. 19 and 20, a power control system (e.g., power control system 104 described above) is coupled to one end of each of the coupling strips to feed each strip with an electrical current. For example, a power supply line from the power control system can be coupled to the conductive layer of each carrier strip 1900 and either one or both of the bulk media 1902 (e.g., aircraft skin 2000) can be coupled to electrical ground.

The power control system supplies an AC current to each carrier strip 1900. For example, the power control system can supply an AC current with a frequency between 1 kHz and 450 MHz. In some implementations, the frequency is between 1 MHz and 450 MHz. In some implementations, the frequency is between 1 kHz and 1 MHz. The power control system can be configured to provide between 0.1 Amps and 200 Amps of AC current to each coupling strip 1900. For example, a power source of the power control system and an electrical arrangement of the coupling strips 1900 can be configured to provide a desired amount of current (e.g., between 0.1 Amps and 200 Amps) to each coupling strip 1900. As one general example, if the coupling strips 1900 are coupled to the power control system in series with one another a 100 Amp power source may be used to provide 100 Amps of current to each coupling strip 1900. If ten coupling strips 1900 are coupled to the power control system in parallel with one another a 100 Amp power source may be used to provide 10 Amps of current to each coupling strip 1900. It should be noted that this example assumes that the impedance of each coupling strip is equal. As discussed below, the impedance of coupling strips 1900 can be tuned in various ways to control the current distribution among the coupling strips as might be desired or required for a particular heating application.

Figure 22A:
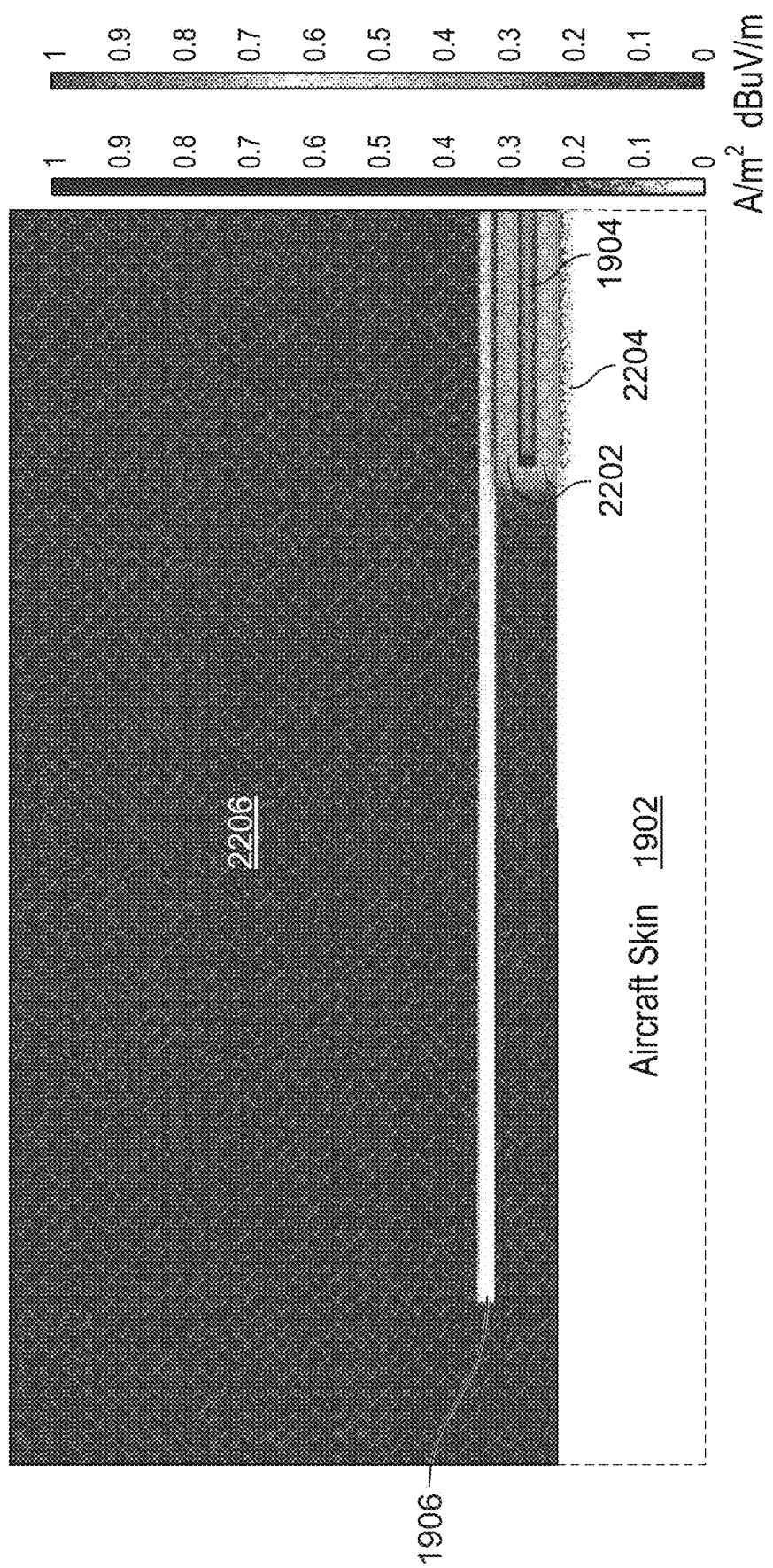
FIG. 22A depicts a plot of the simulated current density generated in an aircraft skin by an exemplary coupling strip and the electric field density between the coupling strip and the aircraft skin.
Figure 22B:
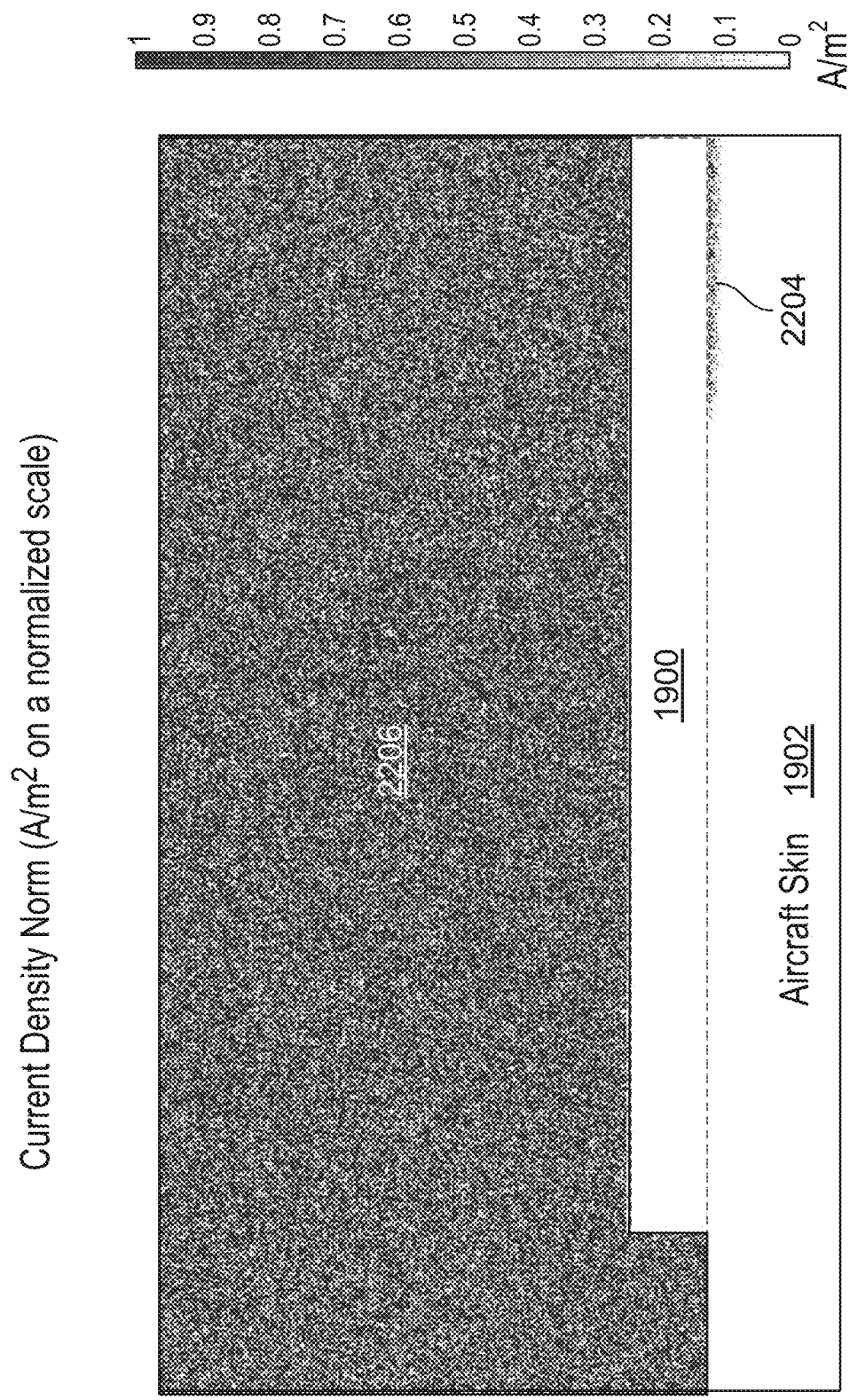
FIG. 22B depicts a plot of the simulated current density generated in the aircraft skin depicted in FIG. 22A.

The AC current for heating the aircraft skin 1902 is provided through the conductive layer 1904. The AC current provided through the conductive layer 1904 generates (e.g., by electromagnetic capacitive and inductive coupling) a corresponding current in the aircraft skin 1902 as shown in FIGS. 22A-22B. FIGS. 22A-22B illustrate output plots of an electromagnetic Finite Element Analysis (FEA) simulating the operation of an exemplary coupling strip 1900 attached to a conductive bulk medium 1902. The bulk medium 1902 (e.g., simulated as an aircraft skin), the conductive layer 1904, and the conductive shielding layer 1906 are labeled in the plot shown in FIG. 22A. In FIG. 22B, individual components of the coupling strip 1900 are not shown, and, only the coupling strip 1900 (depicted generally) and the bulk medium 1902 are labeled. The region labeled as 2206 in both plots represents the background environment (e.g., the atmosphere). Both plots illustrate the normalized density (in $A/m^2$) of the current induced in the bulk medium 1902 and indicated by the shaded region 2204. The current density in the bulk medium 1902 is at a maximum in a narrow region 2204 near the surface of the bulk medium 1902. In addition, the plot in FIG. 22A illustrates the normalized electric field intensity (light grey scale region 2202) within the dielectric layers of the coupling strip 1900. Notably, the conductive shielding layer 1906 shields the surrounding environment 2206 from electric fields produced by the current traveling through the conductive layer 1904, e.g., to reduce or eliminate electromagnetic radiation and to protect the coupling strip 1900 from external electromagnetic interference. The bulk medium 1902 serves as a shielding layer as well by, e.g., minimizing or blocking the electric fields. Thus, the conductive shielding layer 1906 and the bulk medium 1902 can, in implementations of the coupling strip 1900, serve to contain the electric fields within the coupling strip 1900 (e.g., between conductive shielding layer 1906 and the bulk medium 1902). This effect reduces or prevents electromagnetic interference between heating system and other nearby electrical components. Implementations of the coupling strip 1900, in combination with the bulk medium 1902 can achieve an operating performance comparable to stripline-type transmission lines.

Referring again to FIG. 19, the heating effect of the carrier strips 1900 on the bulk medium and also the impedance of each carrier strip 1900 can be adjusted by altering characteristics of the carrier strip such as, e.g., the thicknesses of the various layers 1904, 1906, and 1908; the width of the conductive layer; the layout of the conductive layer; the materials of each layer—including their dielectric constants and conductivity properties; or by the inclusion of impedance adjusting components (e.g., capacitors, inductors, and resistors). Furthermore, the heating effects of the current generated in the bulk medium 1902 can also be altered by changing these characteristics which also serve to adjust the proximity effect and path of the heating current that travels through the bulk medium 1902, as discussed above.

For example, each of the layers 1904, 1906, 1908 can be formed with respective thickness (D1-D4) ranging generally between 0.1 mil and 1 inch or, in some implementations, between 0.5 mil and 10 mils. In some implementations, the coupling strip 1900 can be formed with different distances separating the conductive layer 1904 from the bulk medium 1902 and separating the conductive layer 1904 from the conductive shielding layer 1906. In some implementations, these distances are related by a ratio. For example, the coupling strip 1900 can be formed such that the relative thickness D1 and D3 of the dielectric layers 1908 are related by a ratio. For example, the ratio D1:D3 can range be between 1:1 and 1:5 for some implementations. The ratio D1:D3 can be reversed to range between 1:1 and 5:1 for other implementations, e.g., in order to obtain a desired current density and/or impedance value for a given application. In one example implementation D1 is 3 mils, D2 is 1 mils, D3 is 3 mils, and D4 is 1 mils. In another example implementation D1 is 7.2 mils, D2 is 1.4 mils, D3 is 2.4 mils, and D4 is 1.4 mils. In yet another example implementation D1 is 1000 mils, D2 is 50 mils, D3 is 500 mils, and D4 is 50 mils. In yet another example implementation D1 is 10 mils, D2 is 2.5 mils, D3 is 50 mils, and D4 is 2.5 mils. In yet another example D1 is 2.4 mils, D2 is 1.4 mils, D3 is 7.2 mils, and D4 is 1.4 mils. In yet a further example D1 is 17.6 mils, D2 is 9.8 mils, D3 is 24.5 mils, and D4 is 9.8 mils. In yet another example D1 is 100 mils, D2 is 20 mils, D3 is 250 mils, and D4 is 20 mils. In yet another example D1 is 5.5 mils, D2 is 2.5 mils, D3 is 9.0 mils, and D4 is 2.5 mils. In yet a further example D1 is 1.5 inches, D2 is 0.25 inches, D3 is 2.2 inches, and D4 is 0.25 inches. In yet another example D1 is 3.8 mils, D2 is 2 mils, D3 is 3.8 mils, and D4 is 2 mils. In yet another example D1 is 2.9 mils, D2 is 1.5 mils, D3 is 5.8 mils, and D4 is 2.5 mils. In yet a further example D1 is 5 mils, D2 is 2.5 mills, D3 is 25 mils, and D4 is 1.5 inches. |[RT1]In yet another example D1 is 11 mils, D2 is 3 mils, D3 is 5.5 mils, and D4 is 3 mils. In yet another example D1 is 21 mils, D2 is 1.5 mils, D3 is 7 mils, and D4 is 2.5 mils. In yet a further example D1 is 10 mils, D2 is 2.5 mills, D3 is 2 mils, and D4 is 2.5 inches. In yet a further example D1 is 4.5 inches, D2 is 0.25 inches, D3 is 1.5 inches, and D4 is 0.25 inches. In another example implementation D1 is 3 mils, D2 is 1 mils, D3 is 3 mils, and D4 is 1 mils. In yet another example D1 is 10.2 mils, D2 is 3.5 mils, D3 is 40.8 mils, and D4 is 2.5 mils. In yet another example D1 is 4.8 mils, D2 is 0.5 mils, D3 is 14.4 mils, and D4 is 0.5 mils. In yet another example D1 is 15 mils, D2 is 1.4 mils, D3 is 3 mils, and D4 is 1.4 mils. In yet another example D1 is 113 mils, D2 is 10 mils, D3 is 28.25 mils, and D4 is 10 mils. In yet another example D1 is 127 mils, D2 is 5 mils, D3 is 254 mils, and D4 is 10 mils. In yet another example D1 is 53 mils, D2 is 12 mils, D3 is 159 mils, and D4 is 12 mils. In yet another example D1 is 13 mils, D2 is 1.4 mils, D3 is 2.6 mils, and D4 is 1.4 mils. In yet another example D1 is 23 mils, D2 is 4 mils, D3 is 46 mils, and D4 is 4 mils. In yet another example D1 is 11.5 mils, D2 is 2.8 mils, D3 is 57.5 mils, and D4 is 2.8 mils. In yet another example D1 is 10 mils, D2 is 1.4 mils, D3 is 2.5 mils, and D4 is 1.4 mils.

Figure 21:
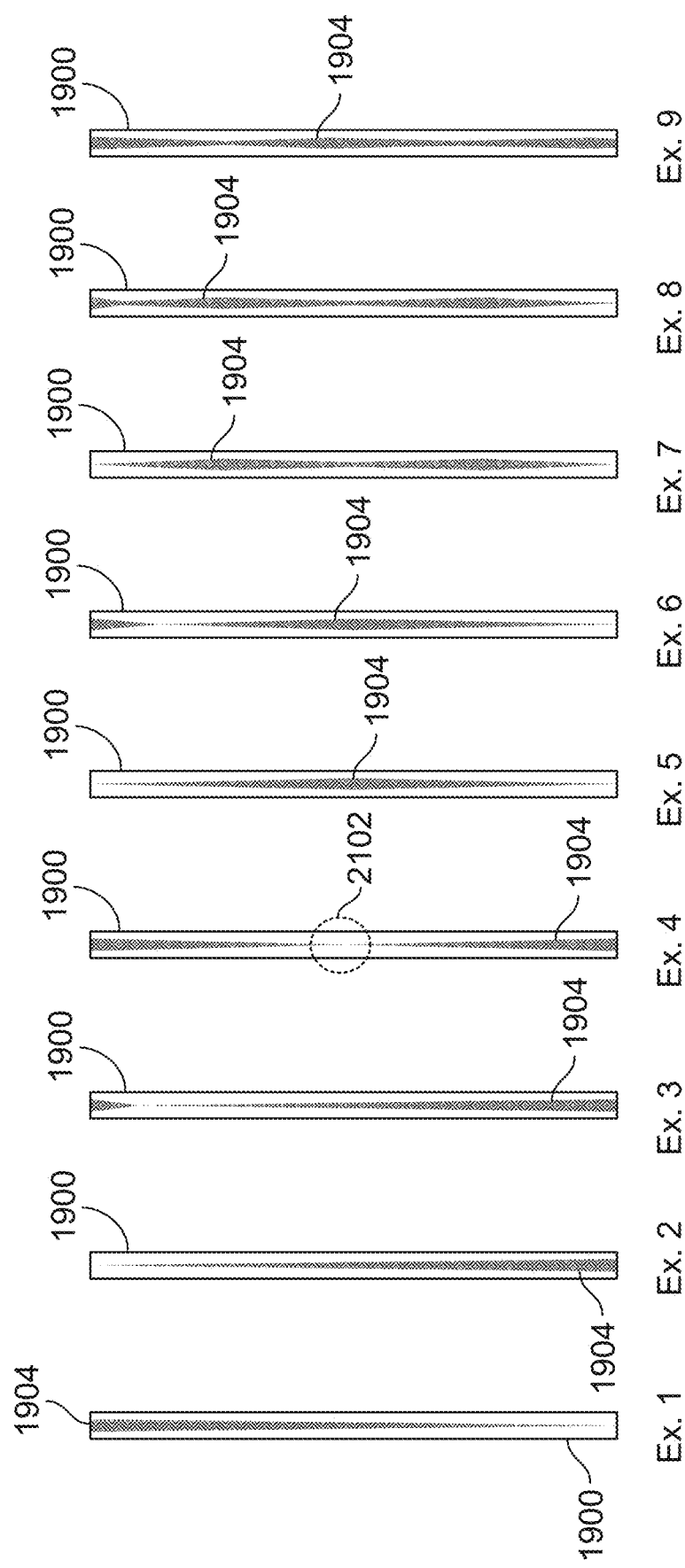
FIG. 21 depicts a top view of several exemplary coupling strips to illustrate various configurations of the conductive layer within a coupling strip.

Furthermore, the width of the conductive layer 1904 can generally range between several inches or several mils across the layer. FIG. 21 depicts a top view of several exemplary coupling strips (Examples 1-9) to illustrate various configurations of the conductive layer 1904 within a coupling strip 1900. It should be noted that the coupling strips 1900 in FIG. 21 are depicted with the layers above the conductive layer 1904 (e.g., the second dielectric layer and the conductive shielding layer) removed for illustrative purposes. The cross sectional area of conductive layer 1904 can be varied along its length. For example, the width of conductive layer 1904 can vary along its length to tune the impedance of the coupling strip 1900 and, in some cases, to tune the current densities in the bulk medium and the conducting layer. Examples 1-9 show several exemplary width-variation patters for a conductive layer 1904 of a coupling strip 1900. For instance, the width of the conductive layer 1904 across the coupling strip 1900 can vary between a maximum width and minimum width. In some implementations, the maximum width is as little as 1.5 times larger the minimum width. In other implementations, the maximum width is as much as 100 times larger than the minimum width. For example, the width of the conductive layer 1904 shown in Example 1 may be 1.5 inches at its largest location (e.g., the top end) and 1 inch at its narrowest location (e.g., the bottom end). In another example, the width of the conductive layer 1904 shown in Example 1 may be 1 inches at its largest location (e.g., the top end) and 10 mils at its narrowest location (e.g., the bottom end).

In some implementations, the thickness of conductive layer 1904 can vary along its length. For example, the width of conductive layer 1904 can vary along its length to tune the impedance of the coupling strip 1900. In some implementations, both the thickness and width and material of conductive layer 1904 can vary along its length.

In some implementations, the impedance of the coupling line 1900 can be adjusted by including impedance adjusting components (e.g., capacitors, inductors, and resistors) at one or more locations along the length of the conductive layer 1904. For example, the conductive layer can be separated into several segments along the length with one or more impedance adjusting components connecting the segments. For instance, in reference to coupling strip Example 4 of FIG. 21, the conductive layer 1904 can be separated into two segments at region 2102 and an impedance adjusting component (e.g., a capacitor, inductor, resistor, or combination thereof) can be electrically connected between each segment. Alternatively or in addition, an impedance adjusting component can be connected to the conductive layer as a shunt element between the conductive layer 1904 and either the bulk medium 1902 or the conductive shielding layer 1906.

In some implementations, the width, thickness, or both of the conductive shielding layer 1906 can vary along the length of the coupling strip 1900. In some implementations, the width, thickness, or both of the dielectric layers 1908 can vary along the length of the coupling strip 1900. For example, in some implementations, the cross-sectional areas of the conductive layer 1904, the dielectric layers 1908 and the conductive shielding layer 1906 can vary along the length of the strip 1900.

Figure 23:
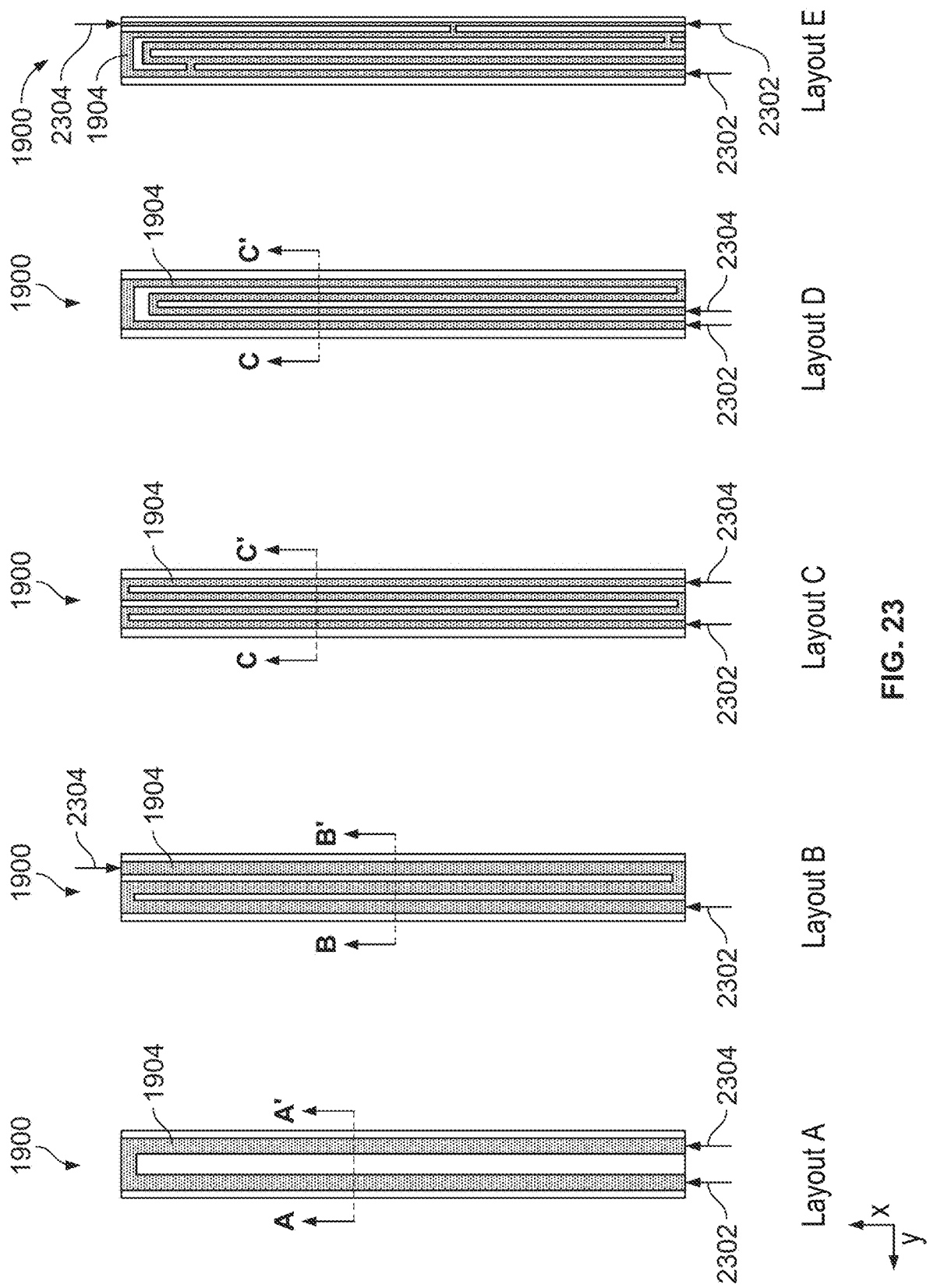
FIG. 23 depicts layout diagrams of several exemplary conductive layer arrangements within a coupling strip.

FIG. 23 illustrates layout diagrams (Layouts A-E) of several exemplary arrangements for a conductive layer 1904 within a coupling strip 1900. Initially, in a linear arrangement (as depicted in FIG. 21) the conductive layer 1904 extends linearly along the length of the coupling strip 1900. Layouts A-E depict coupling strips 1900 in which the conductive layer 1904 is arranged to follow along a non-linear pattern or path. Specifically, the examples shown in FIG. 23 depict the conductive layer 1904 arranged in various different serpentine patterns. The depicted serpentine patterns position segments of the conductive layer 1904 alongside one another in a width direction of the coupling strip 1900. Such arrangements allow the overall length of the coupling strip 1900 to be reduced while maintaining a desired total length of the conductive layer 1904. In some applications, maintaining a relatively uniform length for the conductive layer 1904 in different coupling strips 1900 helps to maintain consistent impedance between coupling strips 1900 of different lengths. For example, in each of Layouts A and B conductive layer 1904 can be formed to the same total length. However, the overall length of the coupling strip 1900 in Layout B may be shortened to half of the length of a coupling strip 1900 with conductive layer in a linear arrangement (e.g., as depicted in FIG. 21). Similarly, the overall length of the coupling strip 1900 in Layout C may be shortened to one third of the length of a coupling strip 1900 with conductive layer in a linear arrangement. Moreover, the shorter length coupling strips 1900 can be placed in space constrained locations on an aircraft body. For example, coupling strips 1900 with having a conductive layer arranged according to Layouts A-E can be placed on narrow areas of a wing (e.g., wing tips) where a coupling strip 1900 with the linear conductive layer arrangement might be too long to fit.

Figure 24A:
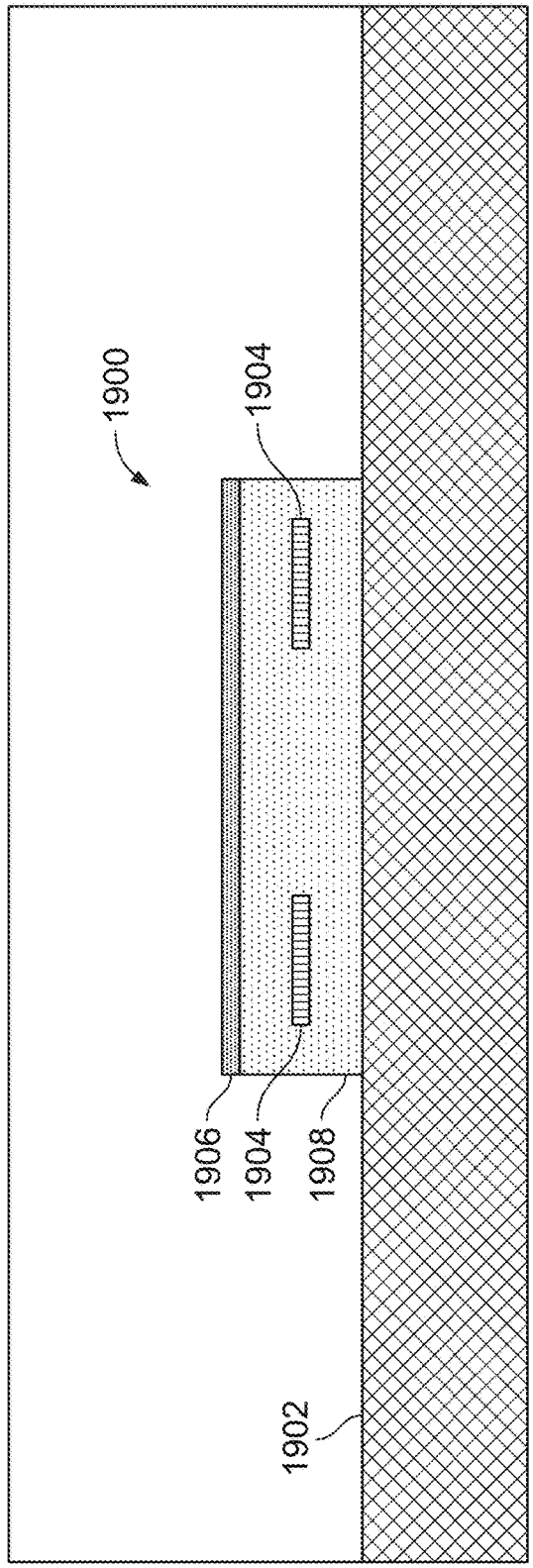
FIG. 24A depicts a cross-sectional view of a coupling strip according to Layout A of FIG. 23 taken at A-A'.

Each Layout A-E illustrates coupling strip 1900 having a conductive layer 1904 arranged along non-linear path from an input end 2302 to a termination end 2304. Layout A illustrates a coupling strip 1900 with a conductive layer 1904 in a double overlap arrangement. The conductive layer 1904 in Layout A includes two segments arranged alongside one another, e.g., in a U-shaped path from the input end 2302 to the termination end 2304. FIG. 24A depicts a cross-sectional view of a coupling strip 1900 according to Layout A taken at A-A'.

Figure 24B:
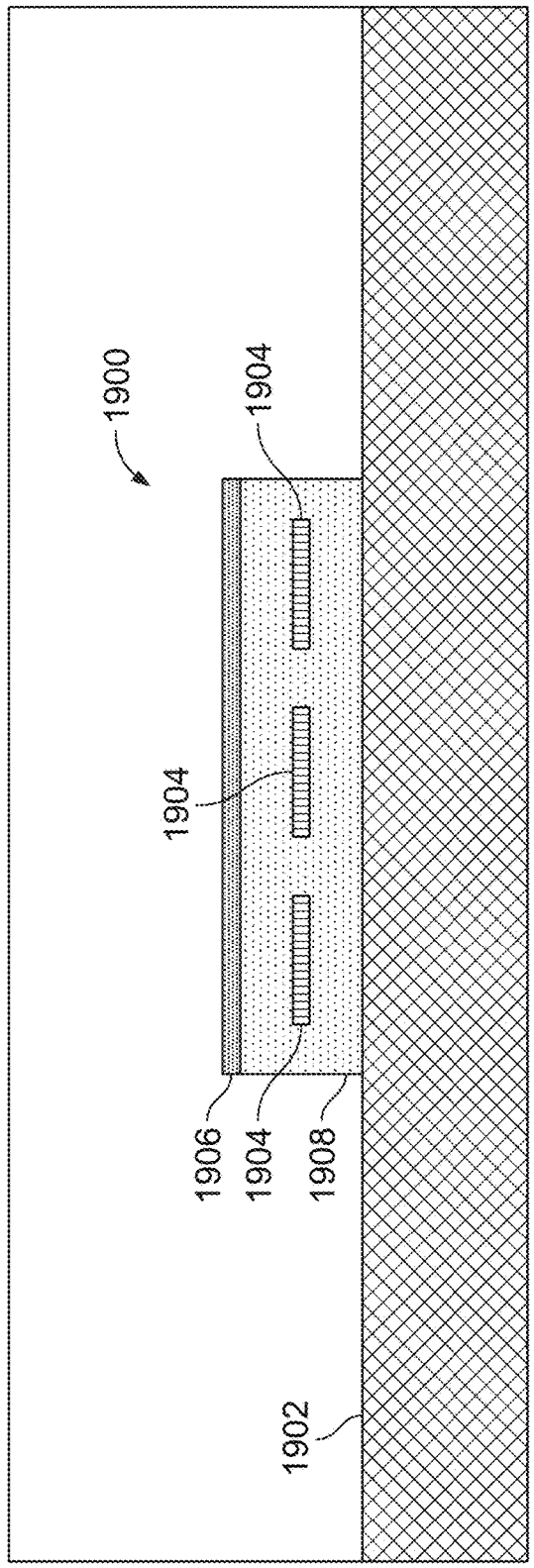
FIG. 24B depicts a cross-sectional view of a coupling strip according to Layout B of FIG. 23 taken at B-B'.

Layout B illustrates a coupling strip 1900 with a conductive layer 1904 in a triple overlap arrangement. The conductive layer 1904 in Layout B includes three segments arranged alongside one another, e.g., in an S-shaped path from the input end 2302 to the termination end 2304. FIG. 24B depicts a cross-sectional view of a coupling strip 1900 according to Layout B taken at B-B'.

Figure 24C:
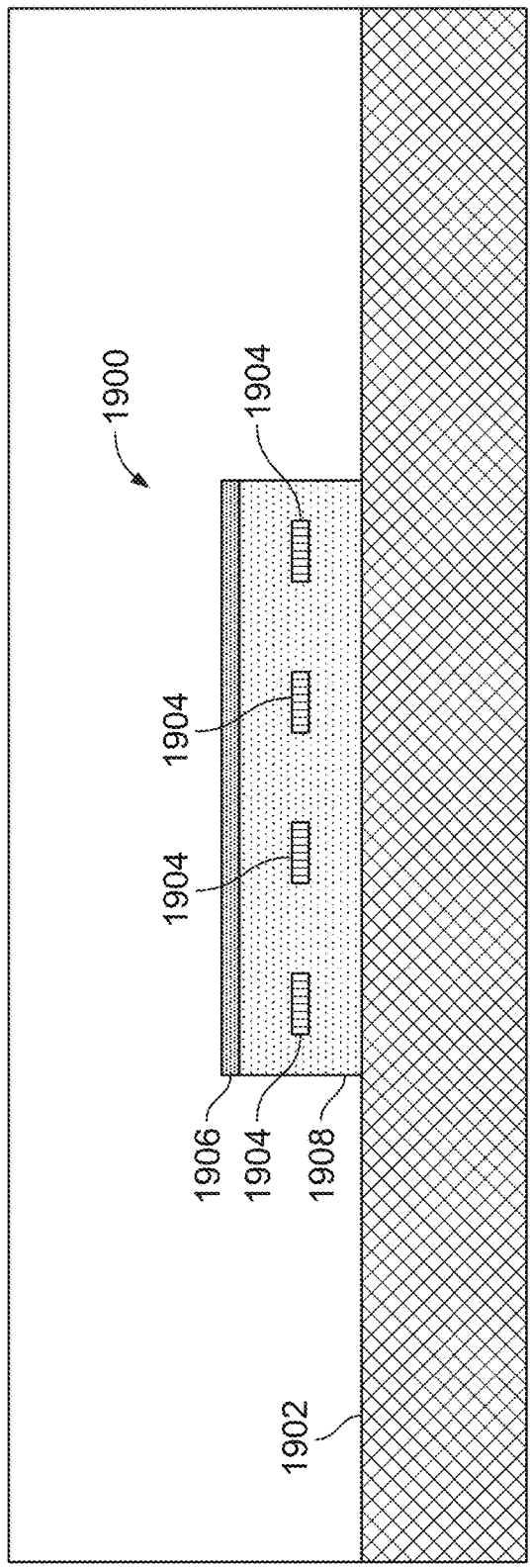
FIG. 24C depicts a cross-sectional view of a coupling strip according to Layout C and Layout D of FIG. 23 taken at C-C'.

Layouts C and D illustrate coupling strips 1900 with a conductive layer 1904 in different variations of a quadruple overlap arrangement. The conductive layer 1904 in each of Layouts C and D includes four segments arranged alongside one another. In Layout C the segments of the conductive layer 1904 are arranged, e.g., in an M-shaped path (or W-Shaped path) from the input end 2302 to the termination end 2304. In Layout D the segments of the conductive layer 1904 are arranged, e.g., as a double overlap arrangement folded alongside itself. A similar technique can also be applied to the trio configuration by folding the trio conductive layer 1904 alongside itself. FIG. 24C depicts a cross-sectional view of a coupling strip 1900 according to Layout C and Layout D taken at C-C'.

Layout E illustrates a more general arrangement for a conductive layer 1904. For instance, Layout E depicts an example of a conductive layer 1904 with multiple segments of different widths positioned alongside one another. Further, in some implementations, a conductive layer 1904 can include interconnections 2306 between segments at various positions between the segments as shown in Layout E. In some implementations, a coupling strip 1900 may also include multiple signal inputs 2302.

Figure 25A:
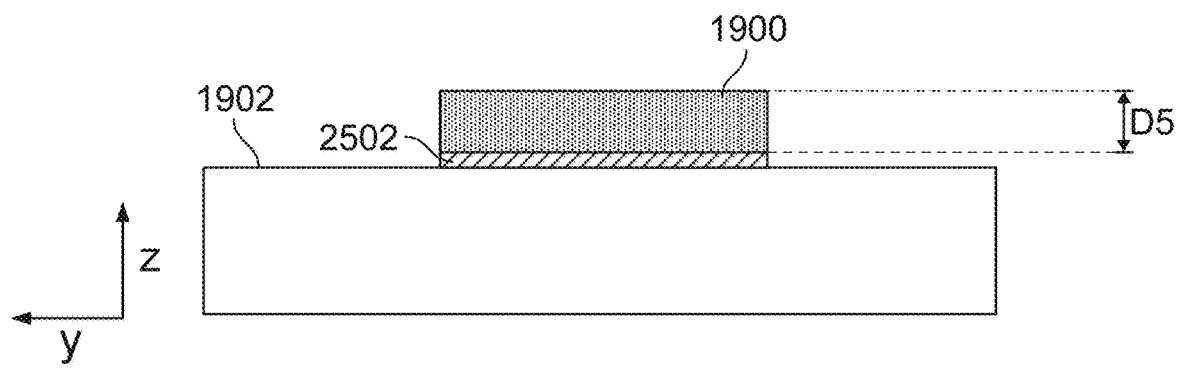
FIG. 25A depicts a cross-sectional view of an exemplary configuration for attaching a coupling strip to a bulk medium.

FIG. 25A depicts a cross-sectional view of an exemplary configuration for attaching a coupling strip 1900 to a bulk medium 1902. More specifically, FIG. 25A depicts a bottom attachment configuration. In a bottom attachment configuration. an adhesive material 2502 disposed between the bottom of the coupling strip 1900 (e.g., the bottom dielectric layer) and the surface of the bulk medium 1902. For example, the adhesive material can be, but is not limited to, a layer of a double-sided adhesive (e.g., a double sided tape), a resin, or an epoxy.

Figure 25B:
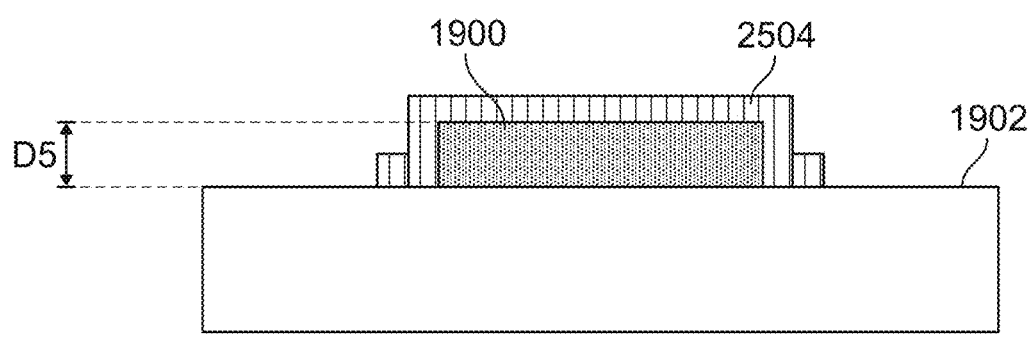
FIG. 25B depicts a cross-sectional view of another exemplary configuration for attaching a coupling strip to a bulk medium.

FIG. 25B depicts a cross-sectional view of another exemplary configuration for attaching a coupling strip 1900 to a bulk medium 1902. More specifically, FIG. 25B depicts a top attachment configuration. In a top attachment configuration an adhesive layer 2504 is applied over the coupling strip 1900 to attach the coupling strip 1900 to the aircraft skin 1902. The adhesive layer 2504 can be, for example, an adhesive coating, an adhesive film, or tape.

Figure 26A:
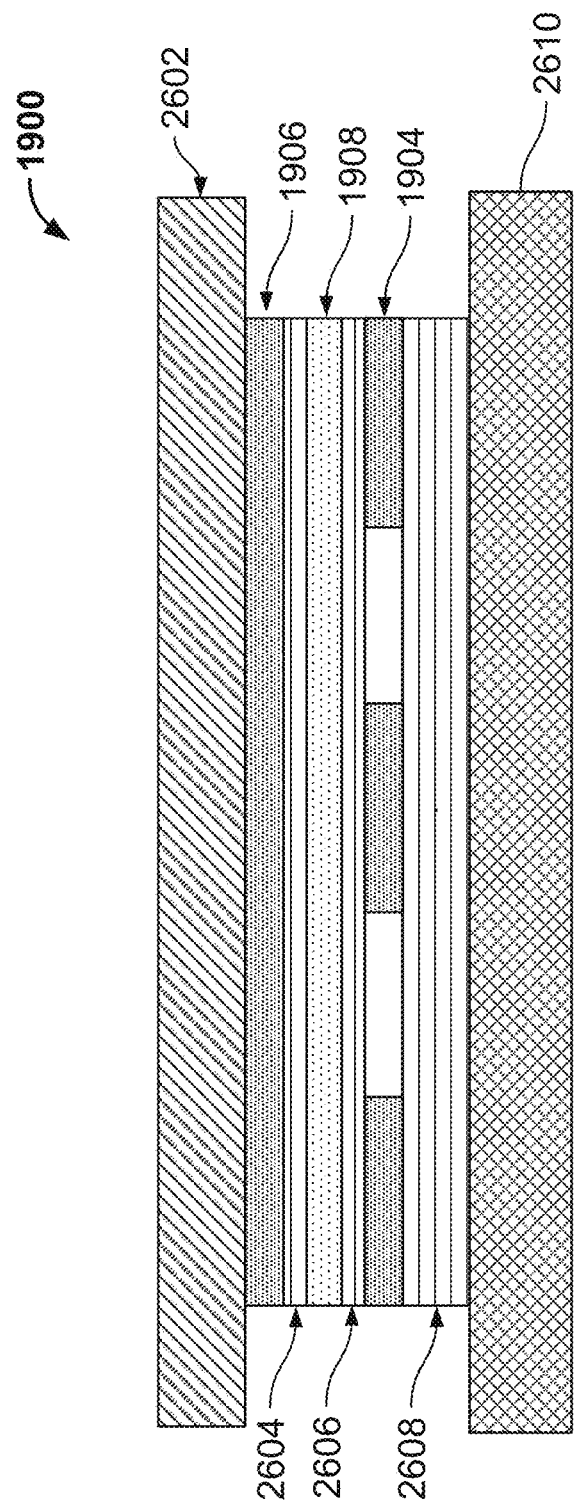
FIG. 26A is a cross-sectional view of a coupling strip with a double sided adhesive bottom layer before installation on a bulk medium.
Figure 26B:
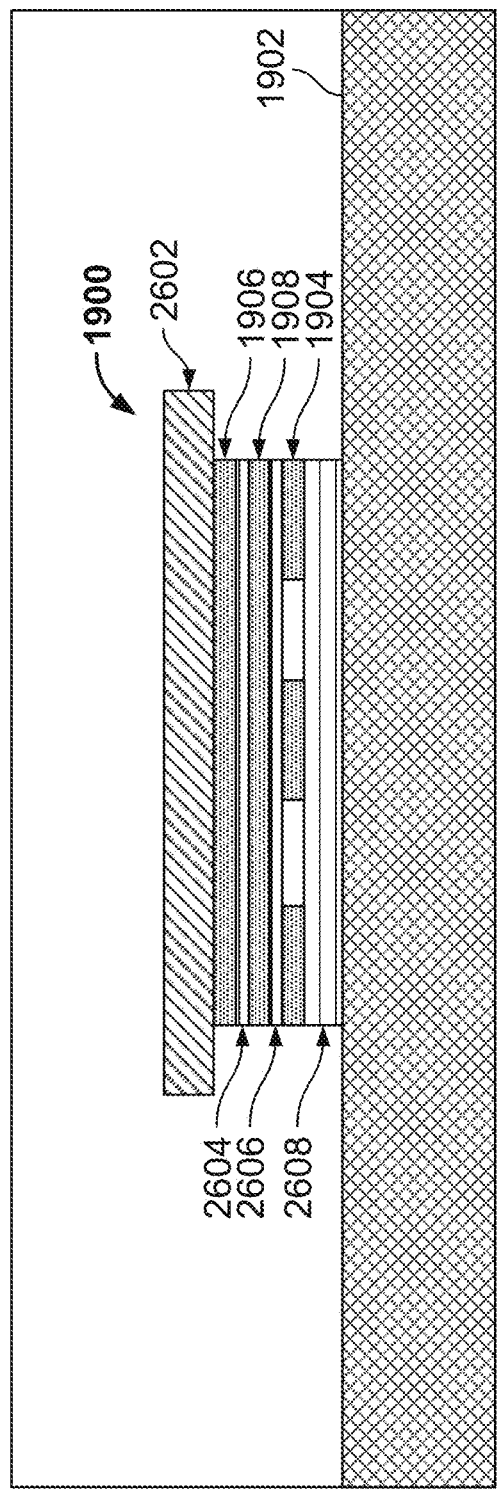
FIG. 26B is a cross-sectional view of the coupling strip of FIG. 26A installed on a bulk medium.

FIG. 26A is a cross-sectional view of a coupling strip 1900 with a double-sided adhesive bottom layer before installation on a bulk medium 1902 and FIG. 26B is a cross-sectional view of the coupling strip 1900 of FIG. 26A installed on a bulk medium 1902. In some implementations such as a bottom attachment configuration, a coupling strip 1900 includes an adhesive bottom layer 2608. The adhesive bottom layer can be formed from a double-sided adhesive material (e.g., a double-sided tape). In such implementations, the double-sided adhesive material can serve as the bottom dielectric layer (e.g., the bottom dielectric layer 1908 of FIG. 19). In some implementations, the adhesive bottom layer 2608 can be, for example, an adhesive coating or adhesive film applied to the bottom surface of the bottom dielectric layer 1908. Prior to installation, a coupling strip 1900 with an adhesive bottom layer 2608 can include a liner 2610 over the adhesive bottom layer 2608. The liner 2610 can be, e.g., a peel-off layer. For instance, the liner 2610 may protect the adhesive bottom layer 2608 prior to installation. During installation, the liner 2610 can be removed from the adhesive bottom layer 2608 to expose an adhesive surface thereof so that the coupling strip 1900 can be attached to the surface of the bulk medium 1902.

In some implementations, one or more of adhesive layers 2604 and 2606 can be included to attach dielectric layer 1908 to the conductive layer 1904 and/or to attach the conductive shielding layer 1906 to the dielectric layer 1908. In some implementations, the coupling strip 1900 includes a protective layer 2602 over the conductive shielding layer 1906. For example, the protective layer 2602 can include, but is not limited to one or more layer of polyurethane, polyflouride, paint, paint replacement film, sealant, or a combination thereof.

In some applications, a non-conductive bulk medium may need to be heated. In such situations the heating systems and coupling strips described herein can be modified to heat a non-conductive bulk medium in such situations. For example, an embedded layer can be used with the coupling strip heating system to heat a non-conductive bulk medium.

Figure 27A:
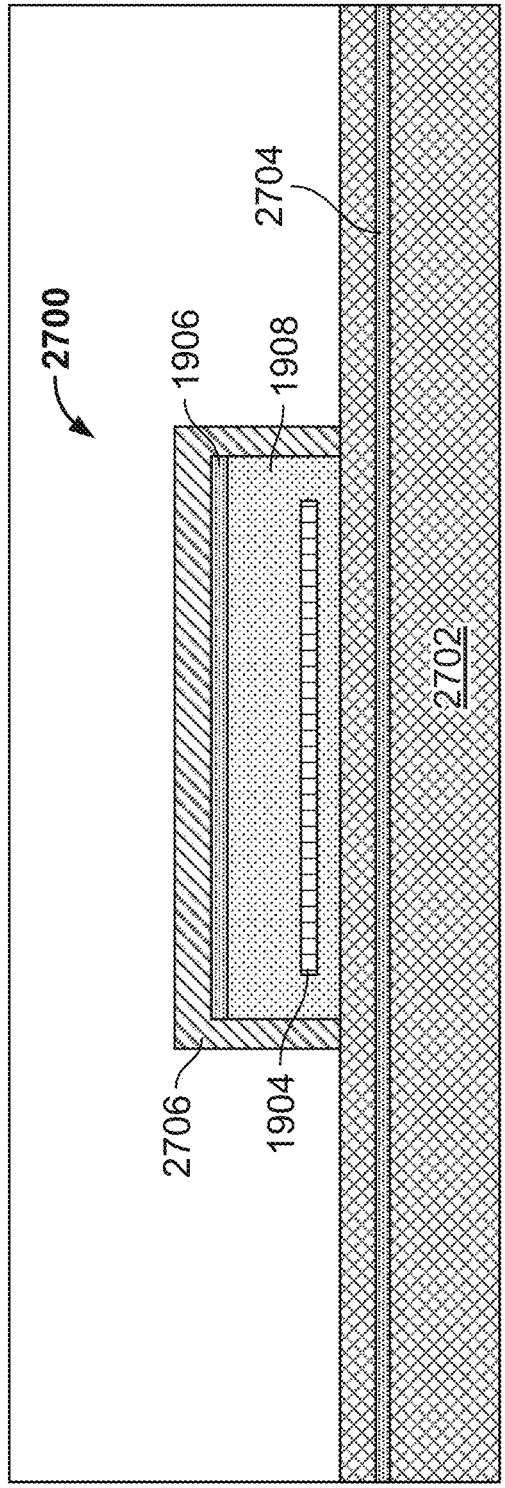
FIGS. 27A-27F depict cross-sectional views of various implementations of embedded coupling strips.

FIGS. 27A-27F depict cross-sectional views of various implementations of embedded coupling strips. FIG. 27A illustrates coupling strip 2700 that is similar to the coupling strip 1900 of FIG. 19. Like coupling strip 1900, coupling strip 2700 includes has a multi-layer structure that includes a first dielectric layer 1908 over the bulk medium 1902, a conductive layer 1904 over the first dielectric layer 1908, a second dielectric layer 1908 over the conductive layer 1904, and a conductive shielding layer 1906 over the second dielectric layer 1908, and optionally, a protective layer 2706 over the conductive shielding layer 1906. Protective layer 2706 is similar to protective layer 2602 described above. Coupling strip 2700 differs from coupling strip 1900 in that it is attached to the surface of a non-conductive bulk medium 2702 and the non-conductive bulk medium 2702 includes a bulk conductive material 2704 embedded therein. For example, the bulk conductive material 2704 can be formed as a metal foil, metal tape, or as a woven metal layer embedded within the non-conductive bulk medium 2702. For example, the non-conductive bulk medium 2702 can be a layered material (e.g., a carbon fiber composite, a fiberglass composite, or a Kevlar composite) with the conductive bulk material 2704 disposed between layers of the non-conductive bulk medium 2702. The bulk conductive material 2704 can be made from conductive materials including, but not limited to, copper, copper alloys (e.g., brass or bronze), silver, silver alloys, aluminum, aluminum alloys, titanium, titanium alloys, chromium, nickel, nickel alloys, cobalt-base alloys, corrosion-resistant steel, graphite, or a combination thereof.

In each of the examples illustrated in FIGS. 27A-27F, AC current passed through the conductive layer 1904 of the coupling strip 2700 generates a heating current in the bulk conductive material 2704 rather than in the non-conductive bulk medium 2702. Heat generated in the bulk conductive material 2704 is then transferred into the non-conductive bulk medium 2702 (e.g., by conduction). In some examples, if the non-conductive bulk medium exhibits some electrical conductive behavior, in addition to the bulk conductive material layer, heat will also generate in the non-conductive portion.

Figure 27B:
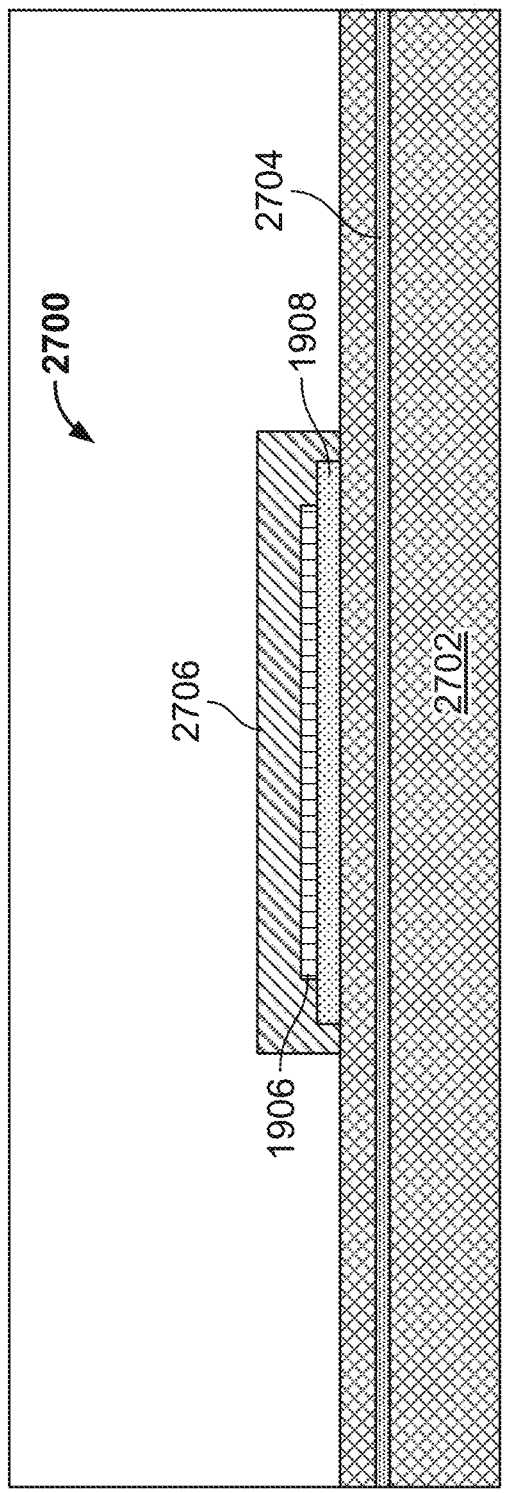

FIG. 27B illustrates an implementation of a coupling strip 2700 that includes only a protective layer 2706, a conductive layer 1904, and a dielectric layer 1908. The coupling strip 2700 is arranged with the protective layer 2706 over the conductive layer 1904, and with the conductive layer 1904 over the dielectric layer 1908. The dielectric layer 1908 separated from the embedded conductive bulk material 2704 by a portion of the non-conductive bulk medium 2702.

Figure 27C:
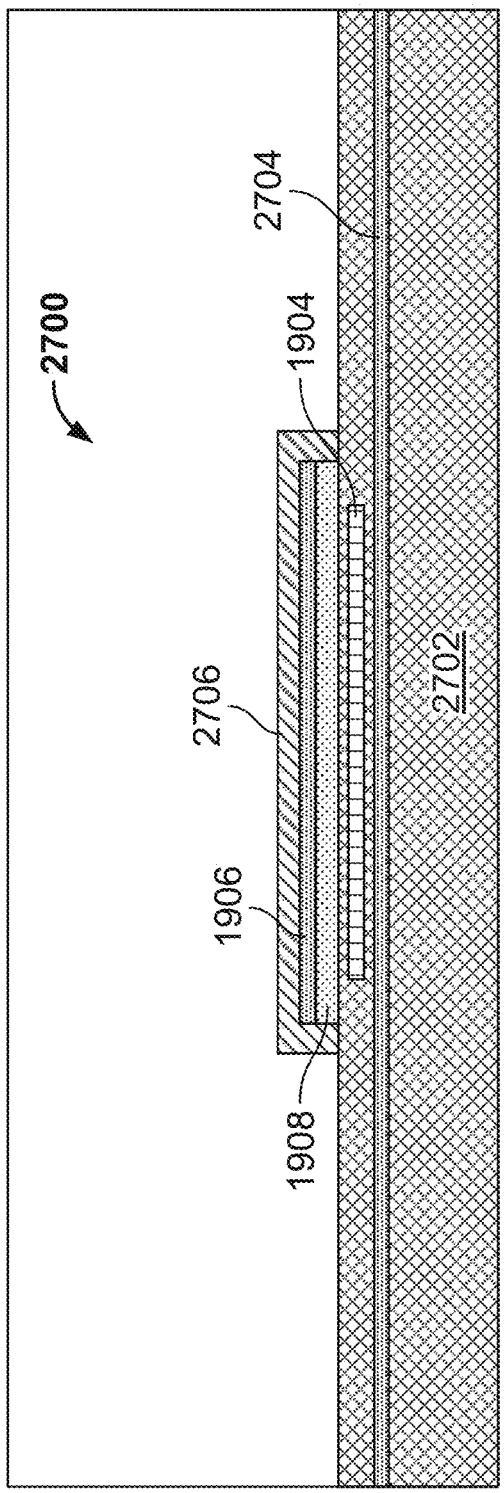

FIG. 27C illustrates an implementation of a coupling strip 2700 that includes a conductive layer 1904 embedded within the non-conductive bulk medium 2702. The coupling strip 2700 in FIG. 27C includes a protective layer 2706, a conductive shielding layer 1906, a dielectric layer 1908, and a conductive layer 1904. The coupling strip 2700 is arranged with the protective layer 2706, the conductive shielding layer 1906, and the dielectric layer 1908 over the conductive layer 1904. The conductive layer 1904 is embedded within the non-conductive bulk medium 2702 and spaced apart from the conductive bulk material 2704 by a portion of the non-conductive bulk medium 2702. For example, conductive layer 1904 and the conductive bulk material 2704 can each be disposed between different layers of the non-conductive bulk medium 2702.

Figure 27D:
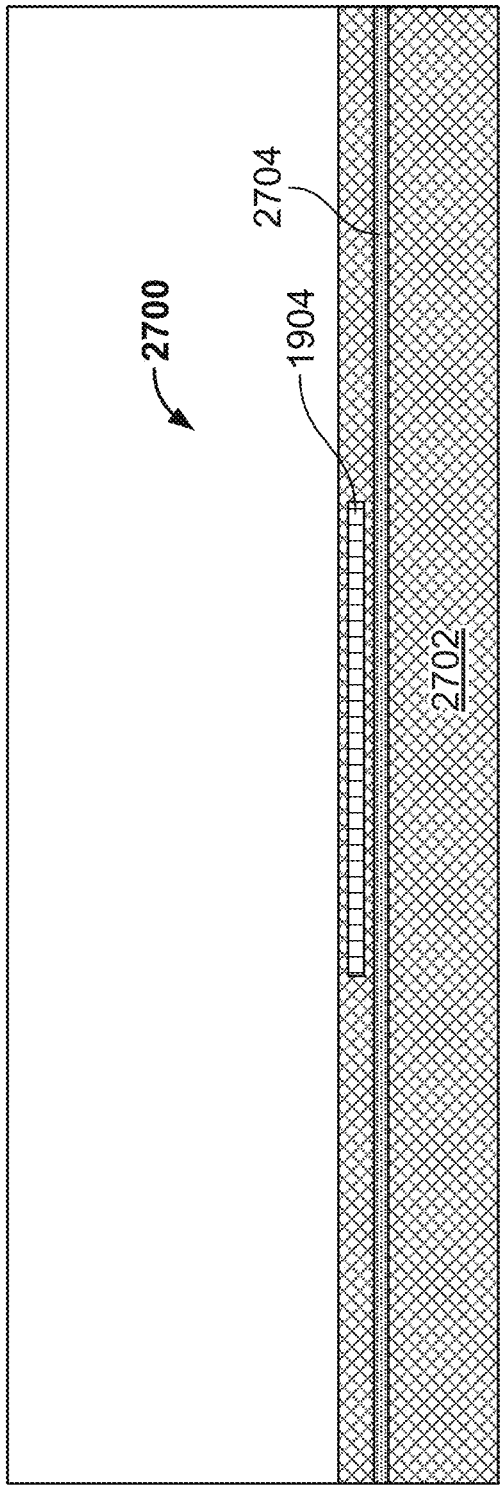

FIG. 27D illustrates a version of the coupling strip 2700 depicted in FIG. 27C, but without the protective layer 2706, conductive shielding layer 1906, and dielectric layer 1908.

Figure 27E:
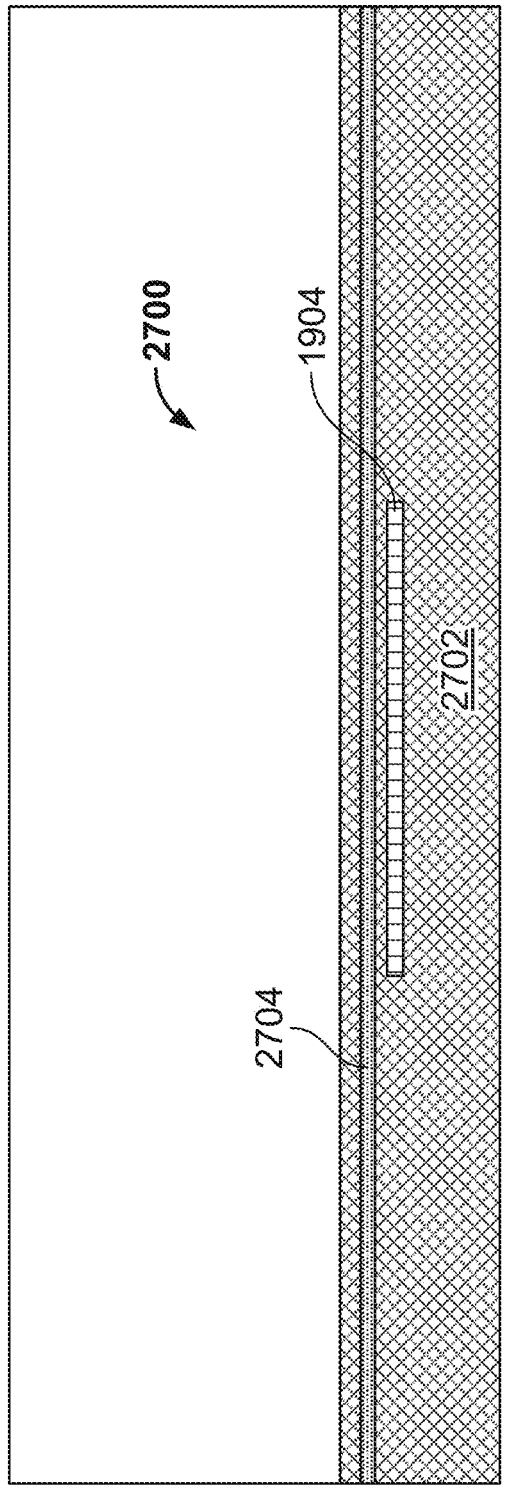

FIG. 27E illustrates a version of the coupling strip 2700 depicted in FIG. 27D, but with orientation of the conductive layer 1904 and the conductive bulk material 2704 reversed. That is, in the coupling strip 2700 arrangement depicted in FIG. 27E the conductive bulk material 2704 is positioned closer to a surface of the non-conductive bulk medium 2702 than the conductive layer 1904.

Figure 27F:
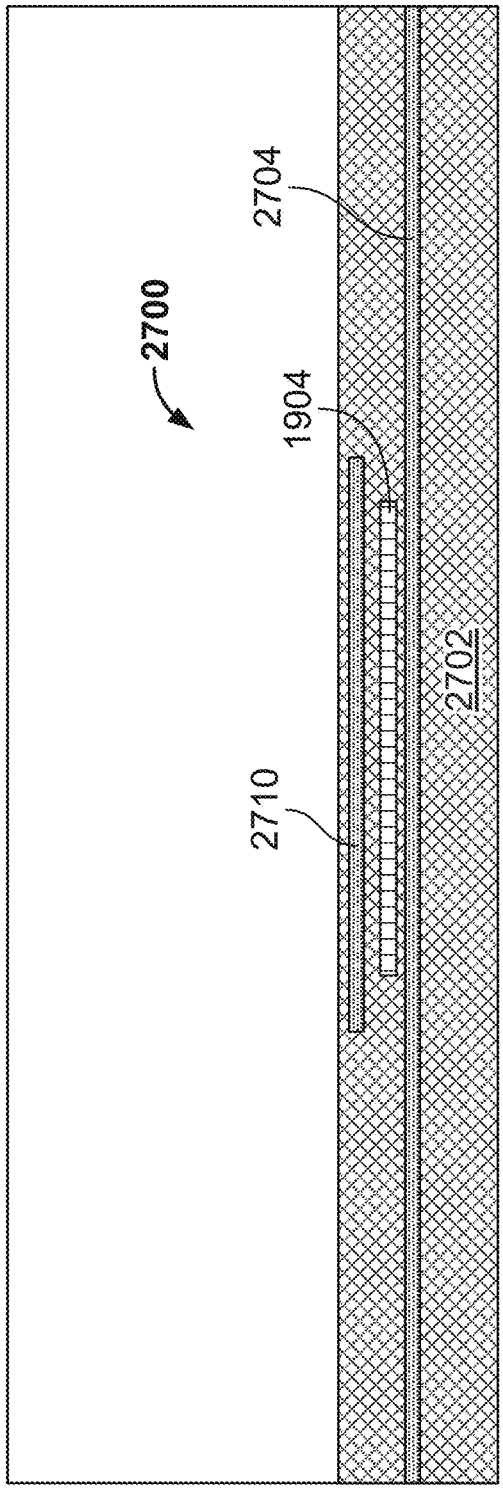

FIG. 27F illustrates an implementation of a coupling strip 2700 that includes a conductive layer 1904 and a conductive shielding layer 1906 embedded within the non-conductive bulk medium 2702. In the coupling strip 2700 arrangement depicted in FIG. 27F portions of the non-conductive bulk medium 2702 (e.g., layers of the non-conductive bulk medium 2702) separate the conductive layer 1904 from the conductive shielding layer 1906 and from the conductive bulk material 2704. The non-conductive bulk medium 2702 serves a similar purpose of the dielectric layers 1908 in coupling strip 1900 shown in FIG. 19.

Figure 28:
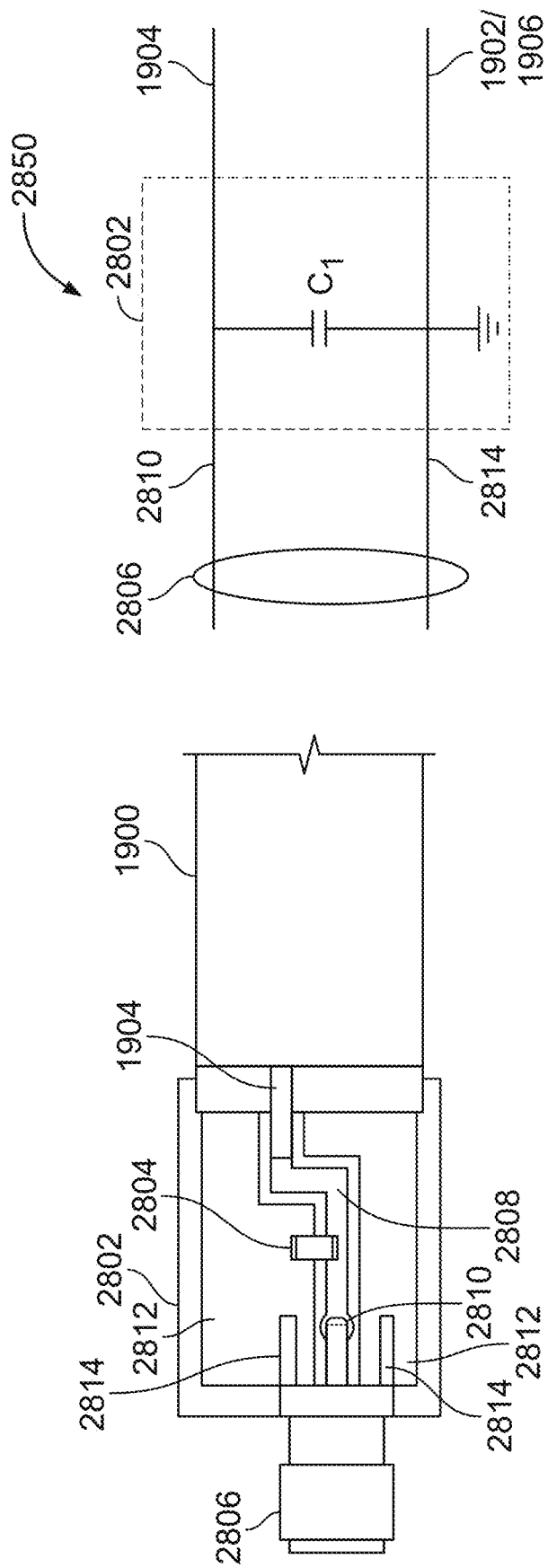
FIG. 28 depicts diagrams of on implementations of coupling strip connector.

FIG. 28 depicts diagrams of one implementations of a coupling strip connector 2802. Diagram 2805 is an circuit diagram of the connector 2802. The connector 2802 includes an integrated impedance adjusting network 2804. The impedance adjusting network 2804 is electrically coupled between an input signal interface 2806 and the coupling strip 1900. For example, the input signal interface 2806 can be a coaxial cable connection. An input terminal 2810 of the input signal interface 2806 (e.g., a center wire of a coaxial cable connection) is coupled to the conductive layer 1904 of the coupling strip 1900 by a wiring 2808. Ground terminal(s) 2814 of the input signal interface 2806 (e.g., the shielding of a coaxial cable connection) is coupled to one or both of the bulk medium 1902 or the conductive shielding layer 1906 of the coupling strip 1900 by one or more wirings 2812.

The impedance adjusting network 2804 is configured to tune the input impedance of the coupling strip 1900 to a desired level as measured at the input signal interface 2806. The impedance adjusting network 2804 can be a fixed or variable impedance adjusting network. For example, the impedance adjusting network 2804 can be implemented as any of the impedance adjusting networks described above in reference to FIGS. 12-15B. In diagram 2850 impedance adjusting network 2804 is implemented as a shunt capacitor C1 between a ground connected to either or both the conductive shielding layer 1906 of the coupling strip 1900 and the bulk medium 1902 (or a bulk conductive material 2704 if implemented for a non-conductive bulk medium).

Figure 29:
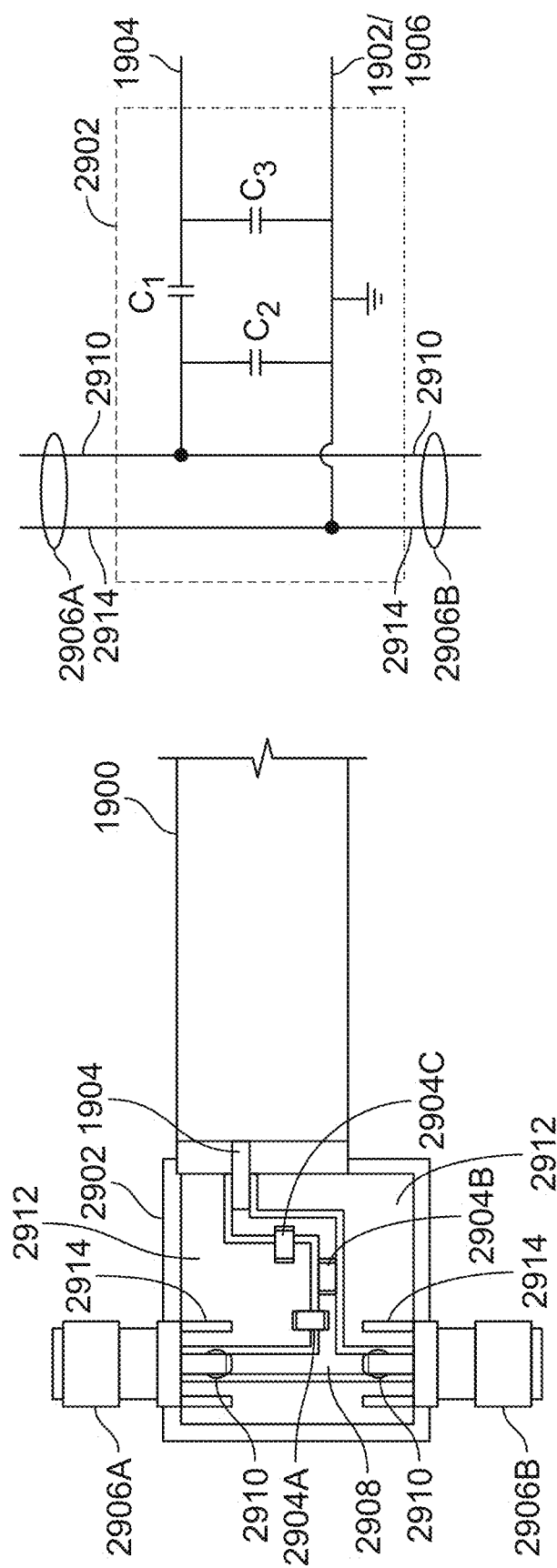
FIG. 29 depicts diagrams of another implementation of a coupling strip connector.

FIG. 29 depicts diagrams of another implementation of a coupling strip connector 2902. The connector 2902 includes two input signal interfaces 2906A and 2906B, e.g., for coupling chaining multiple coupling strips 1900 together. Diagram 2905 is a circuit diagram of the connector 2902. The connector 2902 includes an integrated impedance adjusting network 2904. The impedance adjusting network 2904 includes series and shunt impedance adjusting components 2904A, 2904B, 2904C electrically coupled between the input signal interfaces 2906A, 2906B and the coupling strip 1900. For example, the input signal interfaces 2906A and 2906B can be a coaxial cable connections. Respective input terminals 22910 of the input signal interfaces 2906A, 2906B are coupled to the conductive layer 1904 of the coupling strip 1900 and to each other by a wiring 2808. Respective ground terminal(s) 2914 of the input signal interfaces 2906A, 2906B are coupled to one or both of the bulk medium 1902 or the conductive shielding layer 1906 of the coupling strip 1900 by one or more wirings 2912.

In diagram 2950 impedance adjusting network 2804 is implemented as a series capacitor C1 and two shunt capacitors C2, C3 between a ground connected to either or both the conductive shielding layer 1906 of the coupling strip 1900 and the bulk medium 1902 (or a bulk conductive material 2704 if implemented for a non-conductive bulk medium).

Figure 30:
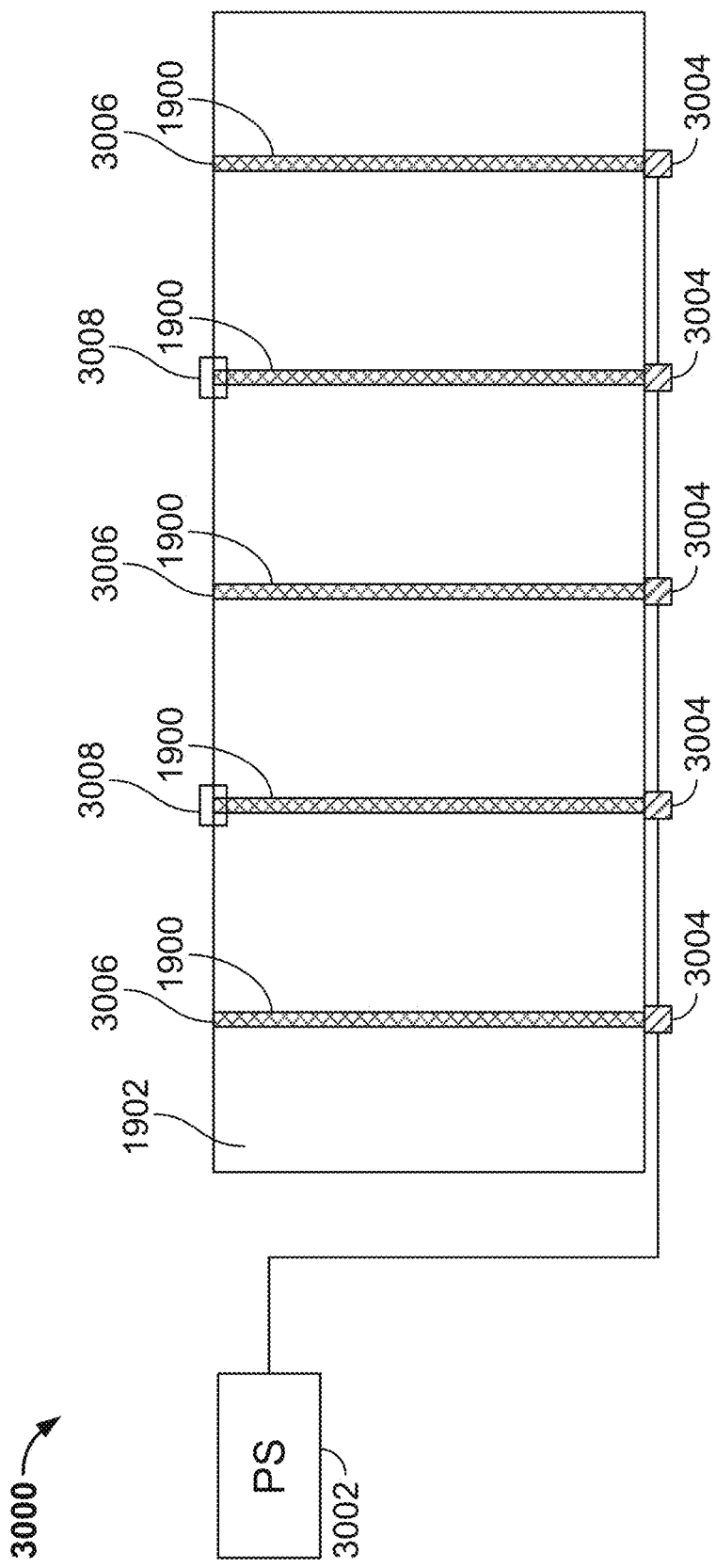
FIG. 30 is a block diagram of a first exemplary bulk medium heating system utilizing coupling strips according to implementations of the present disclosure.

FIG. 30 is a block diagram of a first exemplary bulk medium heating system 3000 utilizing coupling strips 1900 according to implementations of the present disclosure. The heating system 3000 includes a number of coupling strips 1900 spaced apart from one another and attached to the bulk medium 1902 (e.g., an aircraft wing). Each coupling strip 1900 is connected to the power control system 3002. Power control system 3002 can be implemented as any of the embodiments of power control system 104 discussed above. The power control system 3002 feeds each strip with an AC current.

One end of each coupling strip 1900 (referred to herein as the "input end") is coupled to a power control system 3002 through a connector 3004. In the illustrated example, the opposite end of each coupling strip 1900 (referred to herein as the "termination end") has either an open circuit termination 3006 or a closed circuit termination 3008. The coupling strips 1900 are arranged in an alternating pattern where each neighboring pair of coupling strips 1900 has a different type of termination. For example, one coupling strip 1900 in each neighboring pair is provided with an open circuit termination 3006 at its termination end while the other coupling strip 1900 in the pair is provided with a closed circuit termination 3008. The open circuit terminations 3006 indicate that the termination end of the coupling strip 1900 is left as an open circuit; not being connected to an electrical ground through either the bulk medium 1902 or a conductive shielding layer of the coupling strip 1900. In some implementations, the closed circuit terminations 3008 are short circuits between the conductive layer of the coupling strip 1900 and either or both of the bulk medium 1902 or a conductive shielding layer of the coupling strip 1900. In some implementations, the closed circuit terminations 3008 are capacitive terminations where a capacitor is connected between the conductive layer of the coupling strip 1900 and an electrical ground. For example, the capacitor is connected between the conductive layer of the coupling strip 1900 and either the bulk medium 1902 or the conductive shielding layer of the coupling strip 1900. In some implementations, the closed circuit terminations 3008 are inductive terminations where an inductor is connected between the conductive layer of the coupling strip 1900 and an electrical ground. For example, the inductor is connected between the conductive layer of the coupling strip 1900 and either the bulk medium 1902 or the conductive shielding layer of the coupling strip 1900. In some implementations, the closed circuit terminations 3008 are resistive terminations where a resistor is connected between the conductive layer of the coupling strip 1900 and an electrical ground. For example, the resistor is connected between the conductive layer of the coupling strip 1900 and either the bulk medium 1902 or the conductive shielding layer of the coupling strip 1900.

Complementary termination types can be applied to neighboring coupling strips 1900 to provide a desired input impedance at the power control system 3002, to provide a desired heating distribution across the bulk medium 1902, or a combination thereof. For example, coupling strips 1900 can be installed on the bulk medium 1902 with the neighboring coupling strips 1900 having complementary termination types. For example, the terminations of neighboring coupling strips 1900 can alternate between open circuit terminations 3006 and short circuit terminations (e.g., closed circuit termination 3008 implemented as short circuits). In another example, the terminations of neighboring coupling strips 1900 can alternate between closed circuit termination 3008 implemented as capacitive terminations and closed circuit termination 3008 implemented as inductive terminations.

Figure 31:
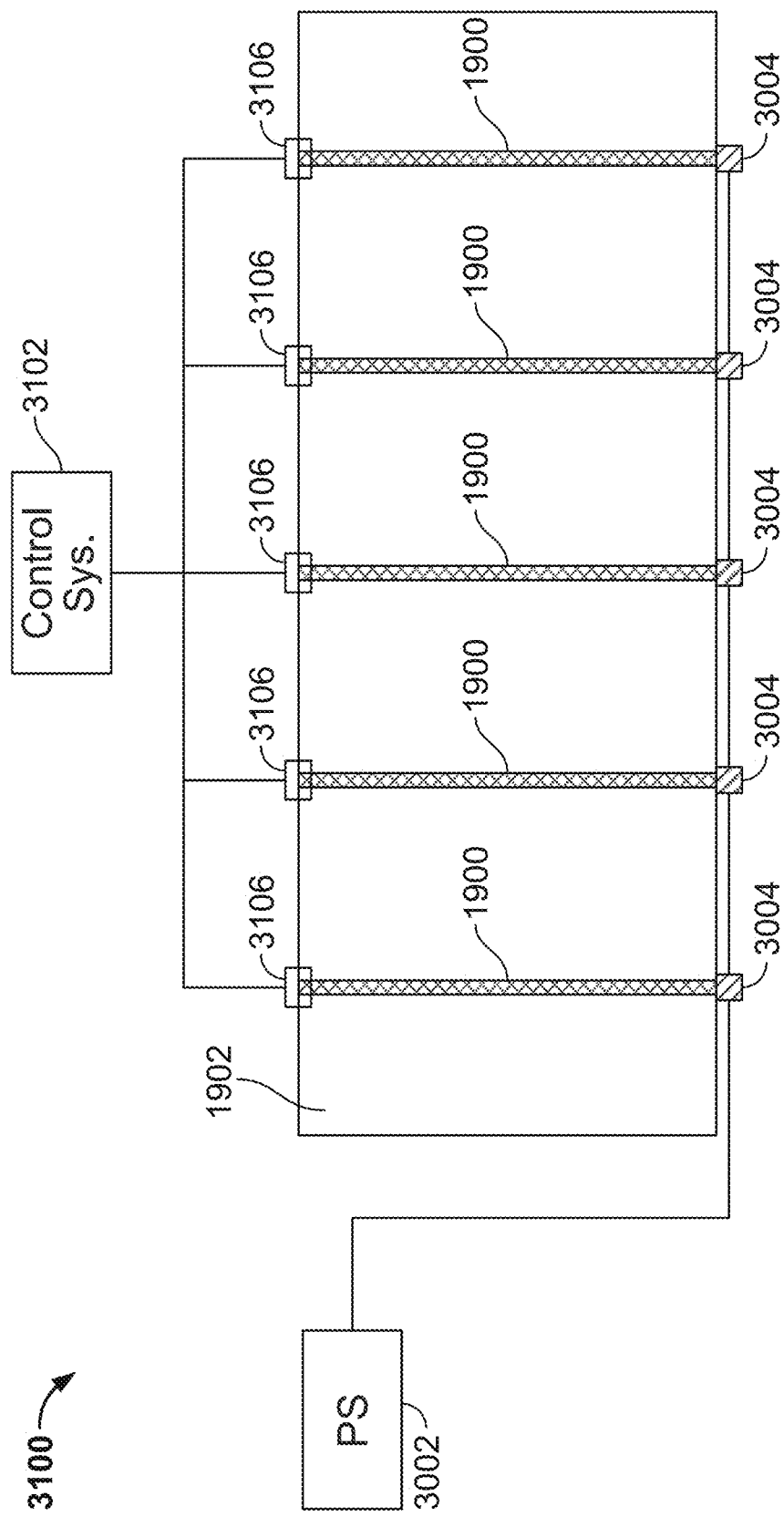
FIG. 31 is a block diagram of a second exemplary bulk medium heating system utilizing coupling strips according to implementations of the present disclosure.

FIG. 31 is a block diagram of a second exemplary bulk medium heating system 3100 utilizing coupling strips 1900 according to implementations of the present disclosure. Heating system 3100 is similar to heating system 3000 described above with the addition of a control system 3102 that is configured to drive variable terminations 3106 attached to the termination end of each coupling strip 1900.

The variable terminations 3106 include a switchable termination. In some implementations, the variable terminations 3106 are configured to switch between a short circuit termination and an open circuit termination. For example, the variable terminations 3106 include a controllable switch coupled between the conductive layer of the coupling strip 1900 and an electrical ground. The controllable switch can be implemented as an electronic switch (e.g., transistor, power diode, thyristor, silicon controlled rectifier, etc.) or a mechanical switch (e.g., relay). For example, the controllable switch is connected between the conductive layer of the coupling strip 1900 and either the bulk medium 1902 or the conductive shielding layer of the coupling strip 1900. An output of the control system is coupled to the control terminal of the controllable switch.

The termination of each coupling strip 1900 can be changed between an open circuit and a short circuit by opening and closing the controllable switch (or turning an electronic switch off and on). For example, the control system 3102 controls the operations of the variable terminations 3106 for a coupling strip 1900 by operating the controllable switch to change the termination type of the coupling strip 1900 as needed to heat the bulk medium 1902. In some implementations, the control system 3102 can control each coupling strip's variable termination 3106 independently. In some implementations, the control system 3102 can control the variable terminations 3106 of a group (e.g., a pair or larger group) of coupling strips in synchronization with each other. In some implementations, the control system 3102 can control the variable terminations 3106 of one or more coupling strips 1900 in regular intervals, e.g., according to regular operating cycle. The operating cycle for switching the variable terminations 3106 can range between 0.01 Hz to 100 Hz.

In some implementations, the control system 3102 controls the operations of the variable terminations 3106 by alternately switching them between open circuit and closed circuit terminations. For example, the control system 3102 switches half of the variable terminations 3106 to short circuit terminations and half of the variable terminations 3106 to open circuit terminations during a first half of an operation cycle. Then, during the second half of the operation cycle, the control system 3102 switches the variable terminations 3106 so that those that were open circuit terminations are switched to closed circuit terminations and vice versa. The operating cycle for switching the variable terminations 3106 can range between 0.01 Hz to 100 Hz.

In some implementations, the variable terminations 3106 of each pair of neighboring coupling strip 1900 are controlled to maintain the opposite type of termination. That is, the control system 3102 controls the variable terminations 3106 such that the termination of one coupling strip 1900 in each neighboring pair is configured as an open circuit and the termination of the other coupling strip 1900 in the pair is configured as an open circuit, with the terminations alternating for each half of an operating cycle.

The control system 3102 can be a computing device with one or more processors or microcontrollers configured to control the operations of the variable terminations 3106. For example, the control system 3102 includes memory storing instructions (e.g., software code) which when executed by the control system cause the control system 3102 to provide appropriate control signals to the controllable switches in the variable terminations 3106. In some implementations, the power control system 3002 and the control system 3102 can be integrated into a common power and control system.

In some implementations, the variable terminations 3106 are configured to switch between a capacitive termination and an inductive termination. For example, the controllable switch can be arranged to switch between coupling the conductive layer of a coupling strip 1900 to a capacitor that is connected to ground or coupling the conductive layer of a coupling strip 1900 to an inductor that is connected to ground. As noted above the ground can be through either the bulk medium 1902 or the conductive shielding layer of the coupling strip 1900. Moreover, in such implementations, the control system 3102 can be operated as described above to alternately switch the variable terminations 3106 between conductive and inductive terminations.

In other implementations, the variable terminations 3106 can be modified to switch between different termination types, e.g., between open circuit terminations and capacitive terminations, between short circuit terminations and inductive terminations, between open circuit terminations and inductive terminations, between short circuit terminations and capacitive terminations, between open circuit terminations and resistive terminations, between short circuit terminations and resistive terminations, or other combinations thereof.

Figure 32:
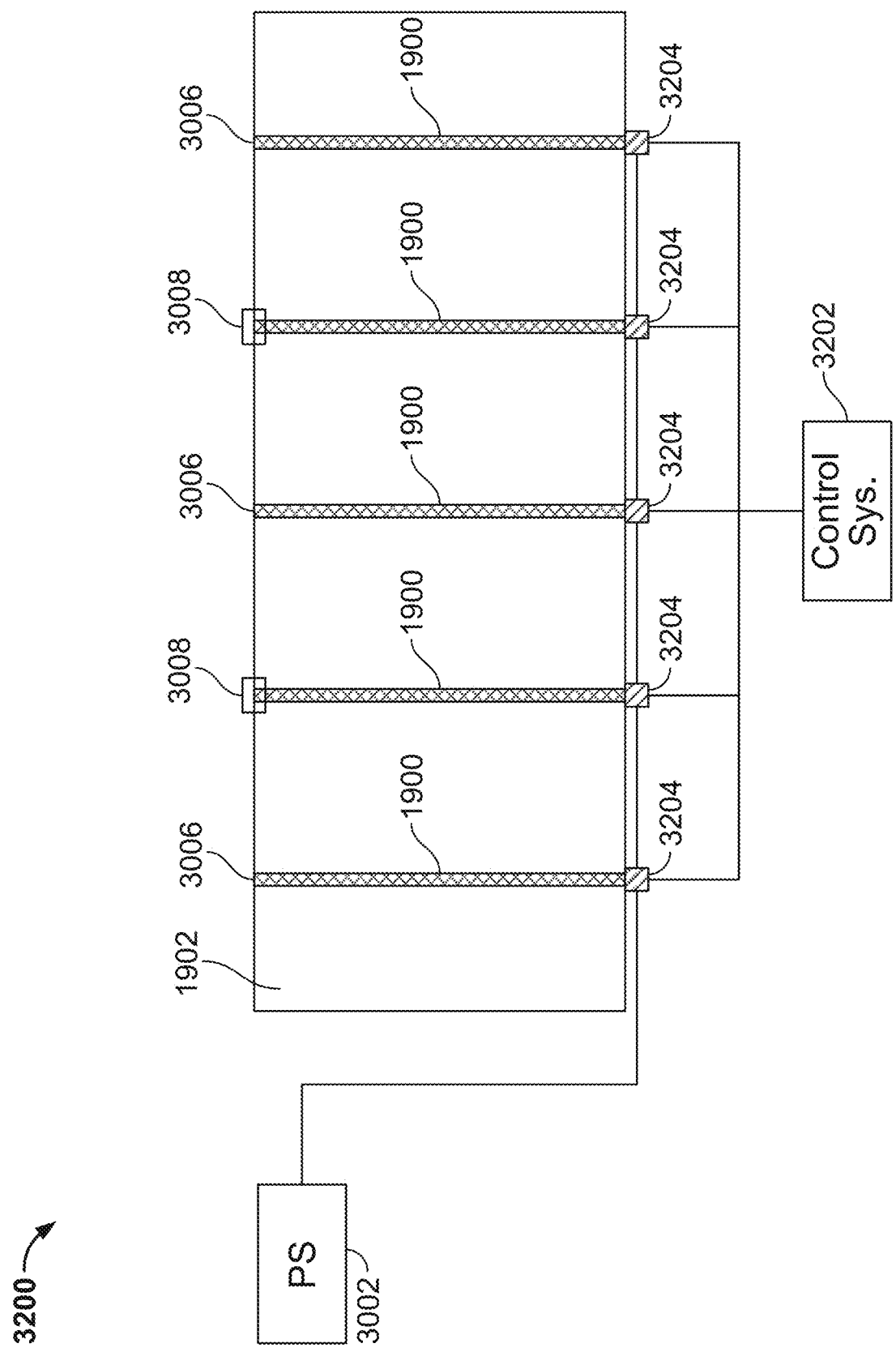
FIG. 32 is a block diagram of a third exemplary bulk medium heating system utilizing coupling strips according to implementations of the present disclosure.

FIG. 32 is a block diagram of a third exemplary bulk medium heating system 3200 utilizing coupling strips according to implementations of the present disclosure. Heating system 3200 is configured to alternately drive neighboring coupling strips 1900. Heating system 3200 is similar to heating system 3000 described above with the addition of a control system 3202 that is configured to drive the switchable connectors 3204 attached to the input end of each coupling strip 1900. The switchable connectors 3204 include a controllable switch arranged to connect and disconnect an associated coupling strip 1900 from the power control system 3002. The controllable switch can be implemented as an electronic switch (e.g., transistor, power diode, thyristor, silicon controlled rectifier, etc.) or a mechanical switch (e.g., relay). For example, the controllable switch is connected between the conductive layer of the coupling strip 1900 and an input terminal of the switchable connector 3204. An output of the control system is coupled to the control terminal of the controllable switch.

The control system 3202 controls the operations of the switchable connector 3204 to alternately connect and disconnect the coupling strips 1900 with the power control system 3002, effectively turning the coupling strips 1900 on and off. For example, the control system 3202 can control the switchable connectors 3204 to alternately turn the coupling strips 1900 on and off. For example, the control system 3202 controls the operations of the switchable connectors 3204 for a coupling strip 1900 by operating the controllable switch to turn the coupling strip 1900 off and on as needed to heat the bulk medium 1902. In some implementations, the control system 3102 can control each coupling strip's variable termination 3106 independently. In some implementations, the control system 3102 can control the variable terminations 3106 of a group (e.g., a pair or larger group) of coupling strips in synchronization with each other. In some implementations, the control system 3102 can control switch the variable terminations 3106 of one or more coupling strips 1900 in regular intervals, e.g., according to regular operating cycle. The operating cycle for switching the variable terminations 3106 can range between 0.01 Hz to 100 Hz. In some implementations, the control system 3202 turns the coupling strips 1900 with open circuit terminations 3006 on and the coupling strips 1900 with closed circuit terminations 3008 off during a first half of the operating cycle. Then, during the second half of the operating cycle, the control system 3202 switches the switchable connectors 3204 to turn the coupling strips 1900 with open circuit terminations 3006 off and the coupling strips 1900 with closed circuit terminations 3008 on.

The control system 3202 can be a computing device with one or more processors or microcontrollers configured to control the operations of the variable terminations 3106. For example, the control system 3202 includes memory storing instructions (e.g., software code) which when executed by the control system cause the control system 3202 to provide appropriate control signals to the controllable switches in the variable terminations 3106. In some implementations, the power control system 3002 and the control system 3202 can be integrated into a common power and control system.

As used herein, the terms "perpendicular" or "substantially perpendicular" or "normal" or "substantially normal" refer to a relation between two elements (e.g., lines, directions, axes, planes, surfaces, or components) that forms a ninety-degree angle within acceptable engineering or measurement tolerances. For example, directions can be considered perpendicular to each other if the angle between the directions is within an acceptable tolerance of ninety degrees (e.g., ±1-2 degrees).

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single embodiment. Conversely, various features that are described in the context of a single embodiment can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software and/or hardware product or packaged into multiple software and/or hardware products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

In addition to the embodiments of the attached claims and the embodiments described above, the following numbered embodiments are also innovative:

Embodiment 1 is a system for heating an exterior surface of a bulk medium, the system comprising: two or more coupling strips spaced apart from one another and attached to the bulk medium, each of the coupling strips comprising a multi-layer structure extending along a surface of the bulk medium that forms, in combination with the bulk medium, an electrical transmission line, the multi-layer structure comprising: a first dielectric layer over the bulk medium, a conductive layer over the first dielectric layer, a second dielectric layer over the conductive layer, and a conductive shielding layer over the second dielectric layer; and a power control system coupled to the conductive layer of each of the coupling strips and to the bulk medium, the power control system configured to heat the surface of the bulk medium by providing electrical current to the coupling strips.

Embodiment 2 is the system of embodiment 1, wherein the power control system is configured to provide electrical current to the coupling strips at an AC frequency between 1 kHz and 450 MHz.

Embodiment 3 is the system of any of embodiments 1 or 2, wherein the conductive layer is positioned within 1 inch of the bulk medium.

Embodiment 4 is the system of any of the previous embodiments, wherein the power control system is configured to provide between 0.1 Amp and 200 Amps of AC current to each coupling strip.

Embodiment 5 is the system of any of the previous embodiments, wherein the conductive layer of at least one of the coupling strips is arranged in a serpentine pattern in which segments of the conductive layer lie alongside one another.

Embodiment 6 is the system of any of the previous embodiments, wherein the conductive layer is separated from the bulk medium by a first distance, wherein the conductive shielding layer is separated from the conductive layer by a second distance, and wherein a ratio between the first distance and the second distance ranges between 1:1 and 1:5.

Embodiment 7 is the system of any of embodiments 1-5, wherein the conductive layer is separated from the bulk medium by a first distance, wherein the conductive shielding layer is separated from the conductive layer by a second distance, and wherein a ratio between the first distance and the second distance ranges between 5:1 and 1:5.

Embodiment 8 is the system of any of embodiments 1-5, wherein the conductive layer is separated from the bulk medium by a first distance, wherein the conductive shielding layer is separated from the conductive layer by a second distance, and wherein a ratio between the first distance and the second distance ranges between 1:1 and 5:1.

Embodiment 9 is the system of any of embodiments 1-5, wherein the first dielectric layer has a first thickness, wherein the second dielectric layer has a second thickness, and wherein a ratio between the first thickness and the second thickness ranges between 1:1 and 1.5.

Embodiment 10 is the system of any of embodiments 1-5, wherein the first dielectric layer has a first thickness, wherein the second dielectric layer has a second thickness, and wherein a ratio between the first thickness and the second thickness ranges between 1:1 and 5:1.

Embodiment 11 is the system of any of the previous embodiments, wherein the conductive layer of at least one of the coupling strips comprises a width across the conductive layer that varies along a length of the conductive layer.

Embodiment 12 is the system of embodiment 11, wherein the conductive layer of at least one of the coupling strips comprises a width across the conductive layer that varies along a length of the conductive layer, wherein the width across the conductive layer varies between a maximum width and a minimum width, and wherein the maximum width is between 1.5 times and 100 times larger than the minimum width.

Embodiment 13 is the system of embodiment 11, wherein the width across the conductive layer varies between a maximum width and a minimum width, and wherein the maximum width is between 1.5 times and 100 times larger than the minimum width.

Embodiment 14 is the system of any of the previous embodiments, wherein the conductive layer of at least one of the coupling strips comprises a plurality of segments with one or more circuit elements coupled between each pair of segments.

Embodiment 15 is the system of embodiment 14, wherein the one or more circuit elements comprise capacitors.

Embodiment 16 is the system of any of the previous embodiments, wherein the conductive layer of at least one of the coupling strips comprises a thickness that varies along a length of the conductive layer.

Embodiment 17 is the system of any of the previous embodiments, wherein the bulk medium forms a second shielding layer for the electrical transmission line formed in combination with each of the coupling strips.

Embodiment 18 is the system of any of the previous embodiments, wherein the conductive layer and the conductive shielding layer each comprise at least one of copper, silver, or aluminum.

Embodiment 19 is the system of any of the previous embodiments, wherein the conductive layer comprises titanium.

Embodiment 20 is the system of any of the previous embodiments, wherein the conductive shielding layer comprises at least one of copper foil, aluminum foil, or a woven shield material.

Embodiment 21 is the system of any of the previous embodiments, wherein the first dielectric layer and the second dielectric layer each comprise at least one of Kapton or mylar.

Embodiment 22 is the system of any of the previous embodiments, wherein the first dielectric layer and the second dielectric layer comprise at least one of Polyethylene Terephthalate (PET), Polytetraflouroethylene (PTFE), or rubber.

Embodiment 23 is the system of any of the previous embodiments, wherein the multi-layer structure further comprises a protective layer over the conductive shielding layer.

Embodiment 24 is the system of any of the previous embodiments, wherein the first dielectric layer comprises an adhesive material.

Embodiment 25 is the system of any of the previous embodiments, wherein the multi-layer structure further comprises: a first adhesive layer between the conductive layer and the second dielectric layer; and a second adhesive layer between the second dielectric layer and the conductive shielding layer.

Embodiment 26 is the system of any of the previous embodiments, wherein each coupling strip comprises a first end and a termination end, wherein the conductive layer of each coupling strip is coupled to the power control system at the first end, and wherein at least one of the coupling strips comprises an electrically conductive path to an electrical ground at the termination end.

Embodiment 27 is the system of embodiment 26, wherein the electrical ground comprises the bulk medium.

Embodiment 28 is the system of embodiment 26, wherein the electrical ground comprises the conductive shielding layer of the at least one coupling strip.

Embodiment 29 is the system of any of the previous embodiments, wherein each coupling strip comprises a first end and a termination end, wherein the conductive layer of each coupling strip is coupled to the power control system at the first end, and wherein at least one of the coupling strips comprises an open circuit between the conductive layer and electrical ground at the termination end.

Embodiment 30 is the system of embodiment 29, wherein the electrical ground comprises the bulk medium.

Embodiment 31 is the system of embodiment 29, wherein the electrical ground comprises the conductive shielding layer of the at least one coupling strip.

Embodiment 32 is the system of any of the previous embodiments, wherein each coupling strip comprises a first end and a termination end, wherein the conductive layer of each coupling strip is coupled to the power control system at the first end, and wherein at least one of the coupling strips comprises a circuit element coupled between the conductive layer and an electrical ground at the termination end, the circuit element comprising at least one of a capacitor, an inductor, or a resistor.

Embodiment 33 is the system of embodiment 32, wherein the electrical ground comprises the bulk medium.

Embodiment 34 is the system of embodiment 32, wherein the electrical ground comprises the conductive shielding layer of the at least one coupling strip.

Embodiment 35 is the system of any of the previous embodiments, wherein each coupling strip comprises a first end and a termination end, wherein the conductive layer of each coupling strip is coupled to the power control system at the first end, wherein a first coupling strip in each neighboring pair of coupling strips alternately comprises an open circuit between the conductive layer and an electrical ground at the termination end, and wherein a second coupling strip in each neighboring pair of coupling strips alternately comprises an electrically conductive path to the electrical ground at the termination end.

Embodiment 36 is the system of embodiment 34, wherein the electrical ground comprises the bulk medium.

Embodiment 37 is the system of embodiment 34, wherein the electrical ground comprises the respective conductive shielding layer of the first and second coupling strip.

Embodiment 38 is the system of embodiment 34, wherein the power control system is configured to alternate between providing the electrical current to the first coupling strip in each neighboring pair of coupling strips and providing the electrical current to the second coupling strip in each neighboring pair of coupling strips.

Embodiment 39 is the system of any of the previous embodiments, wherein each coupling strip comprises a first end and a termination end, wherein the conductive layer of each coupling strip is coupled to the power control system at the first end, wherein a first coupling strip in each neighboring pair of coupling strips alternately comprises a capacitor coupled between the conductive layer and an electrical ground at the termination end, and wherein a second coupling strip in each neighboring pair of coupling strips alternately comprises an inductor coupled between the conductive layer and an electrical ground at the termination end.

Embodiment 40 is the system of embodiment 39, wherein the electrical ground comprises the bulk medium.

Embodiment 41 is the system of embodiment 39, wherein the electrical ground comprises the respective conductive shielding layer of the first and second coupling strip.

Embodiment 42 is the system of embodiment 39, wherein the power control system is configured to alternate between providing the electrical current to the first coupling strip in each neighboring pair of coupling strips and providing the electrical current to the second coupling strip in each neighboring pair of coupling strips.

Embodiment 43 is the system of any of the previous embodiments, wherein each coupling strip comprises a first end and a termination end, wherein the conductive layer of each coupling strip is coupled to the power control system at the first end, and wherein each coupling strip comprises a switch coupled, at the termination end, between the conductive layer and one or both of the bulk medium or the conductive shielding layer, when in a first state, the switch forms an open circuit between the conductive layer and the bulk medium or the conductive shielding layer and, when in a second state, the switch forms a closed circuit between the conductive layer and an electrical ground.

Embodiment 44 is the system of embodiment 43, wherein the electrical ground is the bulk medium.

Embodiment 45 is the system of embodiment 43, wherein the electrical ground is the conductive shielding layer.

Embodiment 46 is the system of any of the previous embodiments, wherein the two or more coupling strips are electrically coupled together in parallel with one another.

Embodiment 47 is the system of any of the previous embodiments, wherein the two or more coupling strips are electrically coupled together in a series with one another.

Embodiment 48 is the system of any of the previous embodiments, wherein the bulk medium comprises an bulk medium, a wind turbine blade, a roof of a building, or railroad tracks.

Embodiment 49 is a system for heating an exterior of a structure, the system comprising: a structure to be heated, the structure made from a non-conductive material and comprising a bulk conductive material embedded therein; two or more coupling strips spaced apart from one another and attached to the structure, each of the coupling strips comprising a multi-layer structure extending along the structure that forms, in combination with the bulk conductive material embedded within the structure, an electrical transmission line, the multi-layer structure comprising: a conductive layer overlapping the bulk conductive material, and a first dielectric layer between the bulk conductive material and the first conductive layer; and a power control system coupled to the conductive layer of each of the coupling strips and to the structure, the power control system configured to heat the exterior of the structure by providing electrical current to the coupling strips.

Embodiment 50 is the system of embodiment 49, wherein each coupling strip extends along a surface of the structure, and wherein the multi-layer structure further comprises a protective layer over the conductive layer.

Embodiment 51 is the system of embodiment 49, wherein each coupling strip extends along a surface of the structure, and wherein the multi-layer structure further comprises: a conductive shielding layer over the conductive layer, a second dielectric layer between the conductive layer and the conductive shielding layer, and a protective layer over the conductive shielding layer.

Embodiment 52 is the system of embodiment 49, wherein a portion of each coupling strip extends along a surface of the structure, wherein the conductive layer is embedded within the structure, wherein a portion of the structure forms the first dielectric layer, and wherein the multi-layer structure further comprises: a conductive shielding layer over the conductive layer, a second dielectric layer between the conductive layer and the conductive shielding layer, and a protective layer over the conductive shielding layer.

Embodiment 53 is the system of embodiment 49, wherein the conductive layer is embedded within the structure, and wherein a first portion of the structure forms the first dielectric layer, and wherein the multi-layer structure further comprises: a conductive shielding layer embedded within the structure and overlapping the conductive layer, and a second dielectric layer formed by a second portion of the structure and positioned between the conductive layer and the conductive shielding layer.

Embodiment 54 is the system of embodiment 49, wherein the conductive layer is embedded within the structure, and wherein a portion of the structure forms the first dielectric layer.

Embodiment 55 is the system of any of embodiments 49-54, wherein the power control system is configured to provide electrical current to the coupling strips at an AC frequency between 1 kHz and 450 MHz.

Embodiment 56 is the system of any of embodiments 49-55, wherein the conductive layer is positioned within 1 inch of the bulk conductive material.

Embodiment 57 is the system of any of embodiments 49-56, wherein the power control system is configured to provide between 0.1 Amp and 200 Amps of AC current to each coupling strip.

Embodiment 58 is the system of any of embodiments 49-57, wherein the conductive layer of at least one of the coupling strips is arranged in a serpentine pattern in which segments of the conductive layer lie alongside one another.

Embodiment 59 is the system of any of embodiments 51-53, wherein the conductive layer is separated from the bulk conductive material by a first distance, wherein the conductive shielding layer is separated from the conductive layer by a second distance, and wherein a ratio between the first distance and the second distance ranges between 1:1 and 1:5.

Embodiment 60 is the system of any of embodiments 51-53, wherein the conductive layer is separated from the bulk conductive material by a first distance, wherein the conductive shielding layer is separated from the conductive layer by a second distance, and wherein a ratio between the first distance and the second distance ranges between 1:1 and 5:1.

Embodiment 61 is the system of any of embodiments 49-60, wherein the conductive layer of at least one of the coupling strips comprises a width across the conductive layer that varies along a length of the conductive layer.

Embodiment 62 is the system of embodiment 61, wherein the width across the conductive layer varies between a maximum width and a minimum width, and wherein the maximum width is between 1.5 times and 100 times larger than the minimum width.

Embodiment 63 is the system of any of embodiments 49-62, wherein the conductive layer of at least one of the coupling strips comprises a plurality of segments with one or more circuit elements coupled between each pair of segments.

Embodiment 64 is the system of embodiment 63, wherein the one or more circuit elements comprise capacitors.

Embodiment 65 is the system of any of embodiments 49-64, wherein the conductive layer of at least one of the coupling strips comprises a thickness that varies along a length of the conductive layer.

Embodiment 66 is the system of any of embodiments 49-65, wherein the bulk conductive material forms a second shielding layer for the electrical transmission line formed in combination with each of the coupling strips.

Embodiment 67 is the system of any of embodiments 51-53, wherein the conductive layer and the conductive shielding layer each comprise at least one of copper, silver, or aluminum.

Embodiment 68 is the system of any of embodiments 49-67, wherein the conductive layer comprises titanium.

Embodiment 69 is the system of any of embodiments 51-53, wherein the conductive shielding layer comprises at least one of copper foil, aluminum foil, or a woven shield material.

Embodiment 70 is the system of any of embodiments 49-69, wherein each coupling strip comprises a first end and a termination end, wherein the conductive layer of each coupling strip is coupled to the power control system at the first end, and wherein at least one of the coupling strips comprises an electrically conductive path coupled between the conductive layer and the bulk conductive material at the termination end.

Embodiment 71 is the system of any of embodiments 49-70, wherein each coupling strip comprises a first end and a termination end, wherein the conductive layer of each coupling strip is coupled to the power control system at the first end, and wherein at least one of the coupling strips comprises an open circuit between the conductive layer and the bulk conductive material at the termination end.

Embodiment 72 is the system of any of embodiments 49-71, wherein each coupling strip comprises a first end and a termination end, wherein the conductive layer of each coupling strip is coupled to the power control system at the first end, and wherein at least one of the coupling strips comprises a circuit element coupled between the conductive layer and the bulk conductive material at the termination end, the circuit element comprising at least one of a capacitor, an inductor, or a resistor.

Embodiment 73 is the system of any of embodiments 49-72, wherein each coupling strip comprises a first end and a termination end, wherein the conductive layer of each coupling strip is coupled to the power control system at the first end, wherein a first coupling strip in each neighboring pair of coupling strips alternately comprises an open circuit between the conductive layer and the bulk conductive material at the termination end, and wherein a second coupling strip in each neighboring pair of coupling strips alternately comprises an electrically conductive path coupled between the conductive layer and the bulk conductive material at the termination end.

Embodiment 74 is the system of embodiment 73, wherein the power control system is configured to alternate between providing the electrical current to the first coupling strip in each neighboring pair of coupling strips and providing the electrical current to the second coupling strip in each neighboring pair of coupling strips.

Embodiment 75 is the system of any of embodiments 49-74, wherein each coupling strip comprises a first end and a termination end, wherein the conductive layer of each coupling strip is coupled to the power control system at the first end, wherein a first coupling strip in each neighboring pair of coupling strips alternately comprises a capacitor coupled between the conductive layer and the bulk conductive material at the termination end, and wherein a second coupling strip in each neighboring pair of coupling strips alternately comprises an inductor coupled between the conductive layer and the bulk conductive material at the termination end.

Embodiment 76 is the system of embodiment 75, wherein the power control system is configured to alternate between providing the electrical current to the first coupling strip in each neighboring pair of coupling strips and providing the electrical current to the second coupling strip in each neighboring pair of coupling strips.

Embodiment 77 is the system of any of embodiments 49-76, wherein each coupling strip comprises a first end and a termination end, wherein the conductive layer of each coupling strip is coupled to the power control system at the first end, and wherein at least one of the coupling strips comprises an electrically conductive path to an electrical ground at the termination end.

Embodiment 78 is the system of embodiment 77, wherein the electrical ground comprises the conductive bulk material.

Embodiment 79 is the system of embodiment 77, wherein the electrical ground comprises the conductive shielding layer of the at least one coupling strip.

Embodiment 80 is the system of any of embodiments 49-79, wherein each coupling strip comprises a first end and a termination end, wherein the conductive layer of each coupling strip is coupled to the power control system at the first end, and wherein at least one of the coupling strips comprises an open circuit between the conductive layer and an electrical ground at the termination end.

Embodiment 81 is the system of embodiment 80, wherein the electrical ground comprises the conductive bulk material.

Embodiment 82 is the system of embodiment 80, wherein the electrical ground comprises the conductive shielding layer of the at least one coupling strip.

Embodiment 83 is the system of any of embodiments 49-82, wherein each coupling strip comprises a first end and a termination end, wherein the conductive layer of each coupling strip is coupled to the power control system at the first end, and wherein at least one of the coupling strips comprises a circuit element coupled between the conductive layer and an electrical ground at the termination end, the circuit element comprising at least one of a capacitor, an inductor, or a resistor.

Embodiment 84 is the system of embodiment 71, wherein the electrical ground comprises the conductive bulk material.

Embodiment 85 is the system of embodiment 71, wherein the electrical ground comprises the conductive shielding layer of the at least one coupling strip.

Embodiment 86 is the system of any of embodiments 49-85, wherein each coupling strip comprises a first end and a termination end, wherein the conductive layer of each coupling strip is coupled to the power control system at the first end, wherein a first coupling strip in each neighboring pair of coupling strips alternately comprises an open circuit between the conductive layer and an electrical ground at the termination end, and wherein a second coupling strip in each neighboring pair of coupling strips alternately comprises an electrically conductive path coupled between the conductive layer and the electrical ground at the termination end.

Embodiment 87 is the system of embodiment 87, wherein the power control system is configured to alternate between providing the electrical current to the first coupling strip in each neighboring pair of coupling strips and providing the electrical current to the second coupling strip in each neighboring pair of coupling strips.

Embodiment 88 is the system of any of embodiments 49-87, wherein each coupling strip comprises a first end and a termination end, wherein the conductive layer of each coupling strip is coupled to the power control system at the first end, wherein a first coupling strip in each neighboring pair of coupling strips alternately comprises a capacitor coupled between the conductive layer and an electrical ground at the termination end, and wherein a second coupling strip in each neighboring pair of coupling strips alternately comprises an inductor coupled between the conductive layer and an electrical ground at the termination end.

Embodiment 89 is the system of embodiment 88, wherein the electrical ground comprises the conductive bulk material.

Embodiment 90 is the system of embodiment 88, wherein the electrical ground comprises the respective conductive shielding layer of the first and second coupling strip.

Embodiment 91 is the system of embodiment 88, wherein the power control system is configured to alternate between providing the electrical current to the first coupling strip in each neighboring pair of coupling strips and providing the electrical current to the second coupling strip in each neighboring pair of coupling strips.

Embodiment 92 is the system of any of embodiments 51-53, wherein each coupling strip comprises a first end and a termination end, wherein the conductive layer of each coupling strip is coupled to the power control system at the first end, and wherein each coupling strip comprises an switch coupled, at the termination end, between the conductive layer and one or both of the bulk conductive material or the conductive shielding layer, when in a first state, the switch forms an open circuit between the conductive layer and the bulk conductive material or the conductive shielding layer and, when in a second state, the switch forms a closed circuit between the conductive layer and an electrical ground.

Embodiment 93 is the system of embodiment 92, wherein the electrical ground comprises the conductive bulk material.

Embodiment 94 is the system of embodiment 92, wherein the electrical ground comprises the respective conductive shielding layer of the first and second coupling strip.

Embodiment 95 is the system of any of embodiments 49-94, wherein the two or more coupling strips are electrically coupled together in parallel with one another.

Embodiment 96 is the system of any of embodiments 49-95, wherein the two or more coupling strips are electrically coupled together in a series with one another.

Embodiment 97 is the system of any of embodiments 49-96, wherein the structure comprises an aircraft skin, a wind turbine blade, a roof of a building, or railroad tracks.

Embodiment 98 is a method of installing an bulk medium heating system, the method comprising: obtaining coupling strips, wherein each coupling strip comprises a multi-layer structure comprising: a first dielectric layer, a conductive layer overlapping the first dielectric layer, a conducive shielding layer overlapping the conductive layer, and a second dielectric layer between the conductive layer and the conducive shielding layer; attaching each of the coupling strips to a surface of an bulk medium and spaced apart from one another with the first dielectric layer of each coupling strip positioned between the bulk medium and the conductive layer; and coupling the conductive layer of each of the coupling strips to a power control system that is configured to provide electrical current to the coupling strips.

Embodiment 99 is the method of embodiment 98, wherein the first dielectric layer comprises a double-sided adhesive, and wherein attaching each of the coupling strips to the surface of the bulk medium comprises, for each coupling strip: removing a liner from the double-sided adhesive to expose an adhesive surface thereof, and attaching the adhesive surface to the surface of the bulk medium.

Embodiment 100 is the method of any of embodiments 98 or 99, wherein attaching each of the coupling strips to the surface of the bulk medium comprises, for each coupling strip, applying an adhesive top layer over the coupling strip, the top layer extending across a width of the coupling strip such that side edges of the top layer are in contact with and adhere to portions of the bulk medium on either side of the coupling strip.

Embodiment 101 is the method of any of embodiments 98-100, wherein attaching each of the coupling strips to the surface of the bulk medium comprises, for each coupling strip: applying an adhesive material to the surface of the bulk medium, and attaching the first dielectric layer of the coupling strip to the adhesive material.

Embodiment 102 is the method of any of embodiments 98-101, wherein the bulk medium comprises an aircraft skin, a wind turbine blade, a roof of a building, or railroad tracks.

Embodiment 103 is a system for heating a bulk medium comprising: two or more electrodes spaced apart from one another and coupled to the bulk medium; and a power control system coupled to the electrodes, the power control system configured to heat the bulk medium by shaping a density of current along a current path between the electrodes, thereby, producing an effective resistance along the current path in the bulk medium that is greater than the resistance of the bulk medium to a DC current, wherein the power control system shapes the density of the current within a depth of the bulk medium by tuning a skin-depth of the current, and wherein the power control system shapes the density of the current in a direction across the current path by tuning a proximity effect of the current.

Embodiment 104 is the system of embodiment 103, wherein the bulk medium is a portion of an aircraft.

Embodiment 105 is the system of any of embodiments 103 or 104, wherein the bulk medium is one or more of a portion of an aircraft wing, a portion of an aircraft empennage, or a portion of an aircraft fuselage.

Embodiment 106 is the system of any of embodiments 103-105, wherein the two or more electrodes are a first set of two or more electrodes, and wherein the system further comprises a second set of two or more electrodes coupled to a different portion of the bulk medium, wherein the power control system is coupled to the second set of two or more electrodes and configured to alternately deliver power to the first set of two or more electrodes and the second set of two or more electrodes.

Embodiment 107 is the system of any of embodiments 103-106, wherein the bulk medium comprises aluminum or carbon fiber composite and wherein the two or more electrodes comprise aluminum, silver, or copper.

Embodiment 108 is the system of any of embodiments 103-107, wherein the two or more electrodes are coupled to the bulk medium in a manner that reduces a contact resistance between the electrodes and the bulk medium.

Embodiment 109 is the system of embodiment 108, wherein a conductive material is disposed between at least one of the two or more electrodes and the bulk medium.

Embodiment 110 is the system of any of embodiments 103-109, wherein the power control system is configured to tune the skin-depth of the current by producing the current in the bulk medium at an AC frequency greater than 1 kHz.

Embodiment 111 is the system of embodiment 110, wherein the AC frequency is between 100 kHz and 450 MHz.

Embodiment 112 is the system of any of embodiments 103-111, wherein the proximity effect of the current is tuned by positioning a second current path proximate to a surface of the bulk medium and along a portion of the current path.

Embodiment 113 is the system of embodiment 112, wherein at least a portion of the second current path is positioned within 10 cm of the surface of the bulk medium.

Embodiment 114 is the system of embodiment 112, wherein the second current path is a cable that completes a closed circuit including the two or more electrodes and the power control system.

Embodiment 115 is the system of any of embodiments 103-114, wherein the power control system comprises an impedance adjusting network (IAN) configured to adjust an output impedance of the power control system.

Embodiment 116 is the system of embodiment 115, wherein the IAN is configured to adjust the output impedance of the power control system to match the impedance of the bulk medium.

Embodiment 117 is the system of any of embodiments 103-116, wherein the power control system comprises signal transforming circuitry configured to transform power from a power source to an appropriate AC frequency and voltage for use by the power control system.

Embodiment 118 is the system of any of embodiments 103-117, wherein the power control system comprises a controller configured to control operations of the power control system.

Embodiment 119 is the system of any of embodiments 103-118, wherein the power control system shapes a route of the current path between the electrodes using the proximity effect of the current to extend an overall length of the current path between the electrodes.

Embodiment 120 is the system of any of embodiments 103-119, wherein the power control system shapes a route of the current path between the electrodes by positioning a second current path proximate to a surface of the bulk medium, wherein the second current path is arranged according to a desired route for the current path between the electrodes.

Embodiment 121 is a system comprising: two or more electrodes spaced apart from one another and coupled to a bulk medium; a power control system coupled to the electrodes and configured to generate an AC current signal along a current path through the bulk medium between the electrodes at a frequency greater than 1 kHz and less than 300 GHz; and a second current path positioned proximate to a surface of the bulk medium and along the current path through the bulk medium.

Embodiment 122 is an aircraft de-icing and anti-icing system comprising: two or more electrodes spaced apart from one another and coupled to a portion of an aircraft; a power control system coupled to the electrodes and configured to heat the portion of the aircraft by shaping a density of current along a current path through the portion of the aircraft between the electrodes by: generating an AC current signal along a current path through the portion of the aircraft between the electrodes and at a frequency between 1 MHz and 50 MHz, wherein the frequency causes the density of the current to be shaped in a first direction by tuning a skin-depth of the current along the current path; and providing a second current path positioned along at least a portion of the current path through the portion of the aircraft and within a proximity of 10 cm of a surface of the portion of the aircraft, wherein the proximity of the second current path to the surface of the portion of the aircraft causes the density of the current to be shaped in a second, different, direction by tuning a proximity effect of the current along the portion of the current path.

What is claimed is:

1. A system for heating an exterior of an aircraft, the system comprising:
    two or more coupling strips spaced apart from one another and attached to an aircraft skin, each of the coupling strips comprising an input end, a termination end, and a multi-layer structure extending between the input end and the termination end and along a surface of the aircraft skin, the multi-layer structure comprising:
        a first dielectric layer over the aircraft skin,
        a conductive layer over the first dielectric layer,
        a second dielectric layer over the conductive layer, and
        a conductive shielding layer over the second dielectric layer; and
    a power control system coupled to connectors, each connector comprising a first terminal connected to the conductive layer of a respective one of the coupling strips at the input end and a second terminal connected to the aircraft skin at the input end of the respective one of the coupling strips, the power control system configured, thereby, to generate electrical current both in the coupling strips and in the aircraft skin beneath the coupling strips to heat the surface of the aircraft skin,
    wherein the power control system is configured to provide alternating current to the coupling strips and the aircraft skin.

2. The system of claim 1, wherein the alternating current comprises high frequency AC current with an AC frequency between 1 kHz and 450 MHz.

3. The system of claim 1, wherein the conductive layer is positioned within 1 inch of the aircraft skin.

4. The system of claim 1, wherein the power control system is configured to provide between 0.1 Amp and 200 Amps of AC current to each coupling strip.

5. The system of claim 1, wherein the conductive layer of at least one of the coupling strips is arranged in a serpentine pattern in which segments of the conductive layer lie alongside one another.

6. The system of claim 1, wherein the conductive layer is separated from the aircraft skin by a first distance,
    wherein the conductive shielding layer is separated from the conductive layer by a second distance, and
    wherein a ratio between the first distance and the second distance ranges between 1:1 and 1:5.

7. The system of claim 1, wherein the conductive layer is separated from the aircraft skin by a first distance,
    wherein the conductive shielding layer is separated from the conductive layer by a second distance, and
    wherein a ratio between the first distance and the second distance ranges between 5:1 and 1:5.

8. The system of claim 1, wherein the conductive layer is separated from the aircraft skin by a first distance,
    wherein the conductive shielding layer is separated from the conductive layer by a second distance, and
    wherein a ratio between the first distance and the second distance ranges between 1:1 and 5:1.

9. The system of claim 1, wherein the conductive layer of at least one of the coupling strips comprises a width across the conductive layer that varies along a length of the conductive layer,
    wherein the width across the conductive layer varies between a maximum width and a minimum width, and
    wherein the maximum width is between 1.5 times and 100 times larger than the minimum width.

10. The system of claim 1, wherein the conductive layer of at least one of the coupling strips comprises a plurality of segments with one or more circuit elements coupled between each pair of segments.

11. The system of claim 10, wherein the one or more circuit elements comprise capacitors.

12. The system of claim 1, wherein, during operation, each coupling strip forms, in combination with current flowing in aircraft skin beneath the coupling strip, an electrical transmission line, and
    wherein the aircraft skin forms a second shielding layer for the electrical transmission line formed in combination with each of the coupling strips.

13. The system of claim 1, wherein the first dielectric layer comprises an adhesive material.

14. The system of claim 1, wherein the multi-layer structure further comprises:
    a first adhesive layer between the conductive layer and the second dielectric layer; and
    a second adhesive layer between the second dielectric layer and the conductive shielding layer.

15. The system of claim 1,
    wherein the conductive layer of each coupling strip is coupled to the power control system at the input end, and
    wherein at least one of the coupling strips comprises an electrically conductive path to an electrical ground at the termination end.

16. The system of claim 15, wherein the electrical ground comprises the aircraft skin.

17. The system of claim 15, wherein the electrical ground comprises the conductive shielding layer of the at least one coupling strip.

18. The system of claim 1,
    wherein the conductive layer of each coupling strip is coupled to the power control system at the input end, and
    wherein at least one of the coupling strips comprises an open circuit between the conductive layer and electrical ground at the termination end.

19. The system of claim 18, wherein the electrical ground comprises the aircraft skin.

20. The system of claim 18, wherein the electrical ground comprises the conductive shielding layer of the at least one coupling strip.

21. The system of claim 1,
    wherein the conductive layer of each coupling strip is coupled to the power control system at the input end, and
    wherein at least one of the coupling strips comprises a circuit element coupled between the conductive layer and an electrical ground at the termination end, the circuit element comprising at least one of a capacitor, an inductor, or a resistor.

22. The system of claim 21, wherein the electrical ground comprises the aircraft skin.

23. The system of claim 21, wherein the electrical ground comprises the conductive shielding layer of the at least one coupling strip.

24. The system of claim 1,
    wherein the conductive layer of each coupling strip is coupled to the power control system at the input end,
    wherein a first coupling strip in each neighboring pair of coupling strips alternately comprises an open circuit between the conductive layer and an electrical ground at the termination end, and wherein a second coupling strip in each neighboring pair of coupling strips alternately comprises an electrically conductive path to the electrical ground at the termination end.

25. The system of claim 24, wherein the electrical ground comprises the aircraft skin.

26. The system of claim 24, wherein the electrical ground comprises the respective conductive shielding layer of the first and second coupling strip.

27. The system of claim 1, wherein the two or more coupling strips are electrically coupled together in parallel with one another.

28. The system of claim 1, wherein the two or more coupling strips are electrically coupled together in a series with one another.

29. The system of claim 1, wherein the aircraft skin includes a conductive material.

30. The system of claim 1, wherein the power control system is configured to heat the surface of the aircraft skin by shaping a density of skin current passing through the aircraft skin and underneath the two or more coupling strips, wherein the electrical current supplied by the power control system to the coupling strips is applied to the conductive layer of each of the two or more coupling strips, and wherein the electrical current in the conductive layer shapes a density of the skin current.

31. The system of claim 1, wherein the power control system is coupled to a first one of the two or more coupling strips by a connector that includes impedance adjusting components within the connector.

32. The system of claim 1, wherein at least one of the connectors comprises:
a first coaxial input connector electrically connected to the power control system;
a second coaxial input connector connected to another of the connectors;
a first wiring that provides an electrical connection between a terminal of the first coaxial input connector, a terminal of the second coaxial input connector, and the first terminal that is connected to the conductive layer of the respective one of the coupling strips;
a second wiring that provides an electrical connection between the power control system and the second terminal that is connected to the aircraft skin at the input end of the respective one of the coupling strips; and
a reactive element connected between the first wiring and the second wiring.

33. The system of claim 1, wherein at least one of the connectors comprises:
a first coaxial input connector electrically connected to the power control system;
a first wiring that provides an electrical connection between a terminal of the first coaxial input connector, and the first terminal that is connected to the conductive layer of the respective one of the coupling strips;
a second wiring that provides an electrical connection between the power control system and the second terminal that is connected to the aircraft skin at the input end of the respective one of the coupling strips; and
a reactive element connected between the first wiring and the second wiring.

34. A method of installing an aircraft skin heating system, the method comprising:
obtaining coupling strips, wherein each coupling strip comprises an input end, a termination end, and a multi-layer structure extending between the input end and the termination end, the multi-layer structure comprising:
a first dielectric layer,
a conductive layer overlapping the first dielectric layer,
a conducive shielding layer overlapping the conductive layer, and
a second dielectric layer between the conductive layer and the conducive shielding layer;
attaching each of the coupling strips to a surface of an aircraft skin and spaced apart from one another with the first dielectric layer of each coupling strip positioned between the aircraft skin and the conductive layer;
coupling a power control system to connectors; and
for each connector: connecting a first terminal of the connector to the conductive layer of a respective coupling strip at the input end and connecting a second terminal of the connector to the aircraft skin at the input end of the respective coupling strip,
wherein the power control system is configured to provide alternating current to the coupling strips and the aircraft skin.

35. The method of claim 34, wherein the first dielectric layer comprises a double-sided adhesive, and
wherein attaching each of the coupling strips to the surface of the aircraft skin comprises, for each coupling strip:
removing a liner from the double-sided adhesive to expose an adhesive surface thereof, and
attaching the adhesive surface to the surface of the aircraft skin.

36. The method of claim 34, wherein the alternating current comprises high frequency AC current with an AC frequency between 1 kHz and 450 MHz.

37. A system for heating an exterior of an aircraft, the system comprising:
two or more coupling strips spaced apart from one another and attached to an aircraft skin, each of the coupling strips comprising an input end, a termination end, and a multi-layer structure extending between the input end and the termination end and along a surface of the aircraft skin, the multi-layer structure comprising:
a first dielectric layer over the aircraft skin,
a conductive layer over the first dielectric layer,
a second dielectric layer over the conductive layer, and
a conductive shielding layer over the second dielectric layer; and
a power control system coupled to the conductive layer of each of the coupling strips at the input end and to the aircraft skin at the input end of each coupling strip, the power control system configured, thereby, to generate electrical current both in the coupling strips and in the aircraft skin beneath and along at least a majority of a length of the coupling strips to heat the surface of the aircraft skin,
wherein the power control system is configured to provide alternating current to the coupling strips and the aircraft skin.

38. The system of claim 37, wherein the conductive layer of at least one of the coupling strips is arranged in a serpentine pattern in which segments of the conductive layer lie alongside one another.

39. The system of claim 38, wherein at least one of the coupling strips comprises an open circuit between the conductive layer and electrical ground at the termination end.

40. The system of claim 39, wherein the alternating current comprises high frequency AC current with an AC frequency between 1 kHz and 450 MHz.

\* \* \* \* \*